(12) United States Patent
Li

(10) Patent No.: US 10,382,842 B2
(45) Date of Patent: Aug. 13, 2019

(54) REALTIME TELEMETRY DATA COMPRESSION SYSTEM

(71) Applicant: BTS Software Solutions, LLC, Columbia, MD (US)

(72) Inventor: Dunling Li, Rockville, MD (US)

(73) Assignee: BTS Software Software Solutions, LLC, Columbia, MD (US)

( * ) Notice: Subject to any disclaimer, the term of this patent is extended or adjusted under 35 U.S.C. 154(b) by 0 days.

(21) Appl. No.: 16/153,305

(22) Filed: Oct. 5, 2018

(65) Prior Publication Data

US 2019/0191230 A1    Jun. 20, 2019

Related U.S. Application Data

(63) Continuation-in-part of application No. 15/921,128, filed on Mar. 26, 2018, which is a continuation of
(Continued)

(51) Int. Cl.
| | |
|---|---|
| *G06T 9/00* | (2006.01) |
| *H04Q 9/00* | (2006.01) |
| *H04N 19/88* | (2014.01) |
| *H04N 19/20* | (2014.01) |
| *H04N 19/174* | (2014.01) |
| *H04N 19/12* | (2014.01) |
| *H04N 19/50* | (2014.01) |
| *H04N 19/119* | (2014.01) |

(Continued)

(52) U.S. Cl.
CPC ............ *H04Q 9/00* (2013.01); *G06T 9/00* (2013.01); *G06T 9/001* (2013.01); *H04N 19/119* (2014.11); *H04N 19/12* (2014.11); *H04N 19/174* (2014.11); *H04N 19/20* (2014.11); *H04N 19/50* (2014.11); *H04N 19/88* (2014.11); *H03M 7/30* (2013.01); *H04N 19/46* (2014.11)

(58) Field of Classification Search
CPC combination set(s) only.
See application file for complete search history.

(56) References Cited

U.S. PATENT DOCUMENTS 6,462,791 B1 * 10/2002 Zhu .................. H04N 19/61
348/699
6,606,355 B1 * 8/2003 Wei .................. H04B 14/04
370/523

(Continued)

*Primary Examiner* — Sean T Motsinger
(74) *Attorney, Agent, or Firm* — Sheets Law LLC; Kendal M. Sheets

(57) ABSTRACT

A method and system for transmitting data is disclosed. The method may include receiving data from two or more data sources. The method may also include selectively classifying the data into at least two input data streams, the at least two data streams including a one dimensional data stream, called an encoded data stream, and an imagery data stream, which can include still images or video or both. The method may also include separately compressing the one-dimensional data stream into a first compressed bit-stream and the imagery data stream into a second compressed bit-stream and combining the first compressed bit-stream and the second compressed bit-stream into a packetized bit-stream. The method may also include encrypting the packetized bit-stream to generate encrypted data packets prepared for transmission.

20 Claims, 41 Drawing Sheets

Related U.S. Application Data application No. 13/927,028, filed on Jun. 25, 2013, now Pat. No. 9,953,436.

(60) Provisional application No. 61/665,053, filed on Jun. 27, 2012, provisional application No. 61/664,530, filed on Jun. 26, 2012.

(51) Int. Cl.
*H03M 7/30* (2006.01)
*H04N 19/46* (2014.01)

(56) References Cited

U.S. PATENT DOCUMENTS

| | | | | |
|---|---|---|---|---|
| 7,630,902 | B2* | 12/2009 | You | G10L 19/025 375/240 |
| 9,542,839 | B2* | 1/2017 | Li | G08C 19/00 |
| 2001/0019630 | A1* | 9/2001 | Johnson | H04N 19/30 382/232 |
| 2002/0049979 | A1* | 4/2002 | White | G11B 27/034 725/87 |
| 2002/0105506 | A1* | 8/2002 | Hiyama | G06F 3/14 345/204 |
| 2002/0178258 | A1* | 11/2002 | Hushing, III | H04Q 9/02 709/224 |
| 2003/0058954 | A1* | 3/2003 | He | H03M 13/03 375/262 |
| 2003/0197785 | A1* | 10/2003 | White | G11B 27/034 348/207.99 |
| 2004/0054878 | A1* | 3/2004 | Debes | G06F 9/30014 712/221 |
| 2005/0222775 | A1* | 10/2005 | Kisra | G01V 3/34 702/14 |
| 2005/0276498 | A1* | 12/2005 | Chen | H04N 19/147 382/245 |
| 2007/0031112 | A1* | 2/2007 | Ricci | G11B 27/036 386/243 |
| 2007/0285438 | A1* | 12/2007 | Kanowitz | G06K 9/0063 345/632 |
| 2008/0152235 | A1* | 6/2008 | Bashyam | H04N 19/91 382/224 |
| 2008/0262851 | A1* | 10/2008 | Pang | G10L 19/0017 704/500 |
| 2009/0240506 | A1* | 9/2009 | Wuebbolt | G10L 19/167 704/500 |
| 2009/0265532 | A1* | 10/2009 | Caprioli | G06F 9/30047 712/237 |
| 2011/0149072 | A1* | 6/2011 | McCormack | G08B 13/1963 348/143 |
| 2012/0128162 | A1* | 5/2012 | Chen | G10L 19/0017 381/22 |
| 2013/0343668 | A1* | 12/2013 | Li | G06T 9/00 382/244 |
| 2015/0015426 | A1* | 1/2015 | Lindahl | H04L 25/4902 341/53 |

* cited by examiner

CHART 3

CHART 4

CHART 5

REALTIME TELEMETRY DATA COMPRESSION SYSTEM

PRIORITY

This application is a continuation-in-part of U.S. patent application Ser. No. 15/921,128, filed on Mar. 26, 2018, which is based on and claims priority to U.S. Provisional Application No. 61/664,530, filed on Jun. 26, 2012 and U.S. Provisional Application No. 61/665,053, filed on Jun. 27, 2012.

GOVERNMENT RIGHTS

This invention was made with government support under the terms of Contract No. HQ0147-13-C-7308 and Contract No. HQ0147-13-C-7024 awarded by the Missile Defense Agency (MDA). The government may have certain rights to this invention.

TECHNICAL FIELD

The present disclosure relates generally to methods and systems for data compression and data encoding and more particularly, to methods and systems for data compression and data encoding of telemetry data streams.

BACKGROUND

Telemetry is the measurement and transmission of data that is often collected at remote or inaccessible locations and transmitted to local sites, often for the purpose of real-time monitoring. Telemetry is used in various fields including, for example, space exploration, oil drilling, flight testing, missile testing, and meteorology. In many situations, the presence of a human observer at the point of data collection is not feasible, but real-time access to the data for analysis and decision-making may be necessary.

The extent to which data can be provided at a sufficient rate for real-time applications depends in part on how much data can be transmitted in a given bandwidth of the telemetry system. Data compression is one way in which the amount of data transmitted in a particular time interval can be decreased. The principle of data compression is to reduce redundancy in a data set by efficient representation of intrinsic correlation in the data. Compression technologies can be divided into two categories: lossless and lossy. Lossless compression allows the exact original data to be reconstructed from the compressed data, while lossy compression cannot reconstruct data identical to the original, although a substantial amount of data can remain to satisfy the need of a given application.

When compressing data, the higher the compression ratio, the higher the potential rate of data transfer. However, data compression usually involves a trade-off between high compression ratio and resources (e.g., time, computing power, and power consumption). In real-time applications, in which the time between generation of data and the processing and receipt of the data should be as small as possible, computation complexity and delay costs often cannot be tolerated. Further limitations are imposed when lossless compression is desired. Lossless compression usually achieves a lower compression ratio as compared to lossy compression. Nevertheless, a low-delay, low-complexity, but high-ratio lossless compression of data is sometimes desirable for some real-time telemetry systems. Known compression algorithms, such as the Lempel-Ziv algorithm or Huffman coding, can be used to compress telemetry data, but these compression algorithms can not be used in realtime compression because entire data set needs be explored to build dictionary during the compression. Furthermore, their computational complexity and delay costs may not be tolerable in real-time applications.

The disclosed systems and methods are directed to overcoming one or more of the shortcomings set forth above and/or other shortcomings of the prior art.

SUMMARY

In one aspect, the present disclosure is directed to a method for transmitting data. The method may include receiving data from two or more data sources, selectively classifying the data into at least two input data streams, the at least two data streams including a one dimensional data stream, called an encoded data stream, and an imagery data stream, which can include still images or video or both, and separately compressing the one-dimensional data stream into a first compressed bit-stream and the imagery data stream into a second compressed bit-stream. The method may also include combining the first compressed bit-stream and the second compressed bit-stream into a packetized bit-stream, and encrypting the packetized bit-stream to generate encrypted data packets prepared for transmission. The method may also include where the one dimensional data stream is tiled into non-overlap segments using a state detection algorithm that categorizes the non-overlap segments into different states, wherein the different states include a constant state, a periodical state, a constant outlier state, a periodical outlier state, a step jump state, and an unknown state, and where corresponding encoders are used to compress each of the categorized segments.

In another aspect, the method may include using a prediction model to generate predicted one-dimensional data, determining a difference between the predicted one-dimensional data and the one-dimensional data, and encoding the difference with a compression encoder. In yet another aspect, the method may include the state detection algorithm categorizes one of the non-overlap segments as being in constant state when all data samples in the non-overlap segment have the same value. Another aspect may include the state detection algorithm categorizes one of the non-overlap segments as being in the constant outlier state when the number of outliers are less than a threshold in the non-overlap segment and the outliers are identified when their values are beyond multiple times of standard deviation in the non-overlap segment. In still another aspect, the state detection algorithm categorizes one of the non-overlap segments as being in the periodical state when the maximum cross-correlation coefficients between predefined minimum and maximum periods are beyond a periodicity threshold.

Other aspects of the method can include the state detection algorithm categorizes one of the non-overlap segments as being in the periodical outlier state by detecting number of outliers are less than a outlier threshold in the non-overlap segment, where outliers are identified when their values are beyond multiple times of standard deviation in the non-overlap segment, and after replacing the outliers using prediction values from their neighbor samples, detecting periodicity using the cross-correlation coefficients between the predefined minimum and maximum periods. Aspects of the method may also include the state detection algorithm categorizes one of the non-overlap segments as changing from a first constant state to a second constant states within the non-overlap segment.

In further aspects of the disclosure, a data transmission system can include a local unit comprising a receiver and a remote unit, the remote unit including transducers, a processor, and a transmitter, where the transducers are configured to generate at least two data streams. Another aspect of the system may include the processor configured to compress the data by selectively classifying the data streams from the transducers into classifications including at least a one-dimensional data stream and an imagery data stream, and separately compressing the one dimensional data stream into a first compressed bit-stream and the imagery data stream into a second compressed bit-stream. In other aspects of the system, the transmitter is configured to transmit the first compressed bit-stream and the second compressed bit-stream to the local unit. In yet another aspect of the system, the processor is further configured to tile the one dimensional data stream into non-overlap segments using a state detection algorithm that categorizes the non-overlap segments into different states, where the one dimensional data stream is tiled into non-overlap segments using a state detection algorithm that categorizes the non-overlap segments into different states, wherein the different states include a constant level state, a periodical state, a constant outlier state, a periodical outlier state, a step jump state, and an unknown state, and compress each of the categorized segments using corresponding encoders.

Further aspects of the system can include compressing the one-dimensional data stream can include using a prediction model to generate predicted one-dimensional data, determining a difference between the predicted one-dimensional data and the one-dimensional data, and encoding the difference with a compression encoder. In another aspect of the system, the state detection algorithm categorizes one of the non-overlap segments as being in constant state when all data samples in the non-overlap segment have the same value. Another aspect of the system can include the state detection algorithm categorizes one of the non-overlap segments as being in the constant outlier state when the number of outliers are less than a threshold in the non-overlap segment and the outliers are identified when their values are beyond multiple times of standard deviation in the non-overlap segment. In still other aspects of the system, the state detection algorithm categorizes one of the non-overlap segments as being in the periodical state when the maximum cross-correlation coefficients between predefined minimum and maximum periods are beyond a periodicity threshold. An aspect of the system can include the state detection algorithm categorizes one of the non-overlap segments as being in the periodical outlier state by detecting number of outliers are less than a outlier threshold in the non-overlap segment, where outliers are identified when their values are beyond multiple times of standard deviation in the non-overlap segment, and after replacing the outliers using prediction values from their neighbor samples, detecting periodicity using the cross-correlation coefficients between the predefined minimum and maximum periods. A further aspect of the system can include the state detection algorithm categorizes one of the non-overlap segments as a step jump state when the data samples change from a first constant state to a second constant state within the non-overlap segment.

BRIEF DESCRIPTION OF THE DRAWINGS

The disclosed subject matter of the present application will now be described in more detail with reference to exemplary embodiments of the apparatus and method, given by way of example, and with reference to the accompanying drawings, in which.

DETAILED DESCRIPTION OF EXEMPLARY EMBODIMENTS

A few inventive aspects of the disclosed embodiments are explained in detail below with reference to the various figures. Exemplary embodiments are described to illustrate the disclosed subject matter, not to limit its scope, which is defined by the claims. Those of ordinary skill in the art will recognize a number of equivalent variations of the various features provided in the description that follows.

Figure 1:
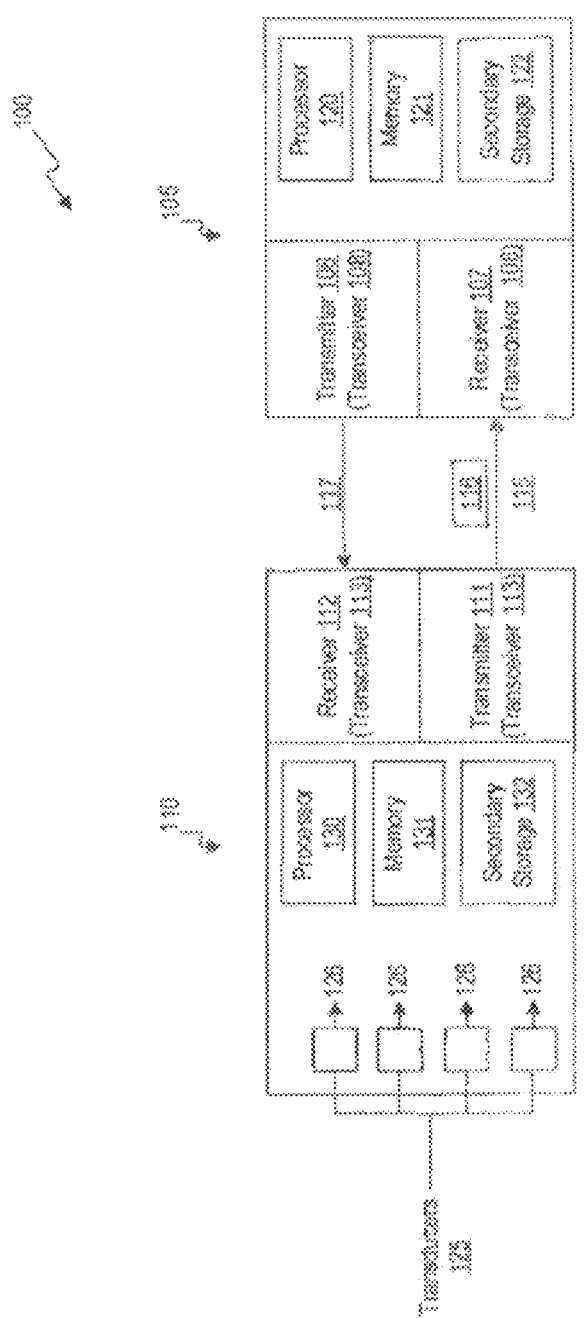
FIG. 1 is a block diagram of an exemplary disclosed telemetry system.

FIG. 1 illustrates an exemplary telemetry system 100 according to the disclosure. Telemetry system 100 may include a local unit 105 and a remote unit 110, which are in communication with each other. Telemetry system 100 may be used in various industries and applications in which measurements are collected at remote unit 110 and transmitted by remote unit 110 to local unit 105 for processing, storage, and/or utilization. Applications may include, but are not limited to, flight testing, oil-pipeline monitoring, ocean monitoring, and the provision of health care. In these examples, remote unit 110 may be associated with objects and/or environments of interests (e.g., a plane in the sky, a pipeline buried underground, a region of the ocean floor, and a patient in his or her private home) while local unit 105 may be associated with a location and/or user that is not immediately near remote unit 110. In an exemplary embodiment, remote unit 110 may be an airborne system and local unit 105 may be a ground system.

Local unit 105 may include a transmitter 106, a receiver 107, and/or a transceiver 108 for communicating with remote unit 110. Transmitter 106, receiver 107, and/or transceiver 108 may be configured for transmitting and/or receiving wireless and/or wired signals. Local unit 105 may receive a signal 115 via receiver 107 and/or transceiver 108 from remote unit 110. Signal 115 may include data 116 such as measurements of various parameters that are related to remote unit 110 or the surroundings of remote unit 110. Data 116 may include other information, such as data structure information, which may be needed for proper processing of data 116 by local unit 105, as explained in further detail below. Local unit 105 may include a processor 120, a memory 121, and/or a secondary storage 122, and any other components for handling data 116. Processor 120 may include one or more known processing devices such as a central processing unit (CPU), digital signal processing (DSP) processor, etc. Processor 120 may execute various computer programs to perform various methods of processing signal 115 and/or data 116. Memory 121 may include one or more storage devices configured to store information related to the execution of computer programs by processor 120. Secondary storage 122 may store computer programs and/or other information, including data 116 or information derived from data 116. Storage 122 may include volatile, non-volatile, magnetic, semiconductor, tape, optical, removable, non-removable, non-transitory, transitory, and/or other types of storage device or computer-readable medium.

Local unit 105 may also transmit a signal 117 via transmitter 106 and/or transceiver 108 to remote unit 110. In an exemplary embodiment, local unit 105 may be configured to automatically transmit signal 117 to remote unit 110 based on data 116. For example, local unit 105 may transmit feedback commands via signal 117 to remote unit 110 based on received data 116. In another exemplary embodiment, local unit 105 may be configured to receive commands manually-inputted by a user that are then transmitted to remote unit 110 via signal 117. In yet another exemplary embodiment, signal 117 may include software updates and/or any other data that may be useful for remote unit 110.

Remote unit 110 may include a transmitter 111, a receiver 112, and/or a transceiver 113 for communicating with local unit 105. Transmitter 111, receiver 112, and/or transceiver 113 may be configured for transmitting and/or receiving wireless and/or wired signals. Remote unit 110 may include one or more transducers 125, which generate measurement data 126. Transducers 125 may be any device which converts signals in one form of energy to another form of energy. For example, transducers 125 may include various sensors, for example, a temperature sensor (such as a thermocouple that converts a heat signal into an electrical signal), a motion sensor (such as an accelerometer that converts acceleration into an electrical signal or an inertial measurement unit (IMU) that measures velocity, orientation, acceleration, and/or gravitational forces using a combination of accelerometers and gyroscopes), and/or an electromagnetic wave receiver (such as an antenna which converts propagating electromagnetic waves into an electrical signal, e.g. GPS antenna). Other examples of transducers 125 include a pH probe, a hydrogen sensor, a piezoelectric crystal, a pressure sensor, a hydrophone, a sonar transponder, and/or a photodiode. Such list is not meant to be exhaustive. The above examples include converting a non-electrical signal to an electrical signal, but this disclosure is not limited to such examples. For example, transducer 125 may be a galvanometer, which converts electrical signals into a mechanical motion such as rotary deflection, and/or a speaker which converts electrical signals into air pressure.

The resulting signals generated and output by transducers 125 are referred to as measurement data 126 for purposes of this disclosure. Measurement data 126 may be related to the health and status of various components of remote unit 110, e.g., motors, electronics, payloads, and/or any other component of remote unit 110. Measurement data 126 may also be related to the operational status and/or kinematic state of remote unit 110 as a whole. Measurement data may be further related to the location and/or environment of remote unit 110.

Remote unit 110 may process the data 126 generated by transducers 125 and transmit them, via transmitter 111 and/or transceiver 113, as part of data 116 in signal 115 to local unit 105. Remote unit 110 may include a processor 130, a memory 131, and/or a secondary storage 132, as described above for local unit 105, for processing and/or storing the data from the signals generated by transducers 125 and other data. Remote unit 110 may receive signal 117, via receiver 112 and/or transceiver 113, from local unit 105. Signal 117 may include various data as discussed above in the description of local unit 105.

Various components may be implemented by processors, e.g., processor 120 and/or processor 130, wherein the illustrated components are implemented as software code that is executed by processor 120 and/or processor 130 to perform functions described below. Thus, while additional features and functions of local unit 105 and remote unit 110 are described above, these functions may be performed by processor 120 and/or processor 130.

Figure 2:
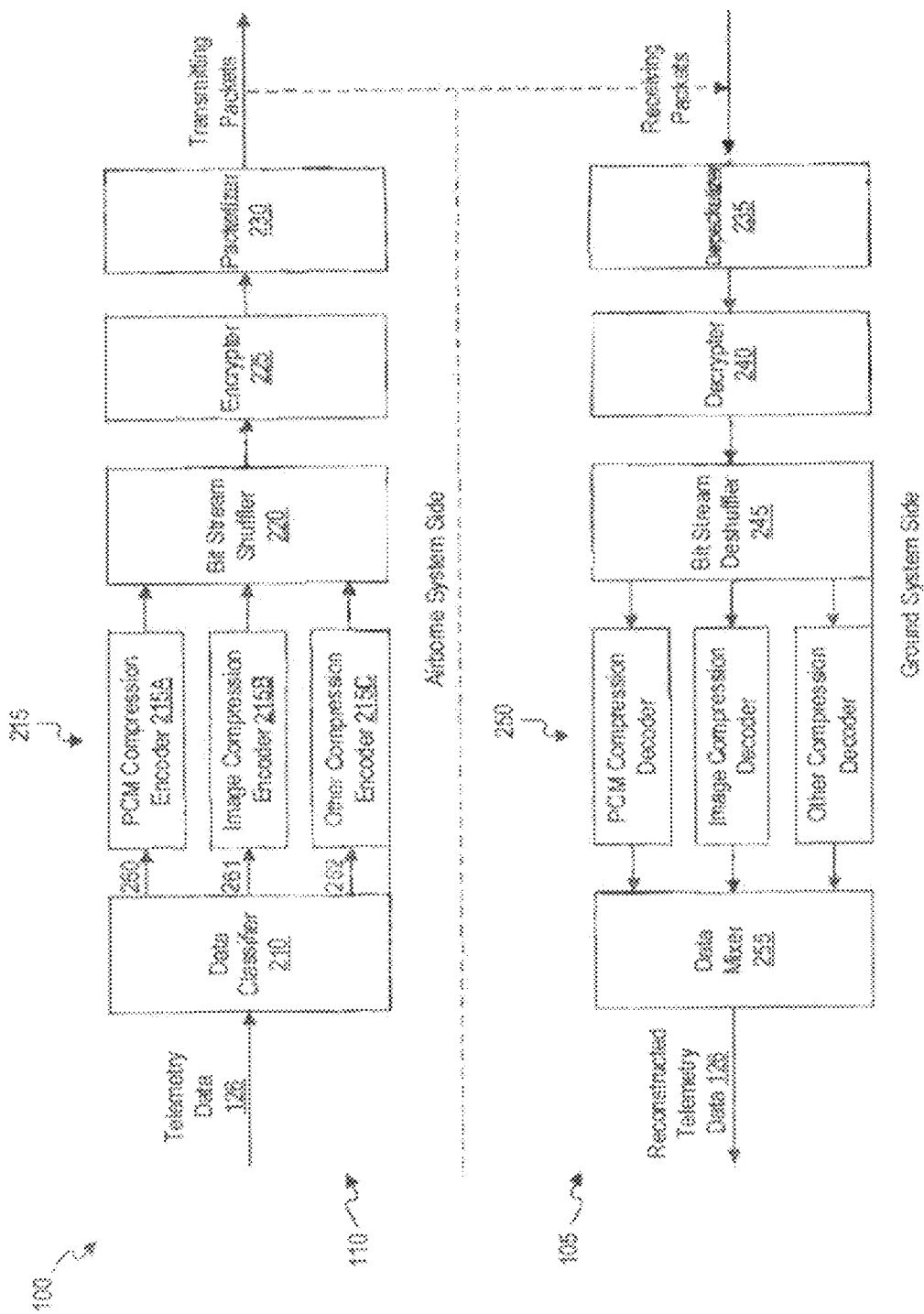
FIG. 2 is a block diagram of some aspects of this exemplary disclosed telemetry system of FIG. 1.

With reference to FIG. 2, remote unit 110 may also include a data classifier 210, a compression encoder 215, a bit stream shuffler 220, an encrypter 225, and a packetizer 230, which process and prepare data 126 for transmission to local unit 105. This processing may include compressing data 126. By classifying data 126 via data classifier 210, as discussed in further detail below, data 126 may be able to be compressed by compression encoders 215 with relatively high compression ratios and relatively low delay and computational costs. The compression-encoded data may be output as bit-streams, and bit-stream shuffler 220 may shuffle these bit-streams to remove possibly predictable patterns added by compression encoders 215. Encrypter 225 may encrypt the shuffled bit-stream, and packetizer 230 may perform packet protocol packetization for distributing the encrypted bit-stream as packets according to predefined protocols, such as TCP or UDP/IP. The packets may subsequently be transmitted to local unit 105 as data 116 (see FIG. 1). Local unit 105 may process the received packets with a similar process but in reverse order to produce reconstructed data 126 that may be identical to the data generated at remote unit 110. Local unit 105 may include a depacketizer 235, a decrypter 240, a bit-stream deshuffler 245, a compression decoder 250, and a data mixer 255, all of which process and reconstruct data 126. In an exemplary embodiment, disclosed systems and methods may be able to reach a 5:1 compression ratio for various data 126.

Data classifier 210 of remote unit 110 may receive, as input, data 126, which may include measurement data generated by transducers 125 and other data such as data structure information, and classify data 126 into different categories. In an exemplary embodiment, data classifier 210 may classify measurement data 126 into three categories: (1) pulse-code modulation (PCM) encoded measurement data 260, (2) image data 261, and (3) other data 262. In another exemplary embodiment, data classifier 210 may classify measurement data 126 more specifically into: (1) PCM-encoded measurement data, (2) image data, and (3) data structure information.

Remote unit 110 may convert measurement data 126 from transducers 125 into PCM-encoded measurement data 260. PCM is a well-known encoding scheme and, as such, is not further explained in detail. Linear PCM, in which signal levels are quantized and indexed based on constant quantization intervals, will be referred to as LPCM. Logarithmic PCM, in which signal levels are segmented into unequal quantization segments, and each quantization segment in divided and indexed based on equal quantization intervals within the segment, will be referred to as logarithmic PCM. The term PCM will generally refer to either or both LPCM and logarithmic PCM. Such PCM-encoded data 260 may be a component of data 126. Data 126 may also include image data 261. Image data 261 may be data streams from, for example, at least one IR- and/or visible-light video cameras, which may correspond to one of transducers 125. Image data 261 may have frame rates of around 10 to 50 Hz while PCM-encoded data 260 may have sampling rates of around 100 Hz. Image data 261 may comprise still images (e.g., photographs) and/or video, which are variable in two dimensions, as compared to data encoded as PCM-encoded data 260, which usually varies in one dimension, e.g., amplitude. In an exemplary embodiment, PCM-encoded measurement data 260 may make up 40% and image data 261 may make up 50% of data 126. The remaining portion of data 126 may be other data 262.

After data classifier 210 classifies data 126 into different categories, each category of data may be compressed by a different compression encoder 215. PCM compression encoder 215A may be configured for compressing PCM-encoded measurement data 260 with low-delay low-complexity lossless compression. Because PCM sequences may be derived from generally continuous analog signals, PCM-encoded measurement data 260 may exhibit a continuity in its data sequences. Stated differently, sequential data values may be correlated, which allows for an exemplary PCM encoder 215A to use prediction models for the purpose of reducing redundancy in the data and facilitating higher compression ratio. Redundancy may be based on the number of bits used to code a message minus the number of bits of actual information in the message. For an exemplary PCM-encoded measurement data 260 generated with a sampling rate of 100 Hz, a 10 millisecond delay allows the prediction model to look at one sample ahead in time. PCM compression encoder 215A may determine a prediction model of the data by analyzing the correlation among input PCM-encoded measurement data 260 that has been obtained. An exemplary model may be a linear prediction model such as:

$$y_i = \sum_{k=1}^{n} a_k x_{i-k} a + b_1 x_{i+1} \qquad (1)$$

where $x_i$ is the $i^{th}$ sample in the PCM-encoded measurement data 260 if LPCM, or is the quantization index of the $i^{th}$ sample in the PCM-encoded measurement data 260 if logarithmic PCM. $y_i$ is the corresponding predicted value of the sample. n is the order of the prediction model. $a_x$ and $b_1$ are prediction coefficients, which PCM compression encoder 215A may determine by the analysis of data sequences of input PCM data that has been obtained. The prediction coefficients may be calculated offline using optimization algorithms, trained using a set of known data, and/or real-time adapted. The coefficients may therefore be adjusted based on different specific data sequences.

The predicted value $y_i$ generated by the prediction model and the actual value xi of the sample may be almost the same, and therefore a difference signal z between $x_i$ and $y_i$ may be made up of mostly zeroes. As a result, PCM compression encoder 215A may be able to compress the difference signal z with a high compression ratio. In an exemplary embodiment, PCM compression encoder 215A may compress the difference signal z using an entropy encoding scheme such as Huffman coding or arithmetic coding. PCM compression encoder 215A may use other known encoding schemes including, for example, run-length encoding.

Figure 3:
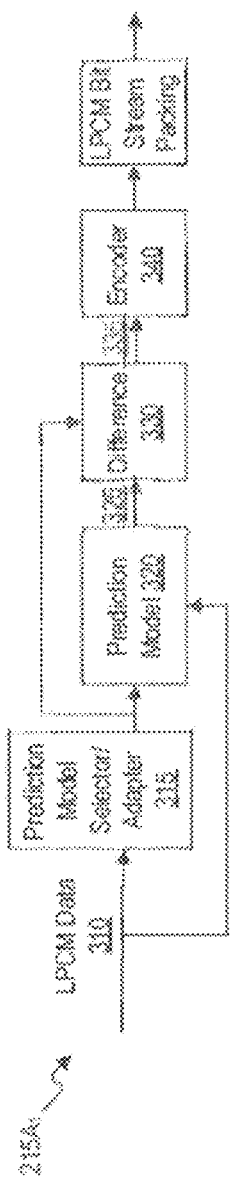
FIG. 3 is a block diagram of an exemplary low-delay low-complexity lossless PCM compression encoder of FIG. 2 for linear PCM data.

FIG. 3 illustrates a detailed block diagram of low-delay low-complexity lossless PCM compression encoder 215A1 as an exemplary embodiment of PCM compression encoder 215A of FIG. 2, in which the input PCM-encoded measurement data 260 is LPCM data 310. LPCM data 310 may be input into a prediction model selector/adapter 315 which determines the prediction model 320 to be utilized based on LPCM data 310, as described above. The prediction model 320 that is determined by prediction model selector/adapter 315 may receive LPCM data 310 and generate a prediction 325 of the LPCM data according to, for example, Equation 1. Difference unit 330 may receive LPCM data 310 and prediction 325 of the LPCM data and calculate a difference signal 335 between the two. Encoder 340 may then compression encode difference signal 335 before it is packetized for transmission.

Figure 4:
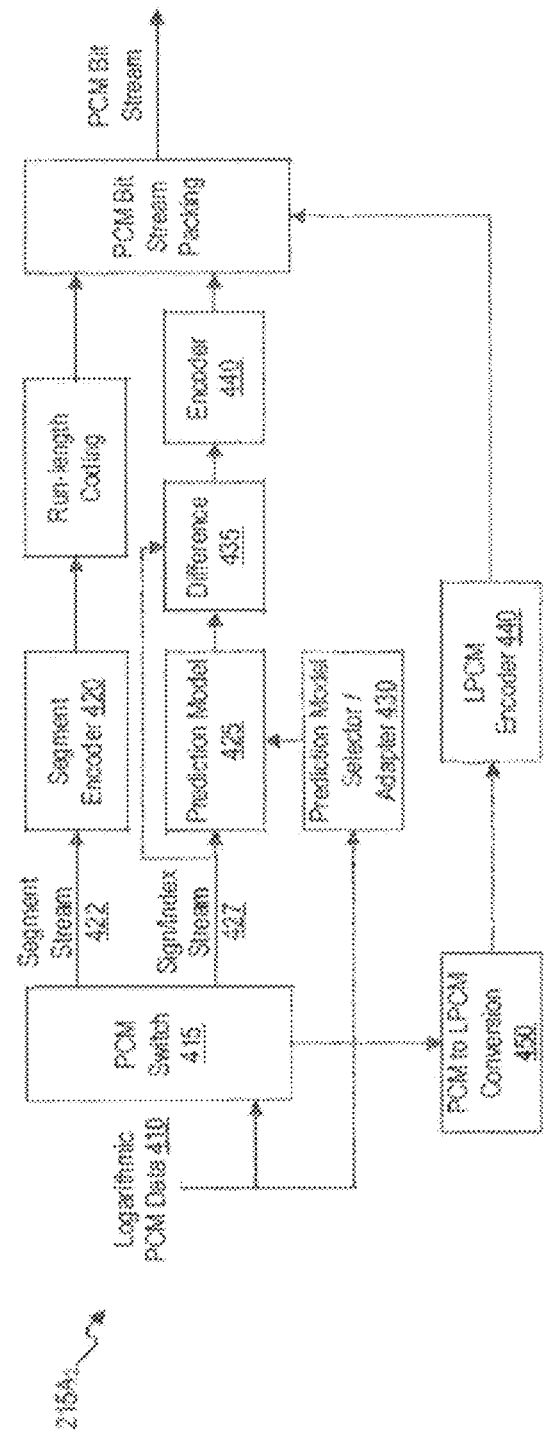
FIG. 4 is a block diagram of an exemplary low-delay low-complexity lossless PCM compression encoder of FIG. 2 for logarithmic PCM data.

FIG. 4 illustrates a detailed block diagram of a low-delay low-complexity lossless PCM compression encoder 215A2 as an exemplary embodiment of PCM compression encoder 215A of FIG. 2, in which the input PCM-encoded measurement data 260 is logarithmic PCM data 410. As described above, logarithmic PCM data 410 may include values corresponding to quantization segments and quantization indexes associated with the various segments. Often for logarithmic PCM data 410, the variation of segment values may be slow, therefore PCM compression encoder 215A2 may be able to encode the data more efficiently by separately encoding the quantization segments and quantization indexes. PCM compression encoder 215A2 may include a PCM switch 415, which may determine whether to encode logarithmic PCM data 410 with separate encodings for the quantization segments and quantization indexes, or convert PCM data 410 to LPCM data 310. This determination may be made based on the level of variation of the quantization segments of logarithmic PCM data 410. If the variation of quantization segments is slow, PCM switch 415 may determine that the data should remain as logarithmic PCM data 410. Segment encoder 420 may receive a segment data stream 422 comprising the bits of logarithmic PCM data 410 that correspond to the quantization segments, and prediction model 425 may receive an index data stream 427 comprising the bits that correspond to sign and quantization indexes. Segment encoder 420 may encode segment data stream 422 with, for example, run-length encoding. Index data stream 427 may be encoded using predictive encoding using prediction models, similarly as described above with respect to FIG. 3. That is, prediction model 427, which may be selected by prediction model selector/adapter 430 based on characteristics of logarithmic PCM data 410, may receive index data stream 427 and generate a prediction 432 of the index data stream. Difference unit 435 may determine a difference between prediction 437 and index data stream 427, which may then be encoded by encoder 440. If the variation of the quantization segments is fast, PCM switch 415 may determine that the data should be converted to LPCM data 310, by PCM-to-LPCM converter 450. After conversion, LPCM data 310 may be encoded, as discussed above with respect to FIG. 3. The encoded PCM-encoded data may then be packed into a bit stream for transmission.

Figure 5:
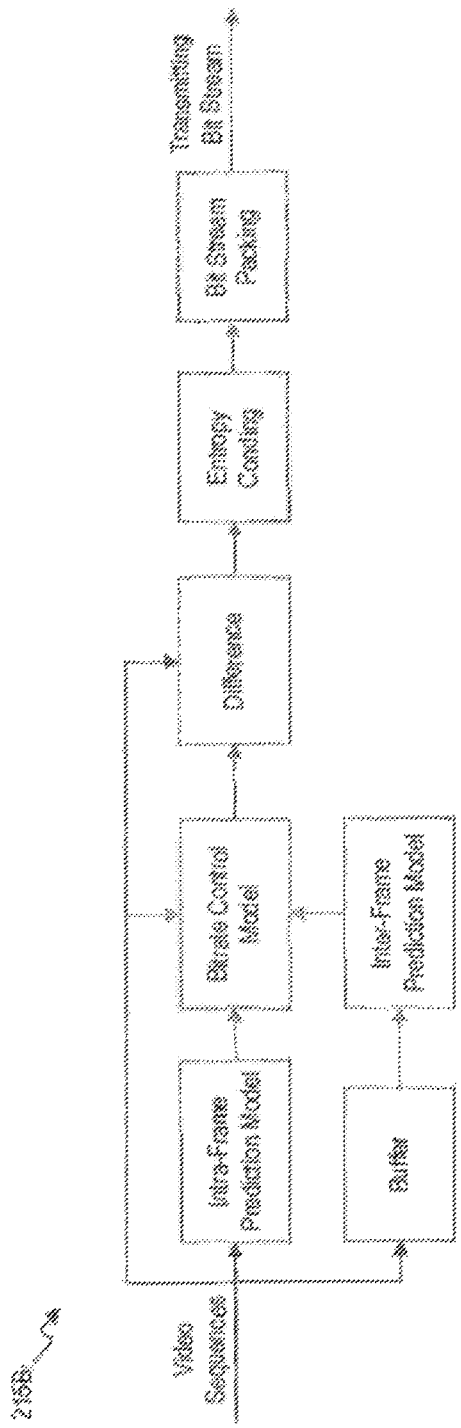
FIG. 5 illustrates a block diagram of an exemplary image compression scheme of FIG. 2.

With reference back to FIG. 2, remote unit 110 may include image compression encoder 215B for encoding image data 261. In an exemplary embodiment, image data 261 may be video data. As such, image compression encoder 215B may compress image data 261 based on correlation inside a video frame and among adjacent frames. FIG. 5 illustrates a block diagram for a video compression scheme 215B1 as an exemplary embodiment of image compression encoder 215B of FIG. 2. Generally, a prediction model for video may be used to remove intra-frame or inter-frame redundancy. The residual data, which is the difference between the actual data and the predicted data, may be mostly close to zero. The residual may then be encoded using an entropy encoding scheme, such as Huffman coding, run-length encoding, arithmetic coding, dictionary coding, and/or other known entropy coding. Image compression encoder 215B may utilize a variety of lossless video codecs, e.g., Moving JPEG-LS, Moving JPEG 2000, Lagarith, Huffyuv, Alparysoft, x.264 lossless, CorePNG, FV1, MSU, MPEG-2, MPEG-4, H.262, H.263, H.264 and/or others. Moving JPEG-LS may provide a better compression ratio at four times the rate of Moving JPEG 2000. The Lagarith lossless video code may balance between compression ratio and computation complexity. H.264/MPEG-4 Part 10 or AVC (Advance Video Coding) may provide the best performance in terms of compression ratio and compressed video quality. H.264/MPEG-4 AVC is currently the most widely adapted compression standard for high definition video. H.264/MPEG-4 AVC has a variety of implementation and optimizations available on different processors. Achievable compression ratios may highly depend on the content of image data 261. In an exemplary embodiment, the compression ratio that the above-listed video codecs may reach may be on average about 2:1 to 3:1. In some situations, a higher compression ratio of, for example, 5:1, may be desirable.

Figure 6:
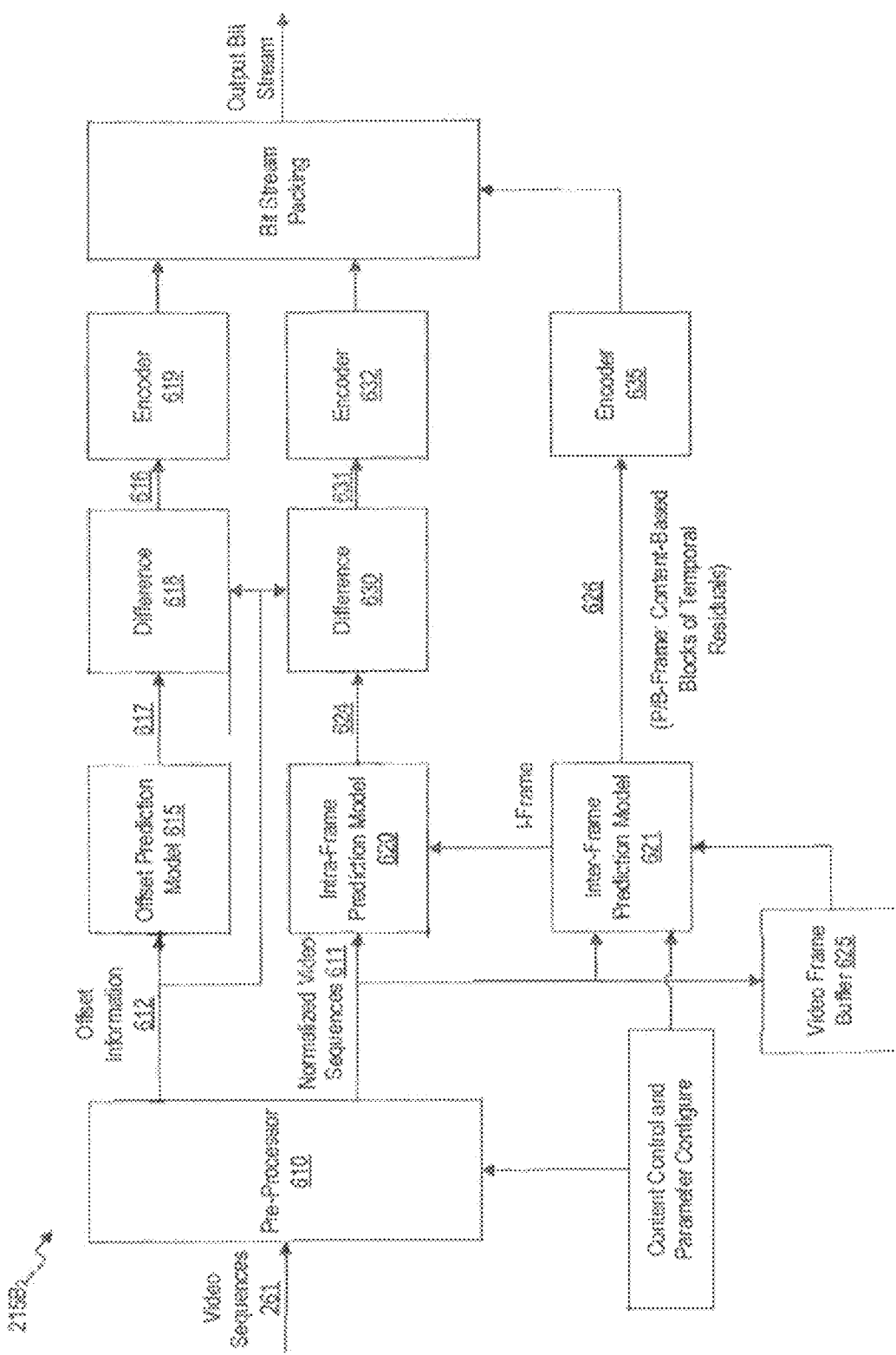
FIG. 6 illustrates a block diagram of an exemplary image compression encoder of FIG. 2 for compressing video-type image data.

To obtain higher compression ratios with low delay and low complexity, the image compression encoder may utilize knowledge of some data source characteristics, which may be determined using methods of content-adaptation and determination of specific parameter settings. FIG. 6 illustrates a block diagram for an image compression encoder 215B2 as an exemplary embodiment of image compression encoder 215B of FIG. 2 for compressing video-type image data 261, based on knowledge of the data content. Image compression encoder 215B2 may include a preprocessor 610 for normalizing image data 261 into normalized video sequences 611 and extracting offset information 612. The offset information 612 may be compressed using a time-domain linear prediction model followed by entropy encoding, similar to the process described for FIG. 3, in that an offset prediction model 615 generates a prediction 617 of offset information, a difference unit 618 determines the difference 616 between actual offset information 612 and prediction 617, and encoder 619 encodes the difference 616 using entropy encoding schemes. Offset information 612 often is constant or slow-varying for a given imagery sequence in image data 261, in which case encoder 619 may utilize, for example, run-length encoding. An intra-frame prediction model 620 and an inter-frame prediction model 621 may receive normalized video sequences 611. Intra-frame prediction model 620 may handle compression encoding related to data within one frame of normalized video sequences 611, and inter-frame prediction model 621 may handle compression encoding related to data of several frames of normalized video sequences 611. For inter-frame prediction model 621 to be able to compress image data 261 based on more than one frame, video frame buffer 625 may buffer one or more of the frames.

For example, the rate of video sequences 611 may vary from 10 Hz to 50 Hz. If maximum delay requirement is 10 milliseconds, inter-frame prediction model 621 may be able to look ahead up to two frames. Each frame of normalized video sequences 611 may be categorized into one of three different types of frames by image compression encoder 215B2 before being encoded using intra-frame prediction model 620 or inter-frame prediction model 621. The three categories of frames are: I-frames, P-frames, and B-frames. An I-frame (intra-frame) is a self-contained frame that can be independently decoded without any reference to other frames. A P-frame (predictive inter-frame) is a frame that makes references to parts of an earlier I- and/or P-frame to code the frame. A B-frame (bi-predictive inter-frame) is a frame that makes references to both an earlier reference frame and a future reference frame. In general, I-frames require more bits than P- and B-frames, but they are robust to transmission errors. P- and B-frames are sensitive to transmission errors, and B-frames introduce delays. Image compression encoder 215B2 may determine which type a particular frame is based on determination of the prediction errors, i.e. the difference between the prediction of either model and the actual data. If image compression encoder 215B2 determines that a frame is an I-frame, difference unit 630 determines a difference 631 (i.e., the residual) between the prediction 624 generated by intra-frame prediction model 620 and the actual frame data, and encoder 632 encodes the difference signal. In an exemplary embodiment, encoder 632 may encode the difference signal using entropy encoding such as arithmetic coding. Otherwise, image compression encoder 215B2 may determine that the frame is a P- or B-frame, and inter-frame prediction model 621 may generate a prediction signal 626 based on the correlation between multiple frames. This temporal correlation results in compressible P- and/or B-frame bit streams, which may be compressed by encoder 635.

Image compression encoder 215B2 may incorporate knowledge of the contents of image data 261 to achieve higher compression ratios. In some embodiments, image compression encoder 215B2 may analyze a video frame or a sequence of video frames and divide its contents into different shapes or object regions. Image compression encoder 215B2 may then compress each object independently to remove higher order correction in the frame or among the sequence of frames. The extracted objects may be represented efficiently by combining them with known characteristics of objects in the frames (spatial characteristics and/or temporal characteristics such as the motion of an object). Such content-based video coding may improve coding efficiency, robustness in error-prone environments, and content-based random access. Some content-based coding techniques suffer from very expensive computation costs due to segmentation, motion estimation, and overhead of object presentation (e.g., shape presentation or object descriptions). However, by utilizing prediction models that produce residuals that are then entropy coded, accurate object/shape segmentation and motion estimation may be less crucial. Accordingly, in an exemplary embodiment, image compression encoder 215B2 may avoid object presentations by using content blocks with flexible block sizes and computer complexity for coarse segmentation and motion estimation.

Figure 7:
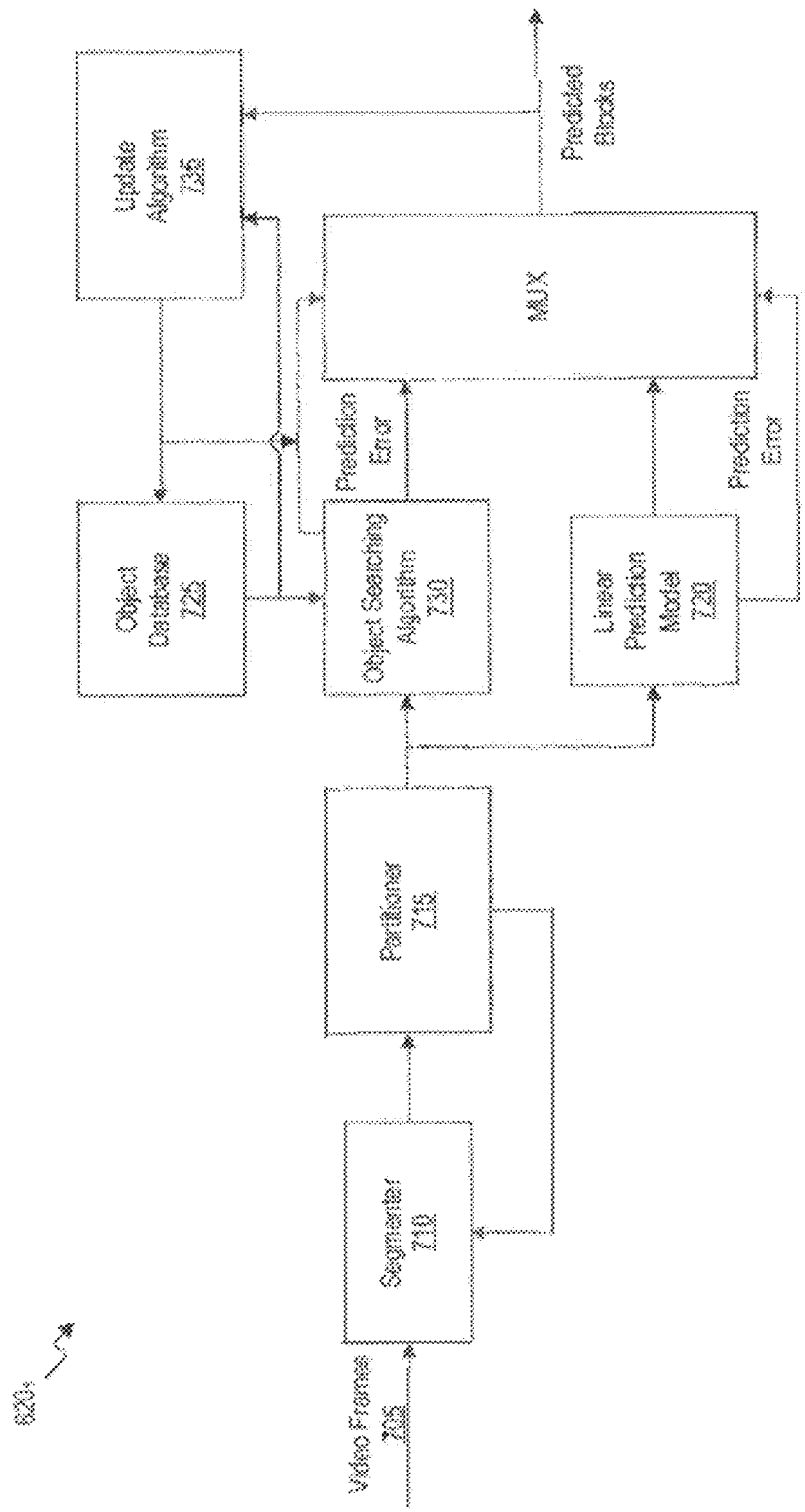
FIG. 7 illustrates a block diagram of an exemplary intra-frame prediction model of FIG. 6.

FIG. 7 illustrates a block diagram of an intra-frame prediction model 620 1 as an exemplary embodiment of intra-frame prediction model 620 of FIG. 6 for generating predicted blocks of video frame 705. Segmenter 710 may receive and apply segmentation to frame 705. The segmentation may divide frame 705 into non-overlapped regions, wherein each region is considered to be an object. Partitioner 715 may then partition the entire frame 705 into overlapped object blocks with flexible sizes and locations. Each object block will be associated with either a prediction, by a linear prediction model 720, or a defined object as stored in an object database 725. Object database may include two categories of objects: pre-defined static objects and real-time adapted objects. An object-searching algorithm 730 may first search the real-time objects and then the predefined objects. An update algorithm 735 may update the real-time objects. The output of the intra-frame prediction model 620 1 may comprise predicted block which best matches objects from the database or the predicted block output by linear prediction model 720, based on whichever minimizes total prediction errors. As is known in the art, a segment may be an object with specific delineations and bounds, and a partition may be a portion of the image data that includes multiple objects that is used to calculate compression across two segments.

Figure 8:
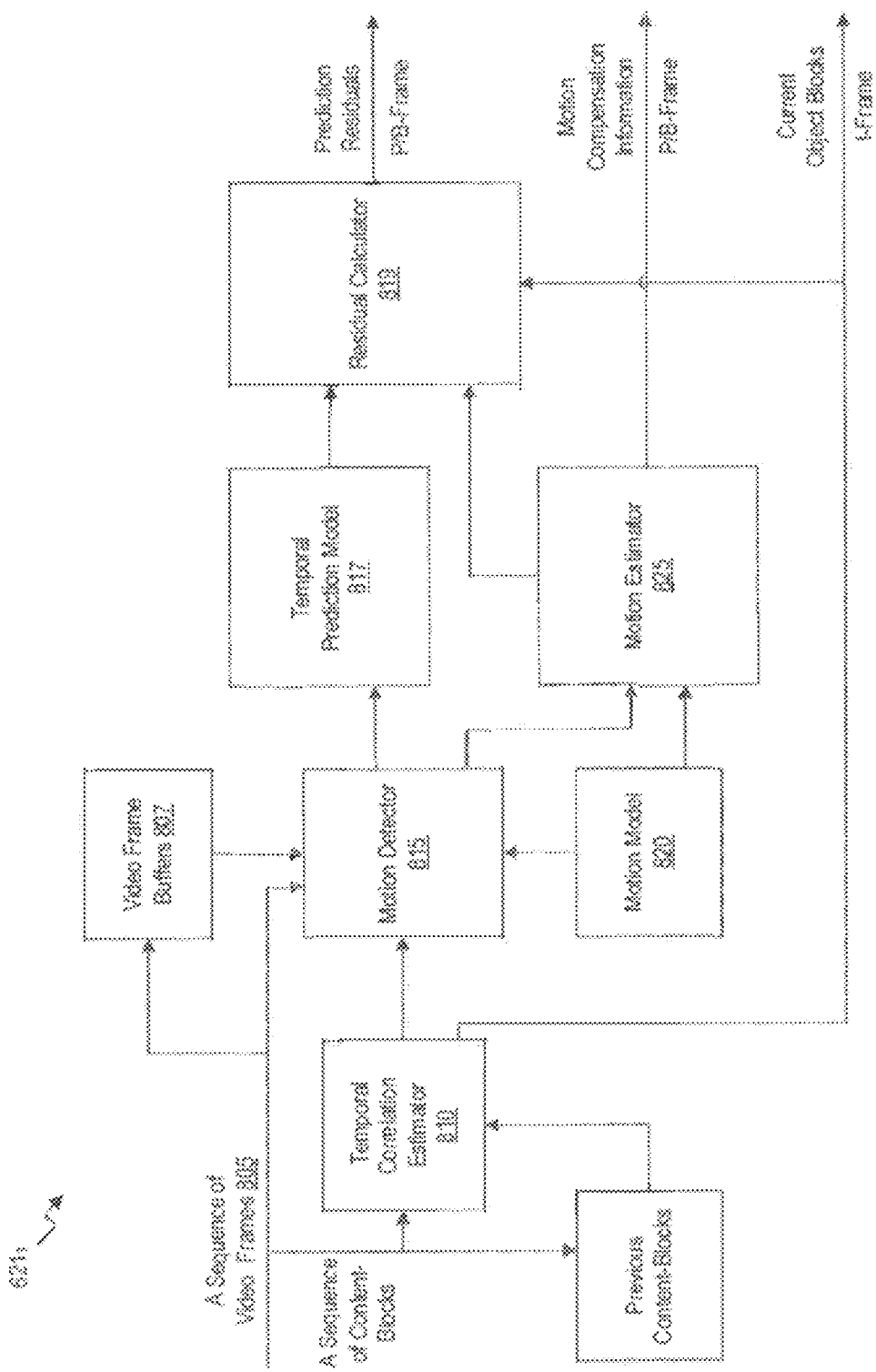
FIG. 8 illustrates a block diagram of an exemplary inter-frame prediction model of FIG. 6.

FIG. 8 illustrates a block diagram for an inter-frame prediction model 621 1 as an exemplary embodiment of inter-frame prediction model 621 of FIG. 6. Temporal correlation estimator 810 may receive partitioned object blocks of one frame, in a sequence of video frames 805, and compare them with object blocks of previous frames. For example, comparisons may be made based on numbers, shapes, and/or intensities of the object blocks. Temporal correlation estimator 810 may decide the frame type based on the similarity of the object blocks between frames. If the level of similarity is low, the current frame may be encoded as I-frame using intra-frame prediction model 620. Otherwise, if the level of similarity is high enough, the frame may be encoded using the other components of inter-frame prediction model 621 1. Motion detector 815 may receive the sequence of video frames 805 from video frame buffer 807 that includes the frame that is to be encoded. Motion detector 815 may identify motion objects from background objects. For background object blocks, a temporal prediction model 817 or interpolation may be applied, and a residual calculator 819 may calculate the prediction residual. The prediction residual may then be encoded with entropy encoding. For moving objects, motion compensation may be generated by a motion model 820 and motion estimator 825. That is, motion model 820 and motion estimator 825 may generate a prediction 827. If the prediction residual is large, then the current frame may be redefined as I-frame. Otherwise, motion compensation vectors which predict the motion of object and prediction residuals will be encoded. Motion detection and compensation are key components in advanced video codec. Usually, they consume the largest amount of computation time. For example, motion estimation uses about 60-80% of H.264 encoding time. To reduce the complexity of motion estimation, inter-frame prediction model 621 1 may utilize motion models 820 which are defined by known knowledge of a given video source. Motion model 820 may list all possible motions, such as type, direction, speed limit, etc. for a given video source. Motion estimator 825 may utilize a simple motion estimation algorithm, such as small region diamond search, followed by adaptive motion vector refinement. The output of inter-frame prediction will provide encoding frame type and corresponding encoding information. Afterwards, this output may be further compressed using entropy encoding via encoder 635, as described for FIG. 6, for example.

In another embodiment, widely used image and video compression standards can be used with image data 261. For example, image compression encoder 215B may utilize H.264 AVC, which may be a suitable video codec for robust and reliable video compression for various embodiments of this disclosure. H.265 HEVC may be able to provide the same video quality as H.264 AVC with twice the compression ratio and complexity. Different reference implementations of H.265 HEVC are currently available for demonstration purposes. This codec may be used in various exemplary implementations of disclosed methods. Additionally, another compression standard is in CCSDS (Consultative Committee for Space Data Systems) lossless data compression, which was designed for satellite applications. The CCSDS lossless compression standard may be implemented with or instead of previous video codecs to achieve visually lossless video compression algorithms with low complexity.

With reference back to FIG. 2, remote unit 110 may include other compression encoder 215C for encoding other data 262 that is not PCM-encoded measurement data 260 or image data 261. Other data 262 may include already compressed data. In an exemplary embodiment, encoder 215C may group data sources that are highly correlated together and separate out data that is already compressed. Often, for already-compressed data, it may be difficult to obtain further data size reduction. Depending on the coding efficiency of the original compression algorithms, other compression encoder 215C may determine whether to keep the same compressed data or to decompress the compressed data and recompress it using any of the various encoding schemes described above, for example, using PCM compression encoder 215A for LPCM or logarithmic PCM. For data whose contents are numerical values, such as floating point values instead of linear PCM, other compression encoder 215C may determine that LPCM algorithms described above can be used to compress them. If the data's content is symbols, such as text messages, other compression encoder 215C may analyze the data characteristics and choose an appropriate entropy encoding scheme. In general, other compression encoder 215C may attempt to group correlated data together as multi-dimension vectors, establish correlation model among group members to reduce redundancy, and then apply a lossless compression algorithm.

In some exemplary embodiments, other data 262 may be specifically data structure information. Because data 126 may include data from various sources (e.g., measurement data 126 from multiple transducers 125, some of the measurement data being specifically image data 261), exemplary data 126 may be structured such that for one predetermined period of time (a frame), the various data signals are time-multiplexed and serialized according to a predefined structure. Data structure information may be provided as part of data 126 so that local unit 105 is able to synchronize to the periodic data and identify or extract specific types of data. Data structure information may include frame synchronization words (SYNC1 AND SYNC 2), sub-frame identification words (SFID), sub-sub frame synchronization words (XCounter), minor frame counters (MCounter), other counters (YCounter), and other known data structure information. Various exemplary embodiments for low-delay, low-complexity compression algorithms for SFID, SYNC1 and SYNC2 are discussed in further detail.

The SFID component may vary slowly, increasing or decreasing as the frame increases. As SFID varies with different numbers of frames, the key to a compression algorithm for SFID is to identify the variation direction and the number of frames for each SFID. The periodicity of the SFID variation may be extracted as a feature and used to design a low-delay, low-complexity, error-propagation-robust, adaptive-prediction algorithm to compress the SFID component. The format of the encoded bit stream may be defined as shown in Table 1. Test results show that the compression ratio varies with data memory size and packet size. If the packet size of data being transmitted from remote unit 110 to local unit 15 is one major frame per packet, the compression ratio is about 613:1. Although other formats may be used for encoding the bit-stream based on the characteristics of the particular SFID data, as well as other considerations, an exemplary format for encoding the bit stream as shown in Table 1 may be used.

TABLE 1

| # of 16-bit Words | SFID Encoding Stream Contents | Values in Log File |
| --- | --- | --- |
| 1 | Initial SFID value | 49067 |
| 2 | Up/down Indication | 1: Increase/0: decrease |
| 3 | #of peaks of SFID variation (N) | 1 |
| 4 (3 + 1) | Peak value 1 | 50431 |
| ... | ... | |
| 3 + N − 1 | Peak value N − 1 | |
| 3 + N | Peak value N | |
| 3 + N + 1 | # of varying periods (M) | 215 |
| 4 + N + 1 | Period 1 | 3737 |
| 4 + N + 2 | # of repeats of Period 1 | 1 |
| 4 + N + 3 | Period 2 | 6250 |
| 4 + N + 4 | # of repeats of Period 2 | 27 |
| ... | ... | |
| 4 + N + 2M − 1 | # of repeats of Period M | 1437 |
| 4 + N + 2M | Period M | 1 |

The two 16-bit synchronization words (SYNC1 and SYNC2) typically represent constants. However, they may be changed during system operation. A low-delay, low-complexity lossless compression algorithm for the synchronization may be based on monitoring the synchronization words. Table 2 shows the structure of their encoding bit stream. The algorithm may exceed a 400:1 compression ratio when one major frame is used per packet. Although other formats may be used for encoding the bit stream based on the characteristics of the particular synchronization data, as well as other considerations, an exemplary format for encoding the bit stream as shown in Table 2 may be used.

TABLE 2

| # of 16-bits words | The Encoding Bit Stream of SYNC Words Contents | Values in Log File |
|---|---|---|
| 1 | Sync Word 1 | 49067 |
| 2 | Sync word2 | 1: Increase/ 0: decrease |
| 3 | Process_size | In # of minor frames |
| 4 | Change flag for block 1 | Change: 1 or # of changes (N) No change: 0 |
| 5 | # of changes for both sync1 & 2 | N12 |
| 5 + 3(1~3) | (1st pos, 1st SW1 and SW2) | |
| ... | | |
| 5 + 3(N12 − 2~N12) | (N12th pos, N12th SW1 & SW2) | 215 |
| 5 + 3N12 + 1 | #of changes for sync1 | |
| 6 + 3N12 + (1~2) | (1st pos, 1st SW1) | 1 |
| ... | | 6250 |
| 6 + 3N12 + 2(N1 − 1~N1) | (N1th pos, N1th SW1) | 1 |
| 6 + 3N12 + 2N1 + 1 | # of changes for sync2 | |
| 7 + 3N12 + 2N1 + (1~2) | (1st pos, 1st SW2) | 1 |
| ... | | 6250 |
| 7 + 3N12 + 2N1 + 2(N2 − 1~N2) | (N2th pos, N2th SW2) | 1 |
| | Change flag for block 2 | |
| 4 + N + 2M − 1 | # of repeats of Period M | 1437 |
| 4 + N + 2M | Period M | 1 |

Figure 9A:
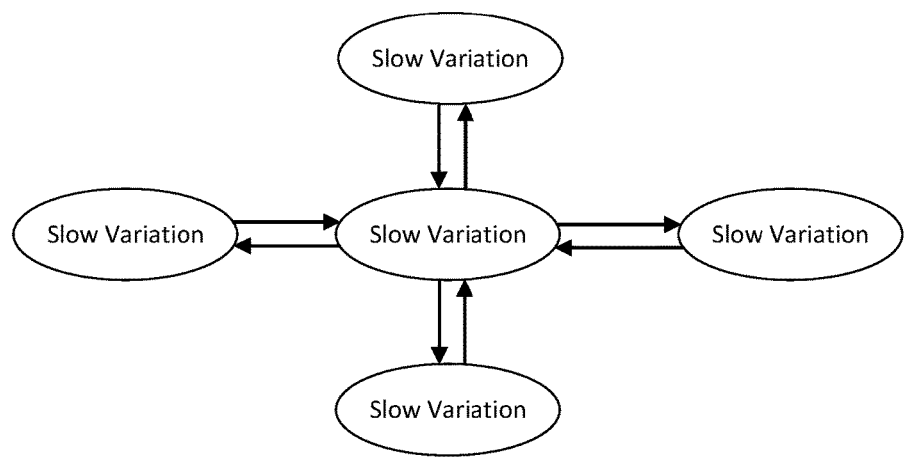
FIG. 9A illustrates a state machine of an exemplary multistate lossless compression scheme.
Figure 9B:
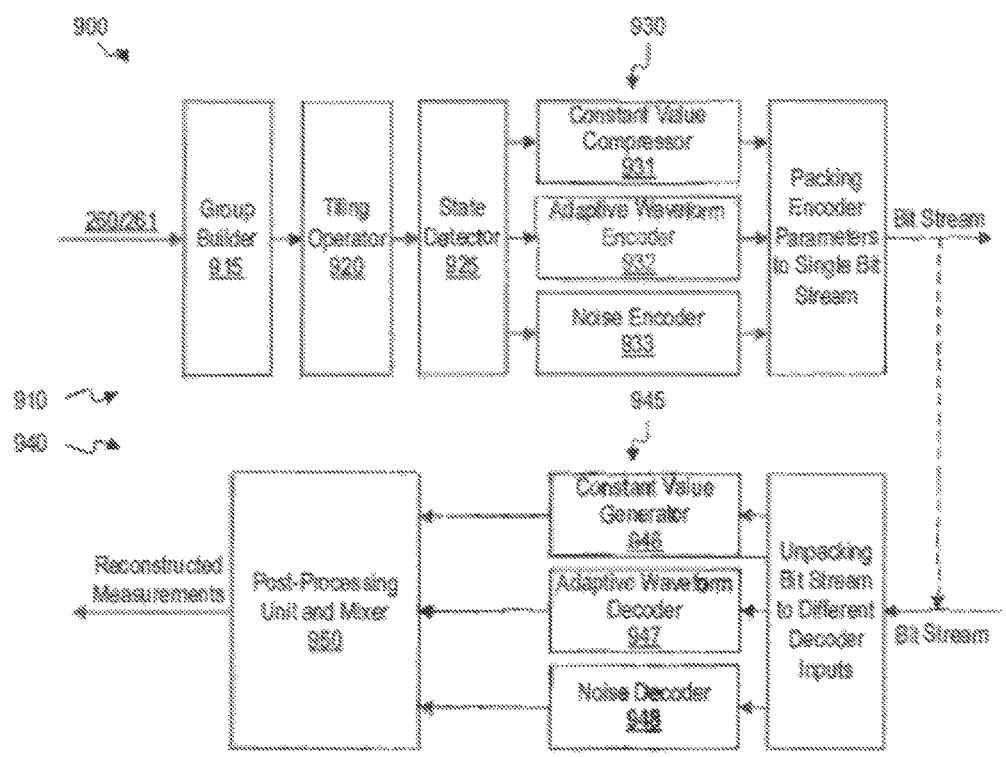
FIG. 9B illustrates a block diagram of an exemplary multi-state, low-delay, low-compression, lossless compressor.

For data structure information and PCM-encoded measurement data 260, in addition or as an alternative to the above-disclosed methods of compression, e.g., as described above with respect to PCM compression encoder 215A and other compression encoder 215C, a multistate lossless compression algorithm may be utilized. FIG. 9A illustrates a state machine of an exemplary multistate lossless compression including one of five possible states that PCM-encoded measurement data 260 and/or data structure information (i.e., other data 262) is in: constant level, slow-varying, periodical, transition, and random noise. FIG. 9B illustrates a block diagram of an exemplary multi-state, low-delay, low-complexity lossless compressor 900, including multi-state encoder 910 and multi-state decoder 940. Multi-state encoder 910 may be part of remote unit 110 and multi-state decoder 940 may be part of local unit 105. Multi-state encoder 910 may include a group builder 915, a tiling operator 920, a state detector 925, and various compression encoders 930 (e.g., constant value compressor 931, adaptive waveform encoder 932, and noise encoder 933). PCM-encoded measurements and/or data structure information may be input into group builder 915 to be grouped into similar measurements. Tiling operator 920 may divide each group into non-overlapping time segments, and state detector 925 may determine the state of each of the segments. According to the determined state, the segment may be compression encoded by one of encoders 930 before being packed into a bit-stream that may be transmitted to local unit 105 after shuffling, encryption, and packetization (see FIG. 2).

FIG. 9B also illustrates a block diagram of an exemplary multi-state decoder 940, which may reconstruct the data encoded by multi-state encoder 910 after it is received by local unit 105 and after it is depacketized, decrypted, and deshuffled (see FIG. 2). Multi-state decoder 940 may reconstruct the data by performing the reverse of the steps performed by multi-state encoder 910. Using various compression decoders 945 (e.g., constant value generator 946, adaptive waveform decoder 947, and noise decoder 948) and a post-processing unit and mixer 950. Additional details of multi-state low-delay, low-complexity lossless compressor 900 are described with respect to FIGS. 10-17.

Figure 10:
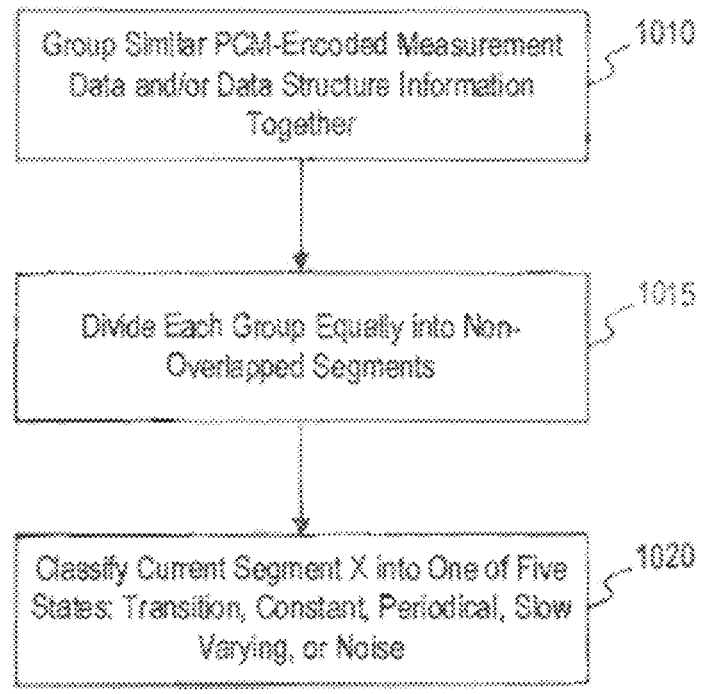
FIG. 10 illustrates a flowchart for an exemplary method of multi-state lossless compression.

FIG. 10 illustrates a flowchart for an exemplary method of multi-state lossless compression as performed by remote unit 110, or more specifically multi-state encoder 910, for example. At Step 1010, multi-state encoder 910 (more specifically, group builder 915) may group similar PCM-encoded measurement data 260 together and/or data structure information 262. Although all of PCM-encoded measurement data 260 may be correlated to each other to different degrees, in an exemplary embodiment and for simplicity, PCM-encoded measurement data 260 may be divided into the following groups: VIBE, GPSR, R3, S1, GPS, IMU, and Analog. The grouping may be made according to the definition of the telemetry file or the hardware interface. VIBE may correspond to various vibrometer measurements, which most of the time are stable and vary periodically, although sometimes the measurements have sudden fluctuations for certain periods of time. The various vibrometer measurements may be highly correlated. GPSR may correspond to Javad GPS data that includes timing and global position data. R3 may correspond to roll-stabilized inertial measurement unit data for spinning vehicle applications. 51 may correspond to IMU data that measures and reports velocity, orientation, acceleration, and gravitational forces related to remote unit 110. GPS may correspond to Global Positioning System data that includes date, time, Cartesian position, Cartesian velocity, latitude, longitude, altitude, geodetic position.

At Step 1015, multi-state encoder 910 may divide each group equally into non-overlapped segments to minimize delay. The step of dividing each group of measurements into non-overlapping equal-length segments may be referred to as a tiling operation and may be performed by tiling operator 920. The size of the segments may be directly related to the level of acceptable delay and the data memory requirements. In an exemplary embodiment, multi-state encoder 910 may select a multiple of major frame duration as the sizes of the segments. Measurements of different groups may use different segment sizes. In another exemplary embodiment, multi-state encoder 910 may select a segment size that is the same as the transmission packet duration to ensure that the delay due to compression does not affect the transmission during real-time operation of telemetry system 100.

For each segment, multi-state encoder 910 may identify the state to which the segment belongs and apply different compression models according to the states. At Step 1020, multi-state encoder 910 may classify a current segment X into one of the following states: constant, periodical, slow-varying, transition (rapid jump or sudden change), or random noise, and then compress the segment accordingly. In an exemplary embodiment, the default classification may be the transition state until multi-state encoder 910 has identified segment X as satisfying the condition for a different classification.

Figure 11:
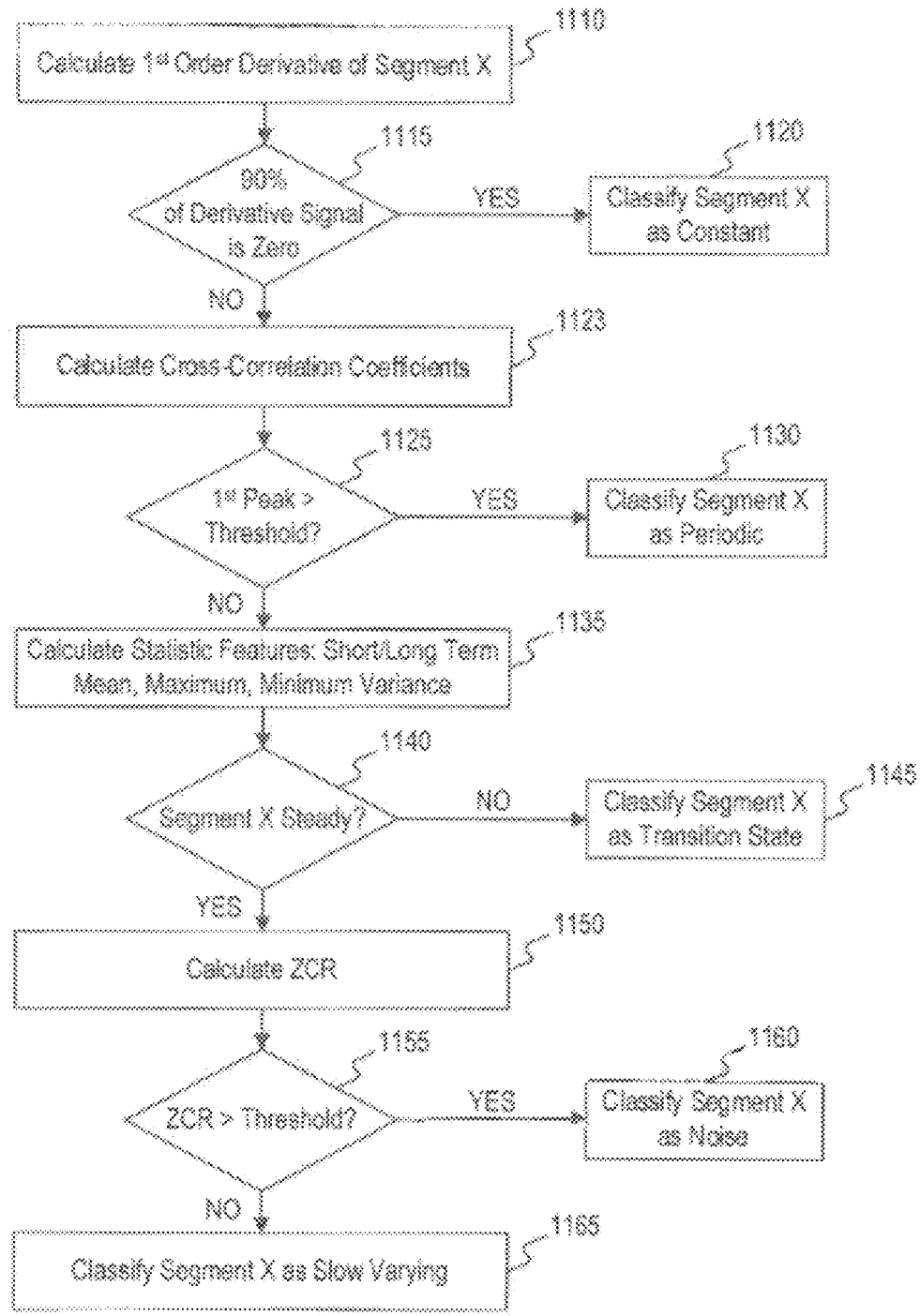
FIG. 11 illustrates a flowchart for an exemplary method of classification of a segment of telemetry data performed by the multi-state, low-delay, low-compression, lossless compressor of FIG. 9B.

FIG. 11 illustrates an exemplary method of classification of a current segment X in greater detail. At Step 1110, for a given segment X, multi-state encoder 910 may calculate the 1st order derivative of the signals of segment X to determine if segment X is constant. At Step 1115, multi-state encoder 910 may check if at least 90% of the first order derivatives have a value of zero. If at least 90% are zero (Step 1110: YES), multi-state encoder 910 may classify segment X as being in a constant state, and therefore segment X may be compressed by constant value compressor at Step 1120. Otherwise (Step 1110: NO), multi-state encoder 910 may determine if segment X exhibits periodicity by calculating cross-correlation coefficients for segment X according to Eq. 2, at Step 1123.

$$R_\tau = \frac{E[(X_t - \mu)(X_{t+\tau} - \mu)]}{\sigma^2} \qquad (2)$$

Equation 2 is more specifically an autocorrelation $R(\tau)$ of segment X as a function of time-shifts ($\tau$), i.e., a correlation of segment X with itself. If the 1st peak of $R(\tau)$ (not at the origin) is greater than a threshold (Step 1125: YES), multi-state encoder 910 may classify that segment X as periodic, and segment X may be encoded and compressed by an adaptive waveform encoder, at Step 1130, for encoding as a periodic signal. Otherwise (Step 1125: NO), multi-state encoder 910 may determine, at Step 1135, various signal statistic features of segment X including, for example, short- and long-term means, minimum, maximum, and variance of amplitudes in segment X, and use the signal statistic features to determine whether segment X is steady. In an exemplary embodiment, multi-state encoder 910 may determine whether segment X is steady (at Step 1140) if segment X satisfies either of the following conditions, where Ds represents the derivative of the signal. Condition 1 is:

$$\frac{Ds_{max}}{Ds_{min}} < 4 \qquad (3)$$

and $$\frac{Ds_{max}}{D1} < 3 \qquad (4)$$

where $D_{Smax}=\max\{D_S\}$, $D_{Smin}=\min\{D_S\}$, $Ds(i)=A_{Smax}(i)-A_{Smin}(i)$, and $D1=A_{max}-A_{min}$, and where $A_{Smax}$ is the maximum amplitude of segment X, $A_{Smin}$, is the minimum amplitude of segment X, $A_{Smax}(i)$ is the maximum amplitude of the $i^{th}$ term period in segment X, and $A_{Smin}(i)$ is the minimum amplitude of the $i^{th}$ short term period in segment X.
Condition 2 is:

$$(Std_{max}-Std_{min})/Std_{min} < 1 \qquad (5)$$

where $Std_{max}=\max\{std(i)\}$, $Std_{min}=\min\{std(i)\}$, and $Std(i)$ is the standard deviation of the $i^{th}$ short term period If segment X satisfies at least one of the above conditions (1) or (2) (Step 1140: YES), multi-state encoder 910 may determine that segment X is in a steady state and proceed to Step 1150. If segment X satisfies neither of the above conditions (1) or (2) (Step 1140: NO), multi-state encoder 910 may classify segment X as in a transition state, and segment X may be compressed by a transition signal compressor at Step 1145. Otherwise, if multi-state encoder 910 determines that segment X is in a steady state, multi-state encoder 910 may further determine whether segment X is a slow-varying signal or a random noise segment by determining the zero-crossing rate (ZCR) of the signals in segment X, at Step 1150, and comparing whether the ZCR is greater than the predefined threshold, at Step 1155. The zero-crossing rate is the rate at which signals in segment X cross the zero-value from a positive value to a negative value and vice versa. If the ZCR is greater than the threshold (Step 1155: YES), multi-state encoder 910 may determine that segment X is a noise segment and segment X may be compressed by a random noise compressor at Step 1160. If the ZCR is lesser than the threshold (Step 1155: NO), multi-state encoder 910 may classify segment X as being in a slow-varying state and segment X may be compressed by a slow variation signal compressor at Step 1165.

A description of the various exemplary compressors for different states is given below. An exemplary embodiment of constant value compressor 931 may utilize run-length encoding because the majority of the data in segment X that is in the constant level state will be a single constant value. In another exemplary embodiment, constant value compressor 931 may be implemented using discontinuous transmission with extra redundancy for error correction. That is, some of the constant value signal may be represented by the absence of signal. In an exemplary embodiment, the non-constant values may be encoded as differential coding or linear prediction coding depending on their location and the pattern of occurrences. The complexity and memory requirement of the constant value compressor 931 may be very low, and the compressor may be able to reach a compression ratio on the order of hundreds to one without any information loss. The constant value compressor 931 may be used to compress, for example, the major frame counters (SYNC1, SYNC2), some segments of GPS data, and temperature monitoring data.

Figure 12:
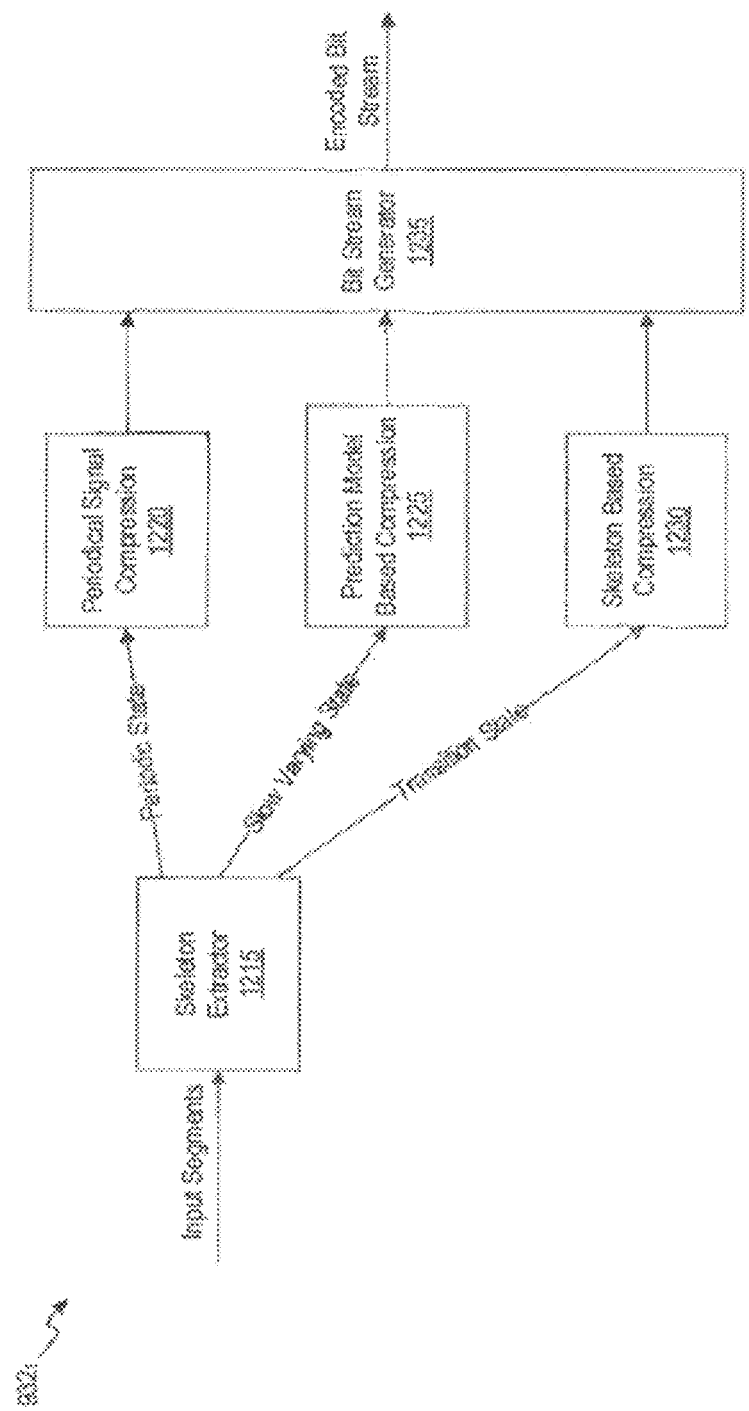
FIG. 12 illustrates a block diagram for an exemplary adaptive waveform encoder of FIG. 9B.

Adaptive waveform encoder 932 may be used to compress periodical, slow-varying, and transition state signals, i.e., adaptive waveform encoder 932 may be used as a periodic-waveform compressor used at Step 1130, a transition signal compressor used at Step 1145, and/or a slow variation signal compressor used at Step 1165. FIG. 12 illustrates an exemplary adaptive waveform encoder 932 1. Adaptive waveform encoder 932 1 may include a skeleton extractor 1215, a periodic-signal compression unit 1220, a prediction model-based compression unit 1225, a skeleton-based compression unit 1230, and a bit-stream generator 1235. In an exemplary embodiment, theme extractor 1215 may extract theme skeletons based on the state of segment X. If the segment is periodical, theme extractor 1215 may construct a skeleton based on the first period of segment X. Otherwise, theme extractor 1215 may divide segment X into sub-segments with equal length, and construct a skeleton based on the first sub-segment. A skeleton may be defined by a sequence of binary-coded values of amplitude and a corresponding sequence of amplitude-switching positions. Alternatively, a skeleton may be defined by a sequence of values, wherein each value is one of two possible values, and a corresponding sequence of amplitude-switching positions.

Figure 13:
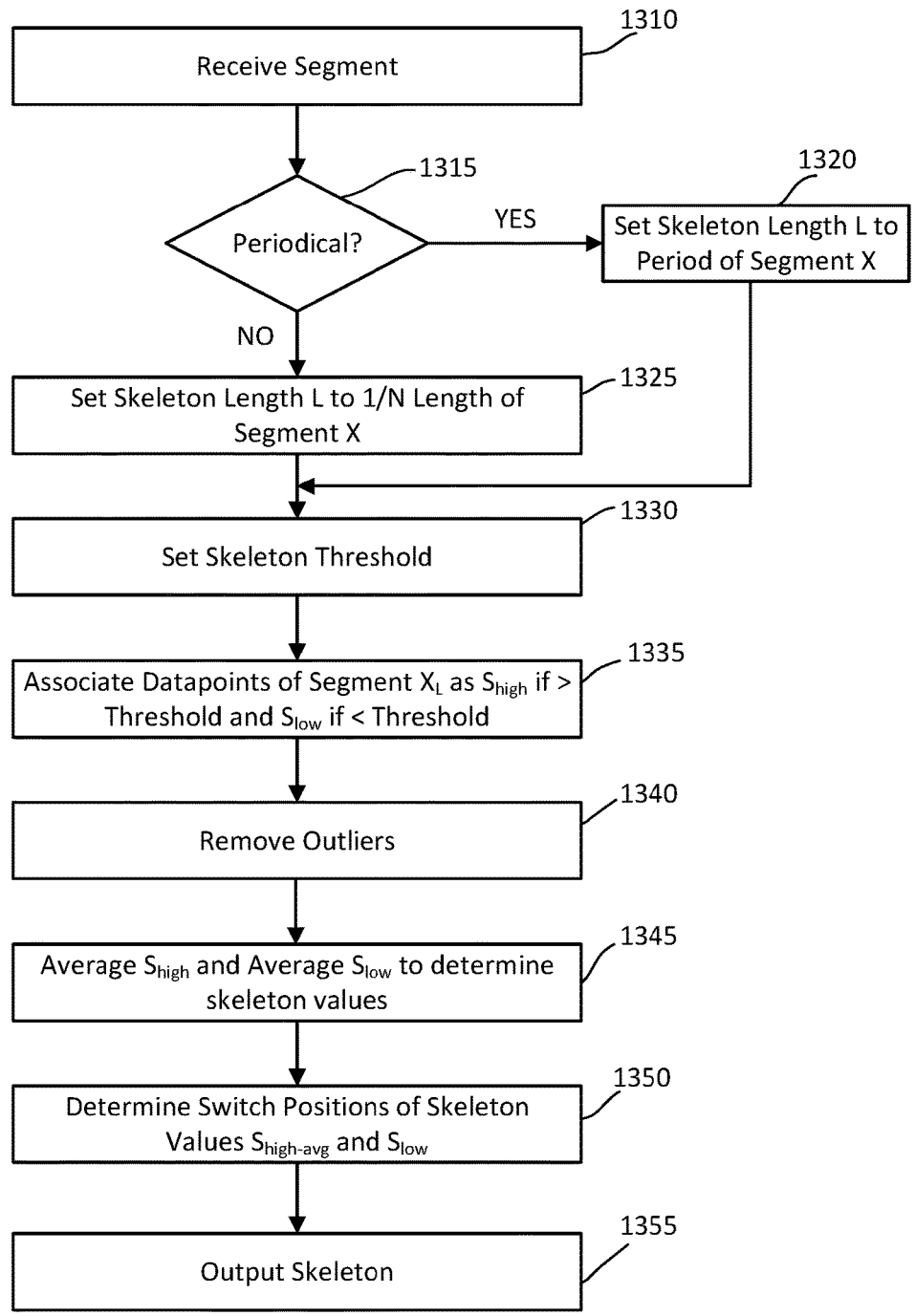
FIG. 13 illustrates a flowchart for an exemplary method of extracting a theme skeleton from a segment of telemetry data as performed by the adaptive waveform encoder of FIG. 12.

FIG. 13 illustrates a flowchart for an exemplary method of extracting a theme skeleton from segment X as performed by skeleton extractor 1215 of FIG. 12. At Step 1310, skeleton extractor 1215 may receive segment X, the determined state of segment X, and/or various extracted features of segment X. Skeleton extractor 1215 may check whether the state of segment X is periodical at Step 1315. If the state is periodical (Step 1315: YES), skeleton extractor 1215 may set a skeleton length L to be the period exhibited by segment X at Step 1320. If the state is not periodical (Step 1315: NO), skeleton extractor 1215 may set the skeleton length L to be 1/N of the length of segment X, where N is an integer, at Step 1325. For convenience, an L-length portion of segment X will be referred to as segment XL, wherein XL may be a period-length portion of segment X for periodic states or a 1/N sub-segment of segment X for slowly-varying or transition states. At Step 1330, skeleton extractor 1215 may set a threshold to be equal to the middle value between the minimum value and the maximum value in segment XL, specifically:

$$\text{Threshold} = X_{min} + (X_{max} - X_{min})/2 \quad (6)$$

At Step 1335, skeleton extractor 1215 may associate data points of segment $X_L$ as $S_{high}$ if the data point is greater than or equal to the threshold determined by Eq. 6, or associate a data point of segment S as Slow if the data point is lesser than the threshold. As a result, a set of values may be associated with $S_{high}$ and another set of values may be associated with $S_{low}$. At Step 1340, skeleton extractor 1215 may remove outliers from $S_{high}$ and $S_{low}$. At Step 1345, skeleton extractor 1215 may average $S_{high}$ and average $S_{low}$ to determine skeleton values. For example, skeleton extractor 1215 may set the skeleton values to be either of these average values ($S_{high\_avg}$ and $S_{low\_avg}$). At Step 1350, skeleton extractor 1215 may determine switching positions for segment XL. For example, skeleton extractor 1215 may determine the switching positions corresponding to the $S_{high\_avg}$ and $S_{low\_avg}$ skeleton values. Skeleton extractor 1215 may output the skeleton comprising the set skeleton values and the switching positions corresponding to these values, at Step 1355.

Figure 14:
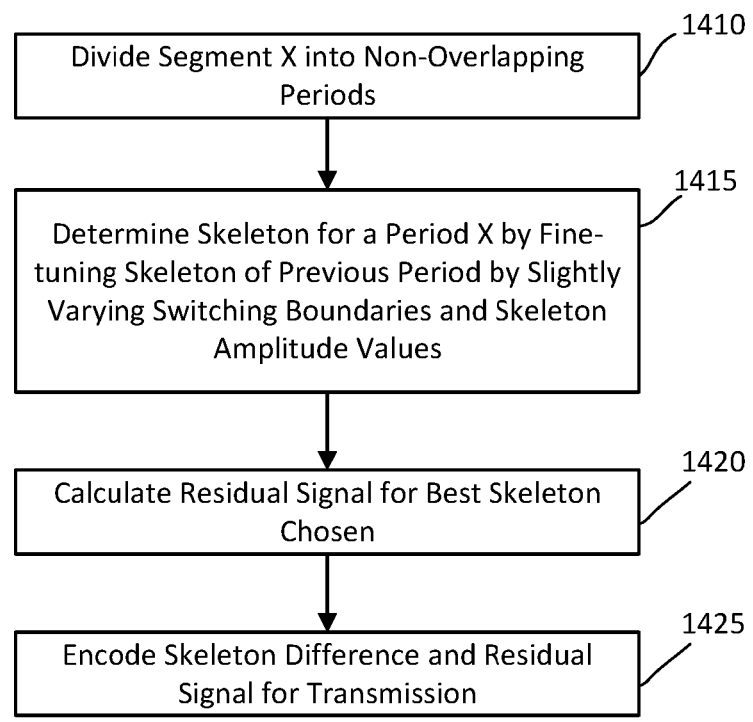
FIG. 14 illustrates a flowchart for an exemplary method of processing a data segment that is in a periodic state as performed by the adaptive waveform encoder of FIG. 12.

After extracting the skeleton from segment X, adaptive waveform encoder 932, may proceed with processing segment X based on whether segment X is in a periodic, slow-varying, or transition state. FIG. 14 illustrates a flowchart for an exemplary method of processing segment X in a periodic state. If segment X is periodic, periodic signal compression unit 1220 of FIG. 12 may process segment X by dividing segment X into non-overlapping periods, at Step 1410. At Step 1415, for each period, periodic signal compression unit 1220 may fine-tune the skeleton of the previous period by slightly varying switching boundaries and skeleton amplitude values to minimize mean square errors between the skeleton and the signal in the current period. At Step 1420, when the best skeleton is found and chosen, the residual signal may be calculated by subtracting the skeleton from the signal in the current period. At Step 1425, the skeleton differences and the residual signal may be encoded for transmission.

If segment X is slow-varying, prediction model-based compression unit 1225 may process segments $X_L$ using one of four prediction models: 2nd order autoregressive (AR) prediction, 4th order AR prediction, 6th order AR prediction, and linear extrapolation prediction. Prediction model-based compression unit 1225 may calculate AR prediction coefficients by using a Levinson algorithm, and linear extrapolation prediction coefficients by using a Lagrange polynomial optimization process, and corresponding residuals. The best prediction model will provide the least number of bits requirement for representing the signal of segment $X_L$. Prediction model-based compression unit 1225 may compare the number of bits required with this best prediction model to the number of bits required by the skeleton and residual model, in which segment $X_L$ is represented by a skeleton model and a corresponding residual. Prediction model-based compression unit 1225 may then choose the best model between these two for segment $X_L$, and encode the corresponding parameters and residual data into a bit stream for transmission.

Figure 15:
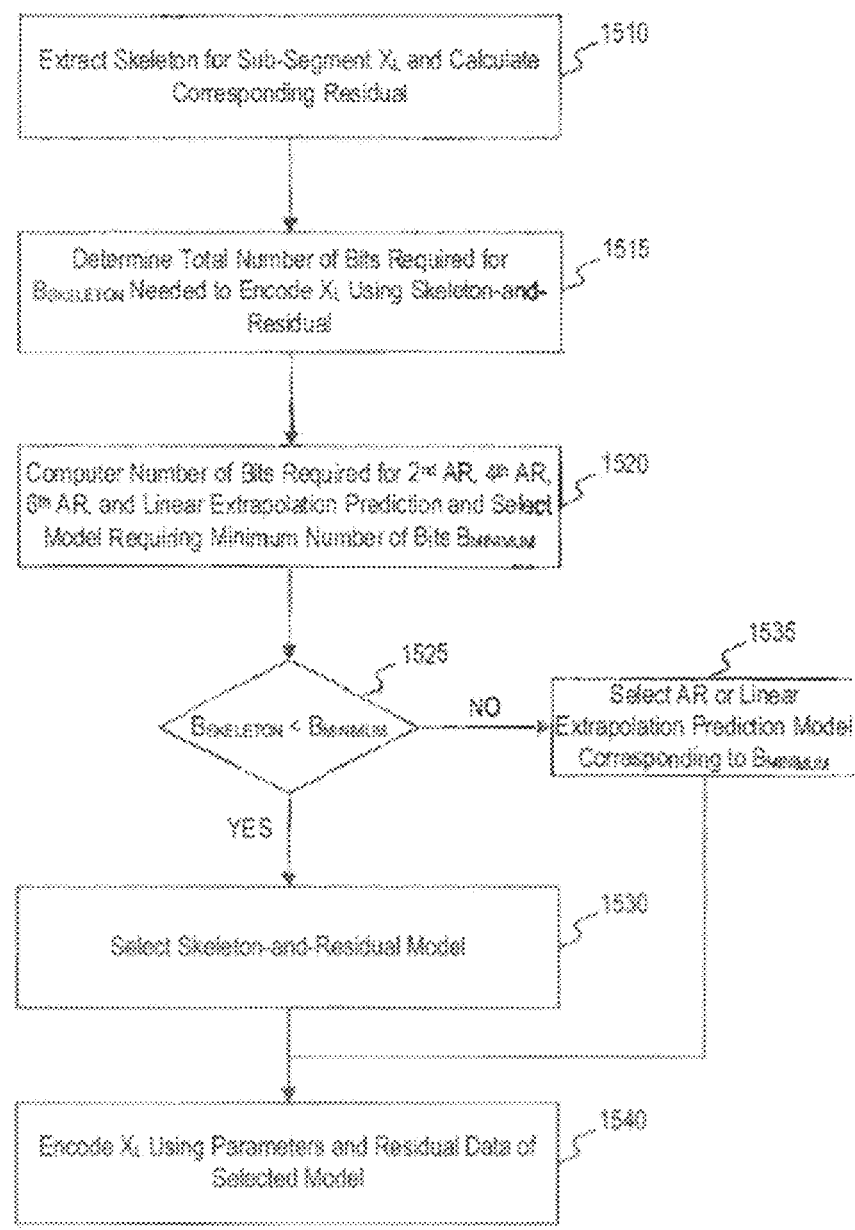
FIG. 15 illustrates a flowchart for an exemplary method of processing a data segment that is in a slow-varying state as performed by the adaptive waveform encoder of FIG. 12.

FIG. 15 illustrates a flowchart for an exemplary method of processing segment X in a slow-varying state. At Step 1510, skeleton extractor 1215 and/or prediction model-based compression unit 1225 may extract the skeleton of the first (1/N) sub-segment $X_L$ and calculate the corresponding residual. At Step 1515, prediction model-based compression unit 1225 may determine the total number of bits $B_{SKELTON}$ needed to encode first sub-segment $X_L$ using the skeleton-and-residual model. At Step 1520, prediction model-based compression unit 1225 may compute the required number of bits for 2nd AR prediction, 4th AR prediction, 6th AR prediction, and linear extrapolation prediction, and find the prediction model requiring the minimum number of bits $B_{MINIMUM}$. At Step 1525, prediction model-based compression unit 1225 may determine whether $B_{SKELTON}$ is lesser than $B_{MINIMUM}$. If $B_{SKELTON}$ is lesser than $B_{MINIMUM}$ (Step 1525: YES), prediction model-based compression unit 1225 may select the skeleton-and-residual model at Step 1530. If $B_{SKELTON}$ is not lesser than $B_{MINIMUM}$ (Step 1525: NO), prediction model-based compression unit 1225 may select the AR or linear extrapolation prediction model corresponding to $B_{MINIMUM}$ at Step 1535. At Step 1540, prediction model-based compression unit 1225 may encode segment $X_L$ using the parameters and residual data of the model selected at Step 1525.

Figure 16:
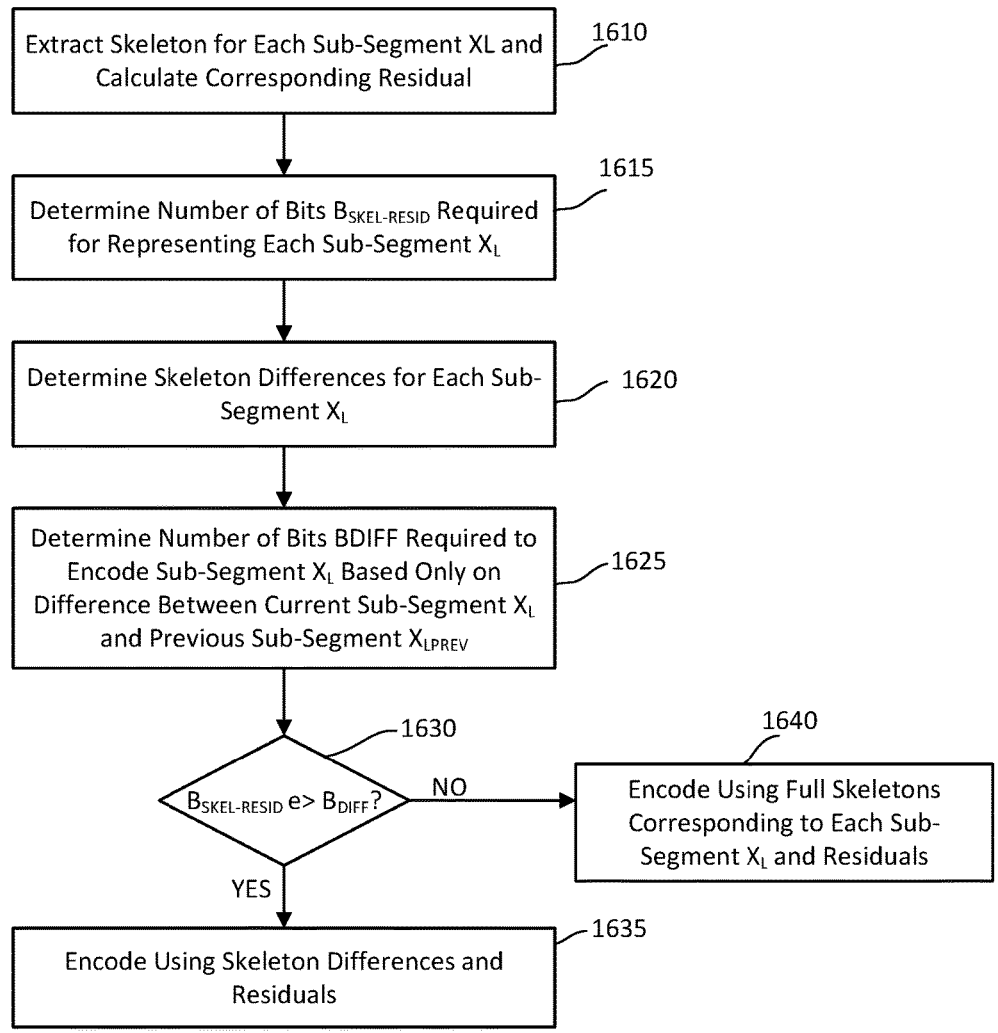
FIG. 16 illustrates a flowchart for an exemplary method of processing a data segment that is in a transition state as performed by the adaptive waveform encoder of FIG. 12.

If segment X is in a transition state, skeleton-based compression unit 1230 may process segment X according to, for example, the exemplary method illustrated in the flowchart of FIG. 16. At Step 1610, skeleton-based compression unit 1230 and/or skeleton extractor 1615 may extract the skeleton for each sub-segment $X_L$ and calculate the corresponding residual. At Step 1615, skeleton-based compression unit 1230 may then determine the number of bits BSKEL-RESID required for representing each sub-segment $X_L$ with the skeleton-and-residual model. At Step 1620, skeleton-based compression unit 1230 may determine skeleton differences for each sub-segment $X_L$ based on a previous sub-segment $X_L$. At Step 1625, skeleton-based compression unit 1230 may determine the number of bits BDIFF required to encode sub-segment $X_L$ based on only the difference between the current sub-segment $X_L$ and the previous sub-segment $X_{Lprev}$. At Step 1630, skeleton-based compression unit 1230 may determine whether $B_{SKEL-RESID}$ is greater than BDIFF. If $B_{SKEL-RESID}$ is greater than $B_{DIFF}$ (Step 1630: YES), sub-segments $X_L$ may be encoded using skeleton differences and residuals at Step 1635. If BSKEL-RESID is lesser than BDIFF (Step 1630: NO), sub-segments $X_L$ $X_L$ may be encoded using full skeletons corresponding to each sub-segment $X_L$ and residuals at Step 1640.

Figure 17:
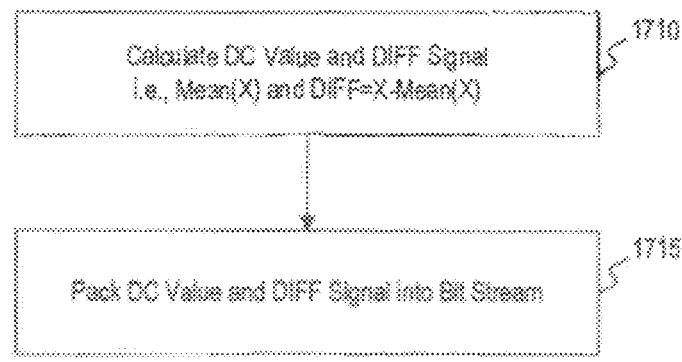
FIG. 17 illustrates a flowchart for an exemplary method of processing a data segment that is noise as performed by noise encoder of FIG. 9B.

For constant, periodic, slow-varying, and transition states, various compression methods as described above may result in desirable compression ratios for segment X data signals. A small percentage of the telemetry data, however, may show no or extremely low correlation in certain segments, and their waveform may look like random noise. Theoretically, such data may not be able to be compressed without information loss. There may be almost no compression for noise data, i.e. the compression ratio is about 1:1. FIG. 17 shows an exemplary compression encoding method for noise data. At Step 1710, a noise encoder may calculate the DC value of segment X, i.e., the mean value of X, and a difference signal DIFF=X−mean(x). At Step 1715, the noise encoder may pack the DC value and the DIFF signal into a bit-stream for transmission.

It is contemplated that a compression encoding may be specially designed for the compression of VIBE data. As all components of VIBE data may be highly correlated, it may be more efficient to compress them jointly. Based on the statistics of VIBE data, a compression algorithm may categorize VIBE samples into 3 states: slow-varying, rapid-changing, and slow-varying with impulse. The algorithm may include a stable stage over a long-term period, which may be a minimum period of 50 frames and a maximum of 400 frames. Cross-correlation may be used to detect the period, and then a prediction model may be used based on the detected period. In an exemplary embodiment, the compression algorithm may involve automatic switches between states of slow variation and sudden fluctuation.

With reference back to FIG. 2, after data 126 has been compressed and encoded according to the characteristics of the data, bit-stream shuffler 220 may receive the compression-encoded data as a bit stream and proceed to shuffle the bit stream so as to remove possibly predictable patterns added by the compression encodings. The potentially predictable patterns in compressed data are present when both the encoder and decoder share commonly defined bit allocations. Since any parameters in the compressed domain are represented by a group of continuous bits, the intrinsic connection among the parameters will appear as repeatable patterns in compressed bit streams when observed over a long enough period. To break the repeatable patterns, bit-stream shuffler 220 may be used to introduce multiple levels of randomness to produce random bit allocation in the final bit-stream.

Figure 18:
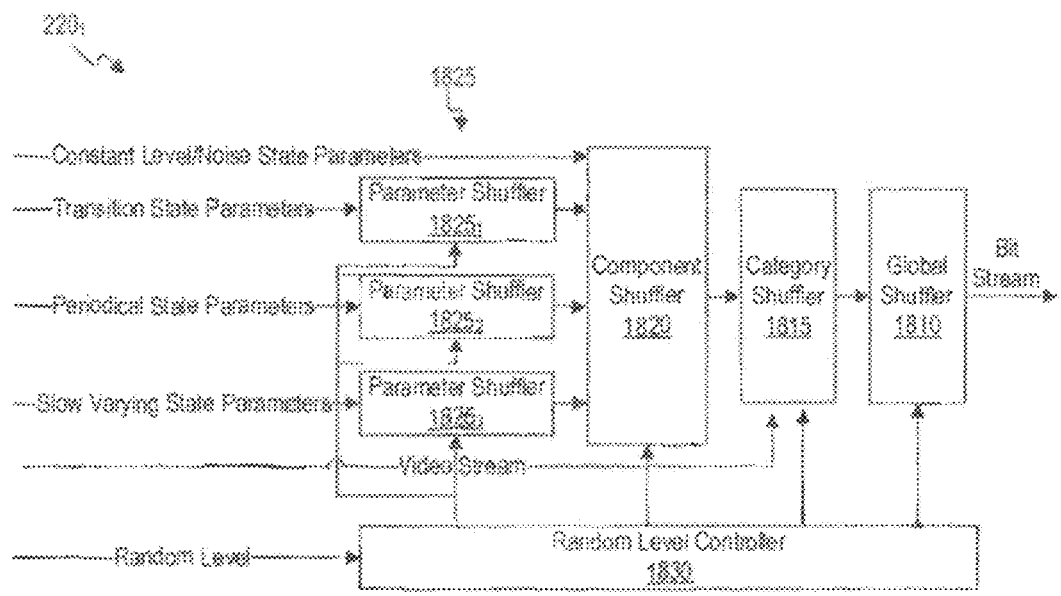
FIG. 18 shows a block diagram of an exemplary bit-stream shuffler of FIG. 2.

FIG. 18 shows details of a bit-stream shuffler 220, as an exemplary embodiment of bit-stream shuffler 220 of FIG. 2. There may be four levels of randomness generated by bit-stream shuffler 220 1. The first level of randomness may be generated by a global shuffler 1810, which alternates big-endian and little-endian presentation every n bytes in the bit stream. The second level of randomness may be generated by the category shuffler 1815, which randomly alternates category numbers (e.g., 1, 2, or 3) with predefined probabilities so that category types are randomly located in the bit streams. The third level of randomness may be generated and introduced by a component shuffler 1820. In a manner similar to the category shuffler 1815, the component shuffler 1820 may randomly allocate the order of data sources, so that correlation among different data sources will not generate a repeated pattern in the bit streams. The fourth level of randomness may be introduced by a parameter shuffler 1825 such as parameter shufflers 1825 1, 1825 2, and/or 1825 3, which may randomly assign bit allocation in individual encoding processes, based on segment states. For example, parameter shuffler 1825 1 may randomly assign bit allocation in the encoding process of segments in the transition state, parameter shuffler 1825 2 may do the same for segments in the periodical state, and parameter shuffler 1825 3 may do the same for segments in the slow-varying state. Depending on the encryption algorithm, the shuffler may be configured to use different level shufflers. Different level shufflers may be enabled or disabled independently by random level controller 1830 to provide multiple combinations of randomness to remove potential threads for different security and complexity requirements. The common random level and random number generators may be shared between the encoder in remote unit 110 and the decoder in local unit 105. The various shufflers 1810, 1815, 1820, and 1825 do not affect compression ratios. In local unit 105, bit-stream deshuffler 245 may include specific deshuffler components that correspond to the various shufflers 1810, 1815, 1820, and/or 1825. These deshufflers should use the same seeds as their corresponding shufflers for the random generators that generate the randomness applied by the bit-stream shuffler 220, and decoded by bit-stream deshuffler 245, so that bit-stream deshuffler 245 may automatically reorder the encoded bit-streams to their original forms for decoding.

Figure 19:
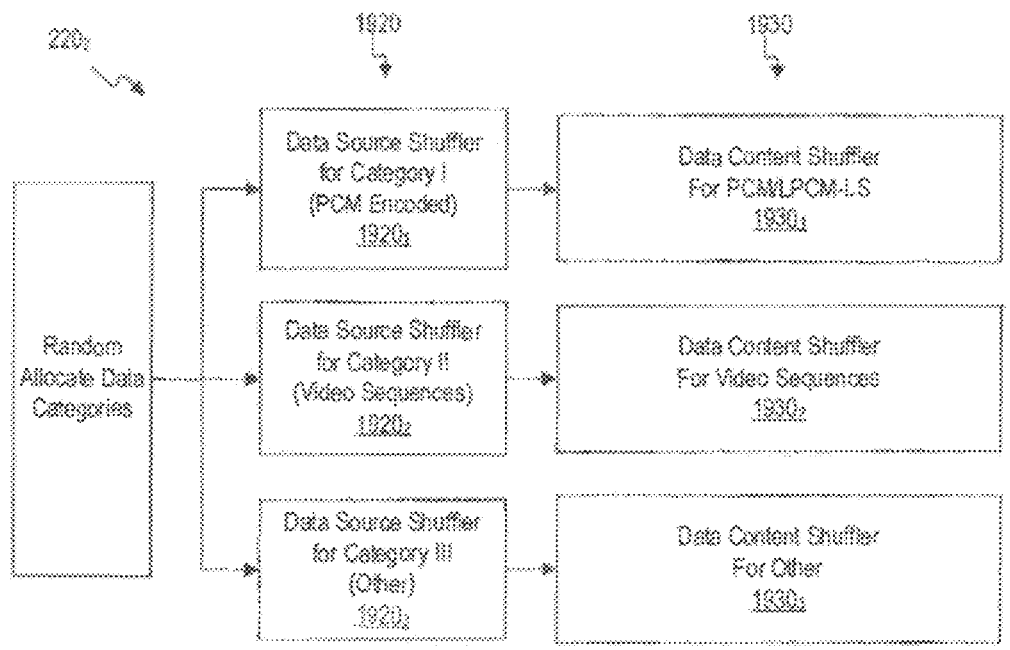
FIG. 19 shows a block diagram of another exemplary bit-stream shuffler of FIG. 2.

FIG. 19 illustrates bit-stream shuffler 220 2 as another exemplary embodiment of bit-stream shuffler 220 of FIG. 2. A first level of randomness may be created based on data types, and more specifically based on the number of data sources of each category. Date type shuffler 1910 may randomly generate category numbers (e.g., 1, 2, and 3) with predefined probabilities, so that the category types (e.g., PCM-encoded, image, and other) are randomly located in bit-streams. A second level of randomness may be introduced at the bit location of data sources. Data source shufflers 1920 (including, e.g., $1920_1$, $1920_2$, and/or $1920_3$) may randomly allocate the order of its data sources, so that the correlation among different data sources will not generate repeatable patterns in the bit streams. For example, data source shuffler $1920_1$ may shuffle the order of different sources of PCM-encoded data, $1920_2$ may shuffle the order of different sources of video sequences data, and $1920_3$ may shuffle the order of other types of data. A third level of randomness may be introduced by data content shufflers 1930 (including, e.g., $1920_1$, $1920_2$, and/or $1920_3$) as bit allocation within data from an individual data source, and may vary with compression methods. Depending on the subsequent encryption algorithm, shuffling at this level may have different granularities from randomly allocating bit streams according to objects or groups or further down to the byte level. For example, data content shuffler $1920_1$ may, for low-delay, low-complexity lossless encoded LPCM or logarithmic PCM data, randomly locate the order of quantization segments and quantization indexes in bit stream, and/or may switch big-endian and little-endian representation for every n bytes in the bit stream. As another example, data content shuffler 19302 may, for video sequence data, randomly locate the order of object contents and encoded residuals, and/or may switch big-endian and little-endian representation for every n bytes in the bit stream. Data content shuffler 19303 may, for other data, randomly locate the order of groups of data, and/or may switch big-endian and little-endian representation for every n bytes in the bit stream.

As adding randomness in deep levels of bit streams may increase the computation complexity, and depending on the encryption method that follows, adding three or four levels of randomness may not be necessary. It is contemplated that bit-stream shuffler 220 may be configured to adjust a desired randomness level.

With reference back to FIG. 2, after bit stream shuffler 220 has shuffled the bit stream, encrypter 225 may encrypt the bit stream. In an exemplary embodiment, the shuffling process may be tuned to correspond with a particular encryption algorithm that is being used to minimize the randomness level and computation complexity above a certain amount. After encryption, packetizer 230 may group the encrypted and encoded bit stream into packets for transmission to local unit 105 using specific transmission protocols. Protocol packetization may be important for efficiency of bandwidth use, and therefore careful selection of protocol, packet size, network jitter buffer sitting, etc., may be important. It is contemplated that any encryption method and/or any packetization method or protocol may be implemented. It is also contemplated that encrypter 225 and decrypter 240 may be omitted. In local unit 105, depacketizer 235 may reconstruct the encrypted, encoded bit-stream from the transmitted packets, decrypter 240 may decrypt the bit-stream, and bit-stream deshuffler may deshuffle the bit-stream. Decoders 250 may decode the compression encoding of various types of data 126, which then may be mixed back together by data mixer 255.

The disclosed real-time, low-delay, low-complexity lossless compression method may be specifically used with target vehicle telemetry, but is not necessarily limited to such applications. General lossless compression algorithms often reach less than 3:1 compression ratio on average. It is contemplated that the disclosed systems and methods may be able to achieve compression ratios of 5:1 or greater by utilizing the characteristics of data sources and correlations among different data sources, in order to remove higher order redundancy. Each compression algorithm of various types may be used independently or in various combinations. Multilevel randomness that is introduced into encoded bit-streams maintains a level of security by removing patterns that result from the compression algorithms.

Additional exemplary embodiments of encoders and compression algorithms for structured data and unstructured one-dimensional information including, but not limited to, one-dimensional telemetry data, are described below. Due to the requirements of low-delay, low computational complexity, low power consumption, and low memory occupancy for compression processes, the prior compression methods are too complicated and their delay is too long. The structure information compression algorithm can be separated in an implementation with configuration to save computation costs, if only structured data are present.

Figure 20:
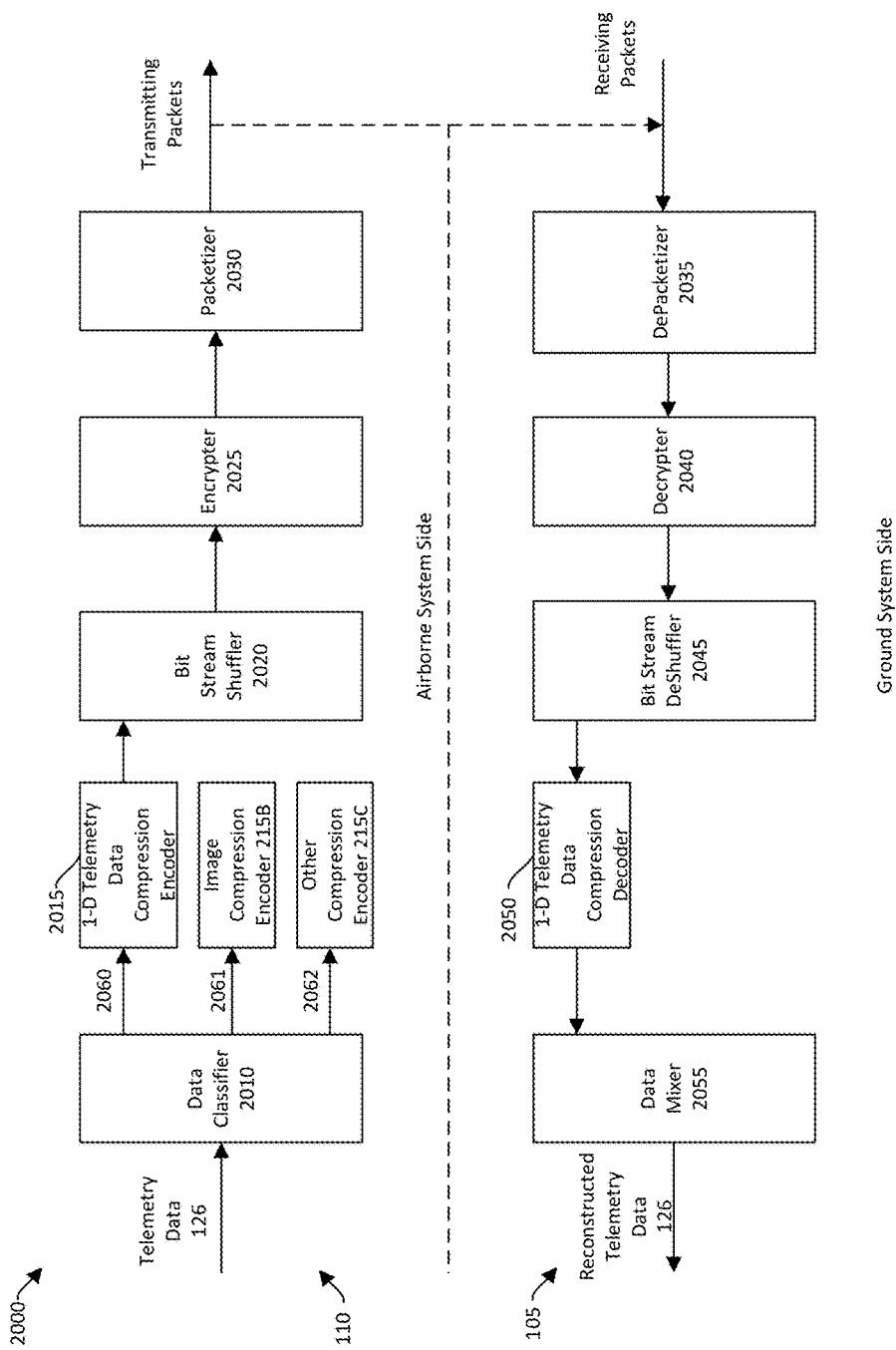
FIG. 20 is a block diagram of additional embodiments of telemetry data collection and transmission of the exemplary disclosed telemetry system of FIG. 1.

FIG. 20 is a block diagram of additional embodiments of telemetry data collection and transmission of the exemplary disclosed telemetry system of FIG. 1. With reference to FIG. 20, remote unit 110 may also include a data classifier 2010, a one-dimensional telemetry data compression encoder 2015, a bit stream shuffler 2020, an encrypter 2025, and a packetizer 2030, which process and prepare telemetry data 126 for transmission to local unit 105. This processing may include compressing telemetry data 126. By classifying telemetry data 126 via data classifier 2010, as discussed in further detail below, telemetry data 126 may be able to be compressed by one-dimensional data compression encoder 2015 with relatively high compression ratios and relatively low delay and computational costs. The compression-encoded data may be output as bit-streams, and bit-stream shuffler 2020 may shuffle these bit-streams to remove possibly predictable patterns added by compression encoders 2015. Encrypter 2025 may encrypt the shuffled bit-stream, and packetizer 2030 may perform packet protocol packetization for distributing the encrypted bit-stream as packets according to predefined protocols, such as but not limited to TCP or UDP/IP. The packets may subsequently be transmitted to local unit 105 as data 116 (see FIG. 1). Local unit 105 may process the received packets with a similar process but in reverse order to produce reconstructed data 126 that may be identical to the data generated at remote unit 110. Local unit 105 may include a depacketizer 2035, a decrypter 2040, a bit-stream deshuffler 2045, a one-dimensional compression decoder 2050, and a data mixer 2055, all of which process and reconstruct data 126. In an exemplary embodiment, disclosed systems and methods may be able to reach a 5:1 compression ratio for various data 126.

Data classifier 2010 of remote unit 110 may receive, as input, data 126, which may include measurement data generated by transducers 125 and other data such as data structure information, and classify data 126 into different categories. In an exemplary embodiment, data classifier 2010 may classify measurement data 126 into three categories: (1) one-dimensional telemetry data 2060, (2) image data 2061, and (3) other data such as data structure information 2062.

Remote unit 110 may convert measurement data 126 from transducers 125 into one-dimensional telemetry measurement data 2060 ("1-D telemetry data"). Such telemetry data 2060 may be a component of data 126.

After data classifier 2010 classifies data 126 into different categories, each category of data may be compressed by a different compression encoder. If the data 126 contains image data 2061 or other data 2062, the image data 2061 or other data 2062 can handled by compression encoders 251B and 215C, respectively, of the compression encoder of FIG. 2.

A one-dimensional telemetry data compression encoder 2015 may be configured for compressing 1-D telemetry data 2060 with low-delay low-complexity lossless compression. Because telemetry data sequences may be derived from generally continuous analog signals, 1-D telemetry data 2060 may exhibit a continuity in its data sequences. Stated differently, sequential data values may be correlated, which allows for the exemplary one-dimensional telemetry data compression encoder 2015 to use prediction models for the purpose of reducing redundancy in the data and facilitating higher compression ratio. Redundancy may be based on the number of bits used to code a message minus the number of bits of actual information in the message. For an exemplary 1-D telemetry data 2060 generated with a sampling rate of 100 Hz, a 10 millisecond delay allows the prediction model to look at one sample ahead in time. The one-dimensional telemetry data compression encoder 2015 may determine a prediction model of the data by analyzing the correlation among input 1-D telemetry data 2060 that has been obtained. An exemplary model may be a linear prediction model such as:

$$y_i = \sum_{k=1}^{n} a_k x_{i-k} a + b_1 x_{i+1} \tag{1}$$

where $x_i$ is the $i^{th}$ sample in the 1-D telemetry data 2060. $y_i$ is the corresponding predicted value of the sample. n is the order of the prediction model. $a_x$ and $b_1$ are prediction coefficients, which the one-dimensional telemetry data compression encoder 2015 may determine by the analysis of data sequences of input one-dimensional telemetry data that has been obtained. The prediction coefficients may be calculated offline using optimization algorithms, trained using a set of known data, and/or real-time adapted. The coefficients may therefore be adjusted based on different specific data sequences.

The predicted value $y_i$ generated by the prediction model and the actual value $x_i$ of the sample may be almost the same, and therefore a difference signal z between $x_i$ and $y_i$ may be made up of mostly zeroes. As a result, the one-dimensional telemetry data compression encoder 2015 may be able to compress the difference signal z with a high compression ratio. In an exemplary embodiment, the one-dimensional telemetry data compression encoder 2015 may compress the difference signal z using an entropy encoding scheme such as Huffman coding or arithmetic coding. The one-dimensional telemetry data compression encoder 2015 may use other encoding schemes including, but not limited to, run-length encoding.

Figure 21:
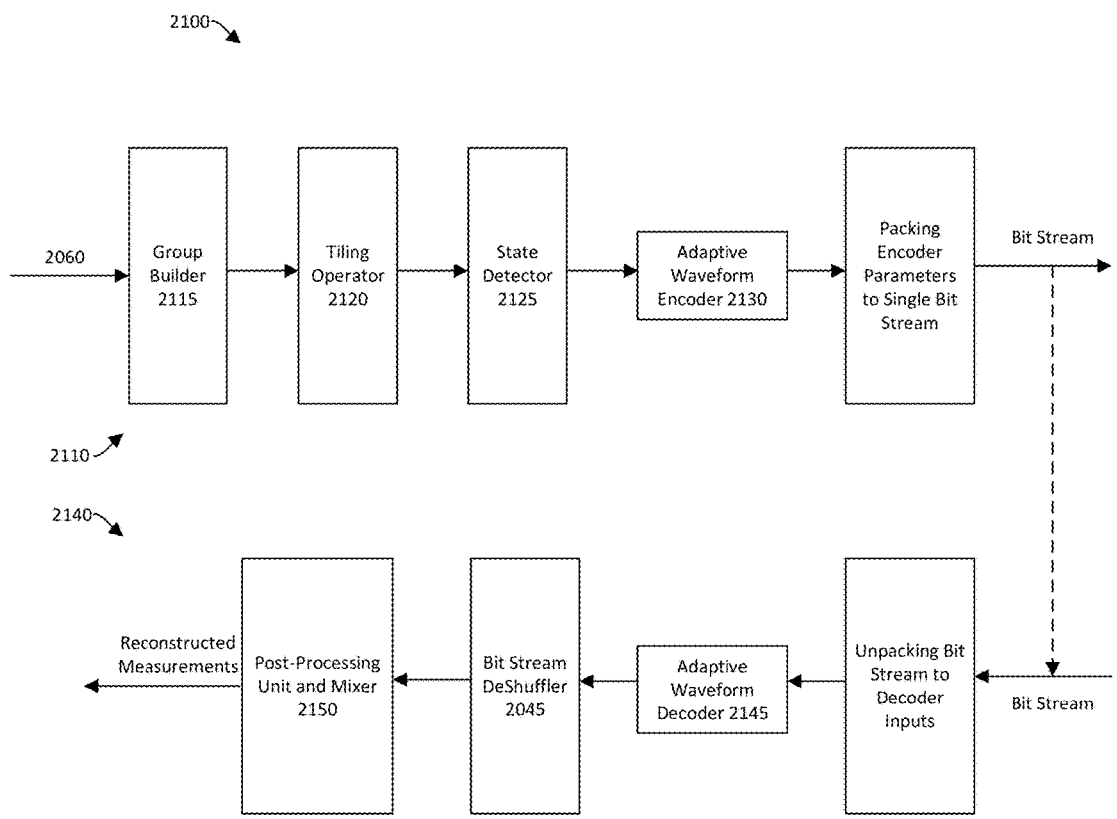
FIG. 21 illustrates a block diagram of an additional exemplary multi-state, low-delay, low-compression, lossless compressor.

FIG. 21 illustrates a block diagram of an additional exemplary multi-state, low-delay, low-complexity lossless compressor 2100, including multi-state encoder 2110 and multi-state decoder 2140. Multi-state encoder 2110 may be part of remote unit 110 and multi-state decoder 2140 may be part of local unit 105. Multi-state encoder 2110 may include a group builder 2115, a tiling operator 2120, a state detector 2125, and an adaptive waveform encoder 2130. 1-D telemetry measurement data 2060 may be input into group builder 2115 to be grouped into similar measurements. Tiling operator 2120 may divide each group into non-overlapping time segments, and state detector 2125 may determine the state of each of the segments. According to the determined state, the segment may be compression encoded by adaptive waveform encoder 2130 before being packed into a bit-stream that may be transmitted to local unit 105 after shuffling, encryption, and packetization (see FIG. 20).

FIG. 21 also illustrates a block diagram of an exemplary multi-state decoder 2140, which may reconstruct the data encoded by multi-state encoder 2110 after it is received by local unit 105 and after it is depacketized, decrypted, and deshuffled (see FIG. 20). Multi-state decoder 2140 may reconstruct the data by performing the reverse of the steps performed by multi-state encoder 2110. Using an adaptive waveform decoder 2145 and a post-processing unit and mixer 2150. Additional details of multi-state low-delay, low-complexity lossless compressor 2100 are described with respect to FIGS. 22-34.

Figure 22:
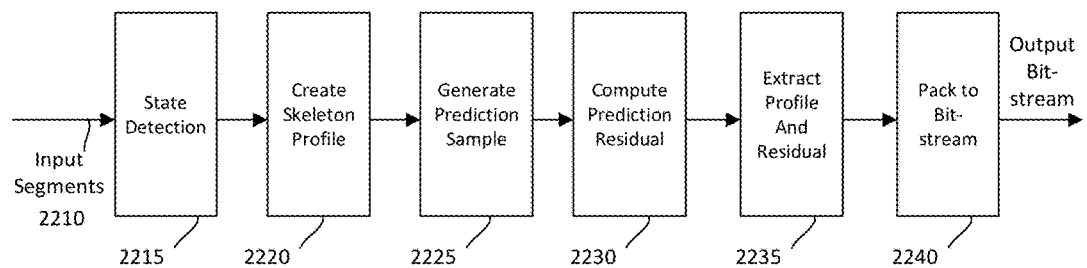
FIG. 22 illustrates a detailed block diagram of low-delay low-complexity lossless one-dimensional telemetry data compression encoder of FIGS. 20 and 21.
Figure 23:
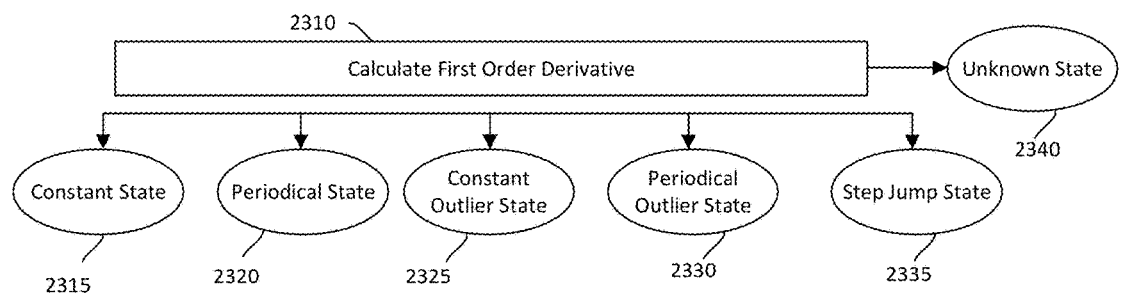
FIG. 23 illustrates a state machine for another exemplary method of classification of a segment of telemetry data performed by the exemplary adaptive waveform encoder of FIG. 21.

FIG. 22 illustrates a detailed block diagram of low-delay low-complexity lossless one-dimensional telemetry data compression encoder of FIG. 20. The exemplary embodiment of a multi-state lossless data compression algorithm 2200 in FIG. 22 includes a state detection method 2215, creation of a skeleton profile 2225, generation of a prediction sample 2225, computation of a prediction residual 2230, extraction of the profile and residual 2035, and packetize the data to bit-stream format 2240. The multi-state lossless data compression algorithm 2200 utilizes pre-knowledge of data characteristics that can be used to design a multi-state prediction model with adaptive entropy coding to remove intrinsic redundancy from the data contents. The multi-state lossless data compression algorithm 2200 divides each individual one-dimensional data stream into non-overlapping frames as input samples 2210, categorizes each frame into different states using the state detection method 2215, creates a skeleton profile 2220 that is used to create a prediction model by generating the prediction sample 2225 and computing the prediction residual 2230, and then extracts the corresponding prediction model 2235 for each state, and packetizes 2024 the model parameters into a bit-stream for transmission output 2245 or storage. FIG. 23 illustrates a flowchart for another exemplary method of classification of a segment of telemetry data performed by the exemplary adaptive waveform encoder of FIG. 20. The first order derivatives 2310 of input samples 2210 are used in state detection while cross correlation method is used in periodicity detection and period evaluation. Based on the characteristics of sample frames in provided data sets, the state detection algorithm may classify each frame of samples 2010 into six different categories, i.e., a constant state 2315, a periodical state 2320, a periodical state 2320, a constant outlier state 2325, a periodical outlier state 2330, a step jump state 2335, and an unknown state 2340. The constant state 2315 is declared if all the samples have the exact same value in a given frame. The periodical state 2320 is detected when the samples of a given frame vary periodically. The constant outlier state 2325 is detected when all the samples in a given frame have the same value except the outliers while the periodical outlier state indicates the given frame varies periodically except the outlier samples. The outliers are defined as data samples beyond multiple times standard deviation from the medium. The periodical outlier state 2330 is a special case of periodical outlier state when only one outlier occurs in entire frame. The unknown state 2340 includes the frames are not in any of above states. The detection algorithms for different states are described in following disclosure.

Figure 24:
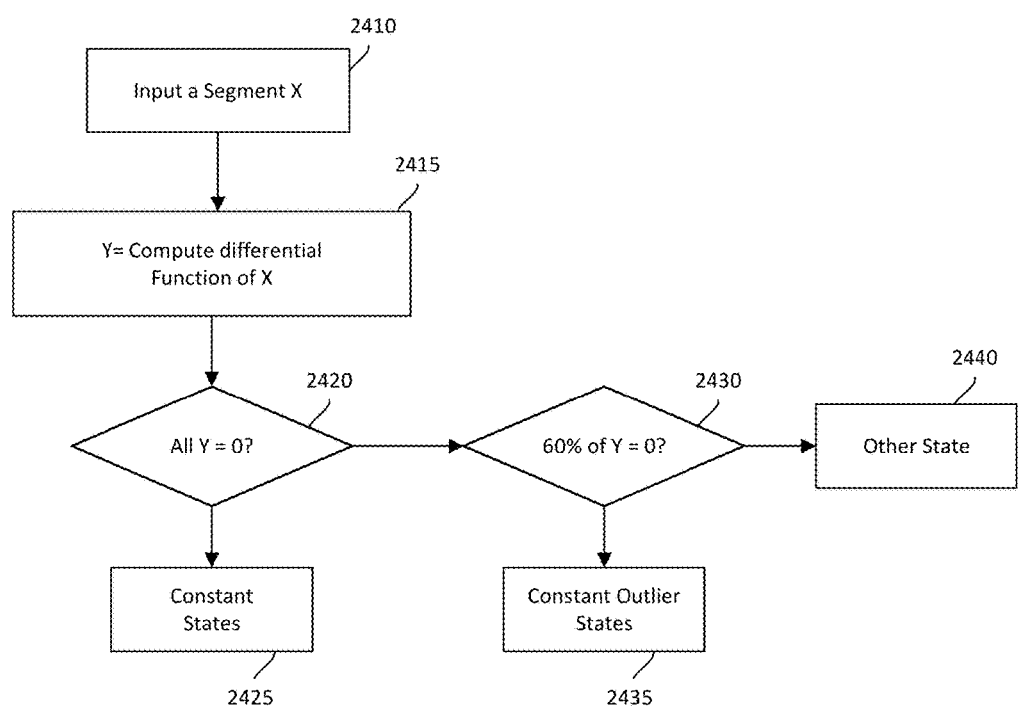
FIG. 24 illustrates a flowchart for an additional exemplary method of identifying a data segment that is in a constant state or constant outlier state as performed by the additional exemplary adaptive waveform encoder of FIG. 21.

FIG. 24 illustrates a flowchart for an additional exemplary method of processing a data segment that is in a constant state or constant outlier state as performed by the multi-state, low-delay, low-compression, lossless encoder of FIG. 21. Constant states are detected if all the samples have the same value in a frame. The differential function is used for constant state detection. If there are not any different sample values, then the given frame is a constant frame. Otherwise it is not a constant frame. However, if there are no differences for over 60% of the sample values, then the multi-state encoder 2110 claims the given frame is at constant outlier state.

At Step 2410 of FIG. 24, for a given input segment as frame X, multi-state encoder may calculate a differential function of X as Y. At step 2415, if all of the calculated Y differentials are zero (Step 2420: Yes), multi-state encoder 2110 may classify segment X as being in a constant state 2425. Otherwise (Step 2420: NO), multi-state encoder 2110 may classify the frame as not a constant state. If at least a threshold of the calculated Y differentials equal zero in the frame that is not at a constant state, for example, if 60% of the calculated Y differentials equal zero, (Step 2430: YES), then the multi-state encoder 2110 may classify the segment X as being in a constant outlier state 2435. Otherwise, the multi-state encoder 2110 may classify the segment X as being in another state 2440.

Figure 25:
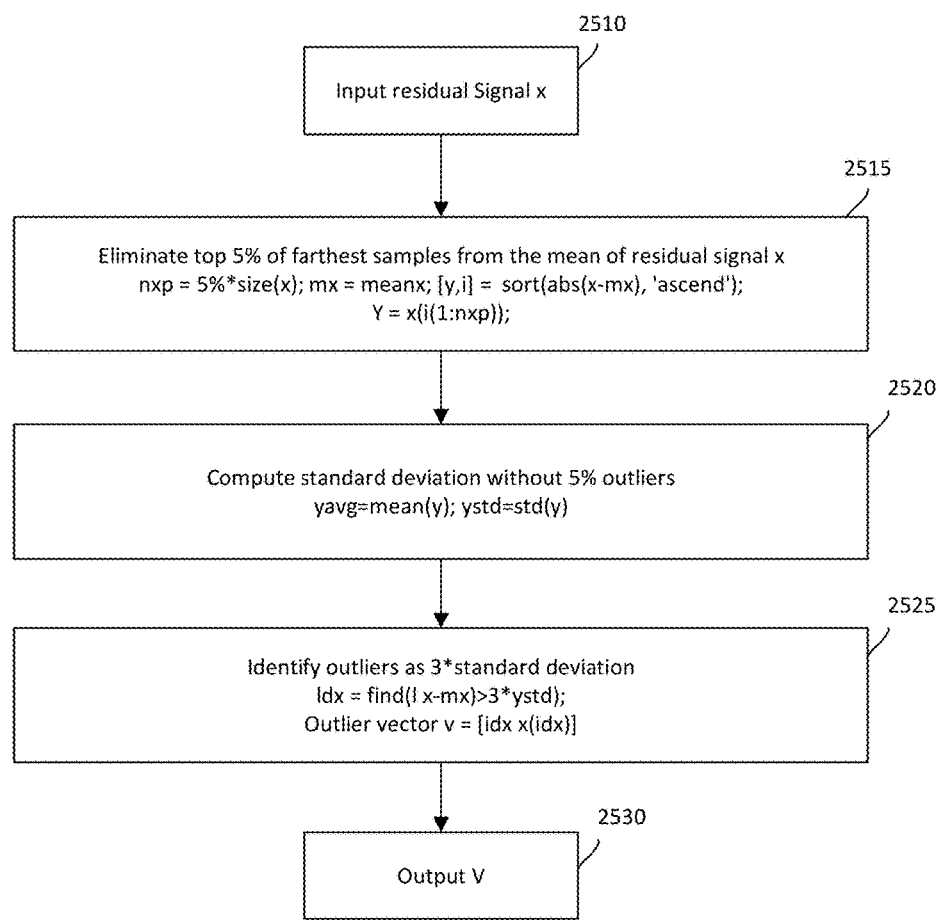
FIG. 25 illustrates a flowchart for an exemplary method of processing a data segment for outlier detection by the adaptive waveform encoder of FIG. 21.

FIG. 25 illustrates a flowchart for an exemplary method of processing a data segment for outlier detection by the multi-state, low-delay, low-compression, lossless encoder of FIG. 21. Its input is the residual signal x which is the differences between actual sample and predicted sample values. Choose top 5% of samples from the mean as the potential outlier pool Y. Calculate mean and standard deviation of potential outlier Y. The outliers will be detected if any values are greater than multiple times standard deviation; otherwise algorithm will output empty vectors.

In FIG. 25, an outlier detection algorithm of the multi-state encoder 2110 receives the input residual Signal X at Step 2510. At Step 2515, the multi-state encoder 2110 may eliminate the top 5% of farthest samples from the mean of residual signal x, using the equations nxp−5%*size(x); mx=mean(x); [[y,i]=sort(abs(x-mx),'ascend')' and Y=x(i(1: nxp)). At Step 2520 the multi-state encoder 2110 may computer the standard deviation without 5% outliers using the equations $y_{avg}$=means(y); and $y_{std}$=std(y). At Step 2525 the multi-state encoder 2110 may identify outliers as three times the standard deviation using the formulas Idx=find (|x−mx|>3*Ystd); and Outlier vector v=[idx x(idx)]. At Step 2530, the multi-state encoder 2110 may output outlier vector V.

Figure 26:
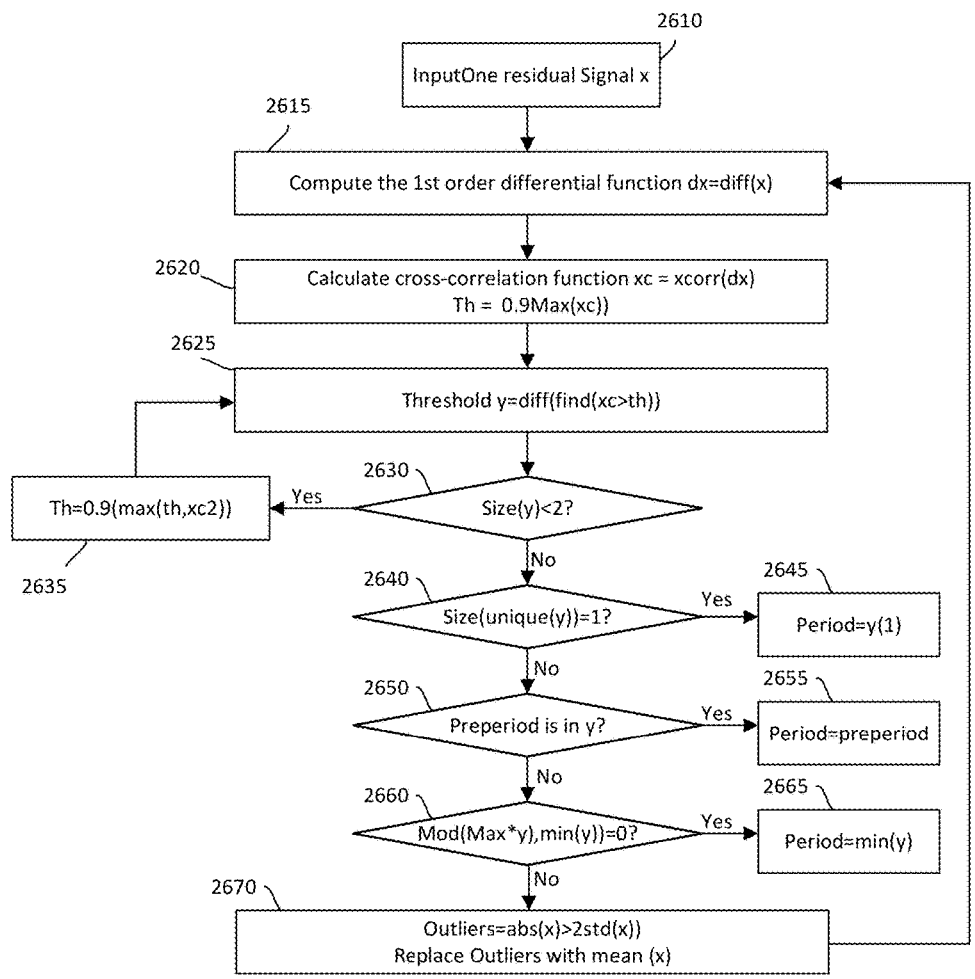
FIG. 26 illustrates a flowchart for an alternative exemplary method of processing a data segment that is in a periodic state as performed by the adaptive waveform encoder of FIG. 21.

FIG. 26 illustrates a flowchart for an alternative exemplary method of processing a data segment that is in a periodic state as performed by the adaptive waveform encoder of FIG. 21. Periodical states indicate the samples of current frames vary periodically and there are multiple periods in one frame. To simplify the periodicity detection algorithm, periodical states are assumed to include at least two periods in one frame as the method uses a cross-correlation method for periodicity detection. Based on analysis of MDA provided data, the minimum and maximum period are defined as 10 and 100 samples respectively if the frame size is 512. Those lower and upper limits are configurable in the implementation and can be changed at compile time. The compression algorithm for periodical states includes periodicity detection, periodical feature extraction, periodic signal modeling, and prediction error representation.

Periodical state detection and period estimation algorithm are based on cross-correlation of the sample waveform in the current frame. Theoretically, the cross-correlation function reaches peaks at multiples of periodical points. The unbiased cross-correlation function is used in the process. The peak detection threshold is computed as 90% of maximum cross-correlation value or 90% of second largest cross-correlation value if no peak is beyond the first threshold. The period value from previous frames is used as an indicator in current frame period estimation. In periodic outlier states, the multi-state encoder 2110 first replaces the all the outliers with average values, then uses the exemplary periodical state detection method to estimate the period. The outliers are identified by the samples whose values are beyond multiple times the standard deviation. The multi-state encoder 2110 can replace the outliers with predicted periodic values using methods of the outlier remove algorithm shown in FIG. 27. The modified frame will be used for periodical detection to identify if the current frame is periodical outlier frame.

In the periodical state detection and period estimation algorithm illustrated in FIG. 26, at Step 2610 the multi-state encoder 2110 may input one segment samples x, and at Step 2615 computer the 1st order differential function dx=diff(x). At Step 2620 the multi-state encoder 2110 may calculate the cross-correlation function xc=xcorr(dx), where Th=0.9 Max (xc)). At Step 2625, the multi-state encoder 2110 may calculate a threshold using the equation Threshold y=diff (find(xc<th)). If the threshold calculation Size(y)<2 is met (Step 2630: Yes), then at Step 2635 the multi-state encoder 2110 may calculate the threshold using the equation Th=0.9 (max(the,xc2)) and may return to Step 2625. If the threshold calculation Size(y)<2 is not met (Step 2630: No), then at Step 2640 the multi-state encoder 2110 may calculate the threshold size using the equation Size(unique(y))=1. If the size equals one (Step 2630: Yes), then in Step 2645 the multi-state encoder 2110 may calculate the period using the equation Period=y(1). If the size does not equal one (Step 2640: No), then at Step 2650 the multi-state encoder 2110 may calculate whether the Preperiod is in y. If the Preperiod is in y (Step 2650: Yes), then the multi-state encoder 2110 may determine the period using the formula Period=preperiod at Step 2655. If the Preperiod is not in y (Step 2650: No), then the multi-state encoder 2110 may calculate the period using the equation Mod(Max*y),min (y))=0 at Step 2660. If the conditions at Step 2660 are met (Step 2660: Yes), then the multi-state encoder 2110 may calculate the period using the equation as Period=min(y) at Step 2665. If the conditions at Step 2660 are not met (Step 2660: No), then the multi-state encoder 2110 may, in Step 2670, calculate outliers using the equation Outliers= abs(x)>2std(x)) and replace outliers with the equation mean(x). After the calculations in Step 2670 are complete, the multi-state encoder 2110 may return the process to Step 2615 to repeat the periodic state detection and period estimation method again.

Figure 27:
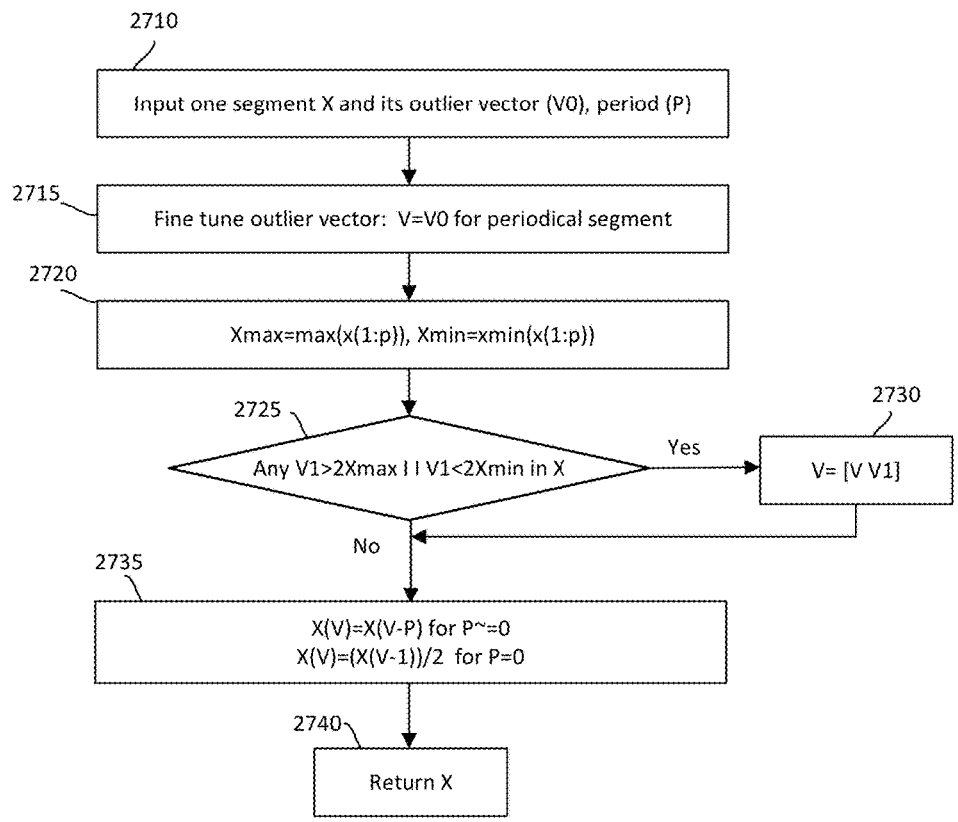
FIG. 27 illustrates a flowchart for an exemplary method of processing a data segment to replace outlier data in a periodic outlier state as performed by the adaptive waveform encoder of FIG. 21.

FIG. 27 illustrates a flowchart for an exemplary method of processing a data segment to replace outlier data in a periodic outlier state as performed by the adaptive waveform encoder of FIG. 21. At Step 2710, the multi-state encoder 2110 may input one frame X and its outlier vector (V0), period (P). At Step 2715, the multi-state encoder 2110 may fine tune outlier vector: V=V0 for the periodical segment. At Step 2720 the multi-state encoder 2110 may determine Xmas using the equation Xmax=mx(x(1:p)) and may determine Xmin using the equation Xmin=xmin(x(1:p)). At Step 2725 the multi-state encoder 2110 may determine outlier vector V1 using the equation Any V1<2Xmax||V1<2Xmin in X. If the parameters are met (Step 2725: Yes), then the multi-state encoder 2110 may calculate the outlier vector V using the equation V=V[V V1] in Step 2730 and return the method to the next Step 2735. If the parameters are not met (Step 2725: No) then the multi-state encoder 2110 may proceed directly to the final calculation at Step 2735. At Step 2735, the multi-state encoder 2110 may remove the outlier using the formulas X(V)=X(V−P) for P~=0, and X(V)=(X(V−1)+X(V+1))/2 for P−0. After the outlier is determined, the multi-state encoder 2110 may return segment X at Step 2740.

Figure 28:
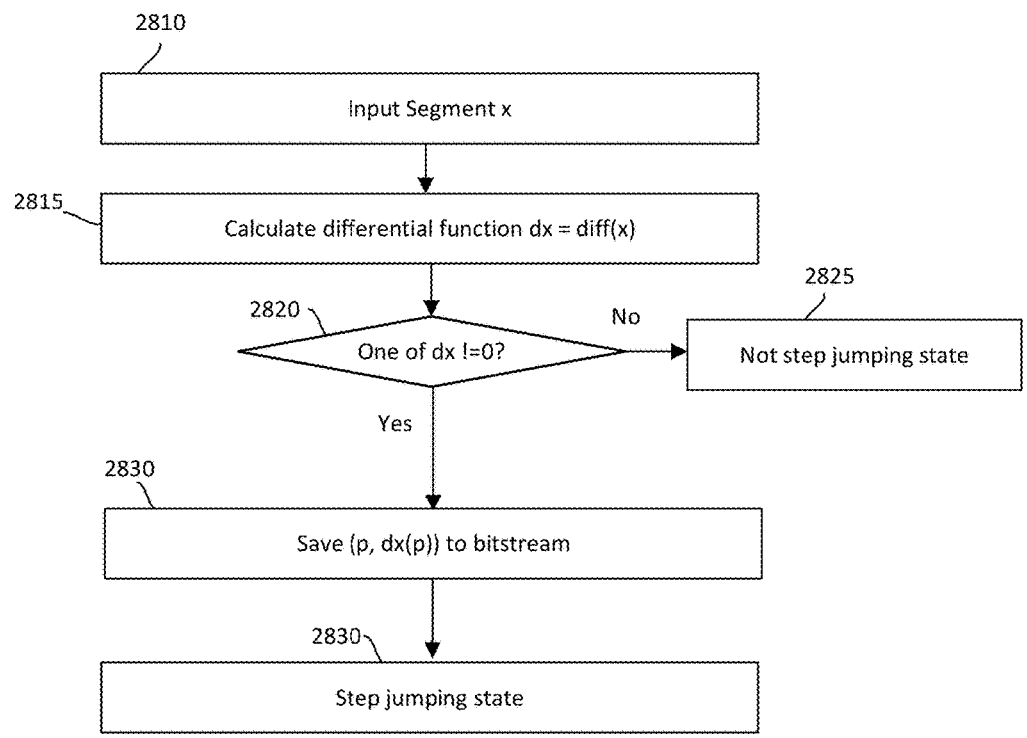
FIG. 28 illustrates a flowchart for an exemplary method of processing a data segment in a step jumping state as performed by the adaptive waveform encoder of FIG. 21.

FIG. 28 illustrates a flowchart for an exemplary method of processing a data segment in a step jumping state as performed by the adaptive waveform encoder of FIG. 21. At step 2810 the multi-state encoder 2110 may input a segment X and thereafter may calculate the differential function dx=diff(x) at Step 2815. Using the equation One of Dx !=0 is not correct (Step 2820: No), the multi-state encoder 2110 may determine the segment X is not in a step jumping state at Step 2825. If the equation One of Dx !=0 is correct (Step 2820: Yes), the multi-state encoder 2110 may save (p,dx(p)) to the bitstream at Step 2830. At Step 2835 the multi-state encoder 2110 may then determine the segment X is in the step jumping state.

Figure 29:
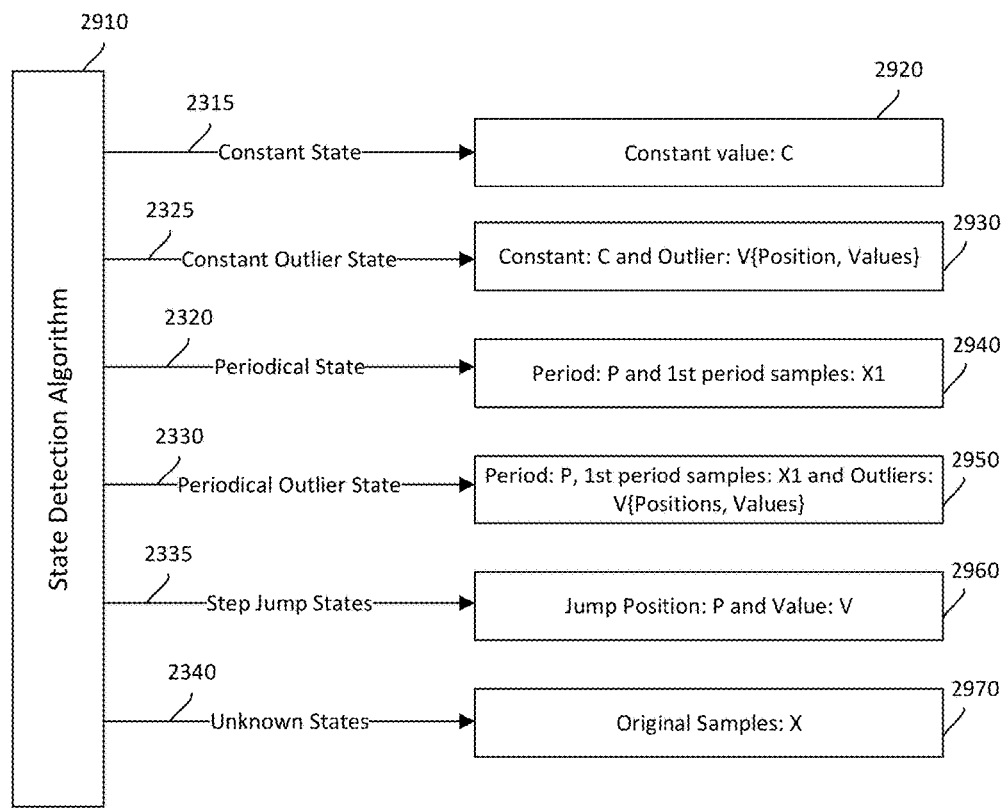
FIG. 29 illustrates an additional exemplary embodiment of a multi-state prediction model.

FIG. 29 illustrates an additional exemplary embodiment of an exemplary multi-state prediction model that may be based on the output of state detection and extract the corresponding model parameters, generate predicted sample, compute prediction residuals and create bit-stream of current segment for transmission or storage. The extracted parameters may be used to generate predicted samples, and the prediction residual may be calculated by subtracting the current samples from the predicted samples. The bit-stream includes the model parameters and corresponding residuals in current frame.

In the multi-state detection model of FIG. 29, the multi-state encoder 2110 may execute the state detection algorithm 2910 to extract the model parameters. When a segment X is in a constant state 2915, then the multi-state encoder 2110 may extract a Constant value: C at 2920. When a segment X is in a constant outlier state 2925, then the multi-state encoder 2110 may extract a Constant: C and Outlier: V{Position,Values}. When a segment X is in a periodical state 2920, then the multi-state encoder 2910 may extract a Period: P and 1st period samples: X1. When the segment X is in a periodical outlier state 2930, then the multi-state encoder 2110 may extract Period: P, and 1st period samples: X1 and Outliers: V{Positions, Values}. When the segment X is in a step jump state 2935, then the multi-state encoder 2110 may extract a Jump Position: P and Value: V. When the segment X is in an unknown state 2940, then the multi-state encoder 2110 may extract Original samples: X. For unknown state, the linear prediction model described in [00114] may be used before entropy encoding.

Parameters of the state prediction model in FIG. 24 may include the following. The predict model of constant states is either the 1st sample value or the value of the previous constant frame. If current frame is the 1st constant frame, then the 1st sample value will be transmitted to decoder; otherwise only the state information will be sent. The constant state bit-stream format is defined in Table 1. Most of the constant state frames require four bits while the first constant state frame needs 20 bits to store the entire information.

TABLE 1

| Field # | # of bits | Contents |
|---|---|---|
| 1 | 3 | States: state = 1 for constant state |
| 2 | 1 | same value flag:<br>0 = the same constant as previous frames<br>1 = new constant value |
| 3* | 16 | Constant values |

Constant outlier states contain constant samples with sparse outliers. The constant outlier state detection algorithm is shown in FIG. 24. There are two types of outliers, random outliers and outliers from bit-errors. For the random outliers, the multi-state encoder 2110 stores both outlier location and values. For the outliers from bit-errors, a bit-error pattern based bit-stream packetizing algorithm is utilized, which is described in the following section. The contents of constant outlier state are shown in Table 2. The format for outlier bit-stream is described below.

TABLE 2

| Field # | # of bits | Contents |
|---|---|---|
| 1 | 3 | States: state = 5 for constant state |
| 2 | 2 | same value flag:<br>0 = the same constant as previous frames<br>1 = new constant value |
| 3* | 16 | Constant values |
| 4 | 1 | Outlier coding method flag:<br>0 = random outlier<br>1 = outlier caused by bit errors |
| 5 | x | Outlier bit-stream |

Two different exemplary outlier encoding algorithms are used for bit-error caused outliers and random outliers respectively. The outlier encoding algorithm first calculate total number of bits required for each encoding methods, then choose the one with less number of bits. The formats for both encoding algorithms are described below.

Figure 35:
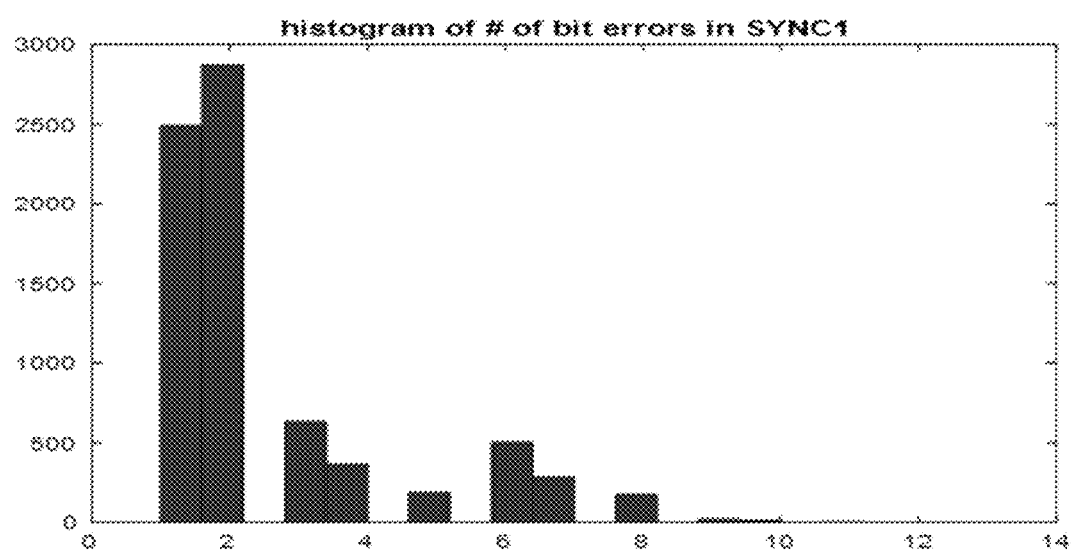
FIG. 35 illustrates a histogram of the number of bit errors in a frame synchronization word.
Figure 36:
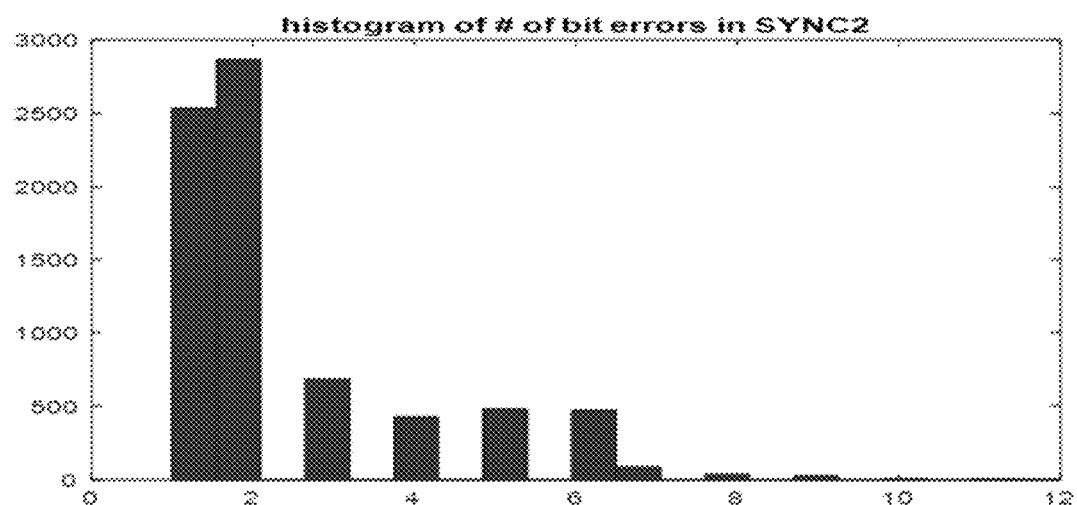
FIG. 36 illustrates a histogram of the number of bit errors in a frame synchronization word.

A significant amount of outlier frames are caused by bit-errors, which means that the difference between the prediction value and actual value has few bits flips. For example, the percentage of number of bit errors among all the outliers from SYNC words in an exemplary data set are shown in Table 3, where about 80% of outliers have equal and less than 3 bits errors. Also, the consecutive 2 bit errors occur about 32% which is much more than the random location for 2 bits error occurs 7%. The distribution of predicted bit errors are shown in FIG. 35 and FIG. 36 for SYNC1 and SYNC2 respectively. The average length of outlier value in bit-stream can be calculated as (31.32%+32.98%)*5+8.38%)*(5+7)+20%*16=7.8 bits.

TABLE 3

| # of bit errors | SYNC1 | | | SYNC2 | | |
|---|---|---|---|---|---|---|
| | Consecutive | others | Total | Consecutive | others | Total |
| 1 | | | 32.98 | | | 33.26 |
| 2 | 31.32 | 7.58 | 38.0 | 31.30 | 6.32 | 37.62 |
| 3 | 0.79 | 7.59 | 8.38 | 0.86 | 8.12 | 8.98 |
| Total | 33.11 | 15.17 | 79.36 | 32.16 | 14.44 | 79.86 |

The numbers of outliers in a frame in SYNC1 and SYNC2 files are shown in Table 4 where the frame size is chosen as 512 samples. The percentages of outliers are less than 12.5% (64/512) of total samples while over 83% of constant outlier frames have less than 31 outliers. Therefore, 4 bits are used to present number of outliers at initial point.

TABLE 4

| No of outliers | SYNC1 | SYNC2 |
|---|---|---|
| N ≤ 7 | 38.19% | 40.42% |
| N ≤ 15 | 61.37% | 62.53% |
| N ≤ 31 | 83.66% | 84.63% |
| N ≤ 63 | 97.79% | 97.26% |

The outlier bit-stream format is defined in Table 5. Each outlier is encoded as a pair of location and value. The number of outliers are encoded in 5 bits which covers up to 31 outliers per frame. If number of outliers is greater than 32, then Nout will be coded as '11111' and followed by 7 bits to present number which is greater than 32. The 1st outlier position is encoded as its actual location using log 2(fsize) bits while the rest of outlier positions are encoded as differential coding using N1 bits where N1=log 2(Pmax−P1) as shown in Table 5.

TABLE 5

| Field # | # of bits | Contents |
|---|---|---|
| P1 | 9 | $1^{st}$ outlier position |
| N | 5 | N = 0: extended # of outliers<br>N = 1~31: # of outliers |
| extN* | 6 | extN = 0: $2^{nd}$ extended # of outliers<br>extN = 1~63: # of outliers -31 |
| extN2* | 6 | extN2 = 0: extended # of outliers<br>extN2 = 1~63: # of outliers-63-31 |
| P2_1 | 1 | F1 = 0: extended 3 bits for outlier position<br>F1 = 1: position difference from previous outlier |
| P2_O2* | 3 | F2 = 0: extended 4 bits for outlier position<br>F2= 1~6: offset of next outlier position<br>F2 = 7: extended maxbits for outlier position |
| P2_O3* | 4 | F3 = 1~16: offset of next outlier position -6-1 |
| P2_O4* | Nmax | F4 = offset of next outlier position -1-6-16 |
| P3_1 | 1 | F1 = 0: extended 3 bits for outlier position<br>F1 = 1: position difference from previous outlier |
| P3_O2* | 3 | F2 = 0: extended 4 bits for outlier position<br>F2 = 1~6: offset of next outlier position<br>F2 = 7: extended maxbits for outlier position |
| P3_O3* | 4 | F3 = 1~16: offset of next outlier position -6-1 |
| P3_O4* | Nmax | F4 = offset of next outlier position -1-6-16 |
| N outlier Values | X | Encoded as bit-error outliers or random outliers |

Table 3 shows the statistics of different number of bit errors: about ⅓ of errors are single bit errors while another ⅓ is consecutive 2 bit errors. Slightly less than 10% of bit errors are 3 bit errors. To efficiently encode bit errors, two error tables, i.e. basic error table (Table 6) and extended bit error table (Table 7) are utilized. The encoding format of the bit error values of the outliers is shown in Table 8.

TABLE 6

| Index | Bit = 1 | Contents |
|---|---|---|
| 1 | 1 | Single bit error |
| 2 | 2 | Single bit error |
| 3 | 3 | Single bit error |
| 4 | 4 | Single bit error |
| 5 | 5 | Single bit error |
| 6 | 6 | Single bit error |
| 7 | 7 | Single bit error |
| 8 | 8 | Single bit error |
| 9 | 9 | Single bit error |
| 10 | 10 | Single bit error |
| 11 | 11 | Single bit error |
| 12 | 12 | Single bit error |
| 13 | 13 | Single bit error |
| 14 | 14 | Single bit error |
| 15 | 15 | Single bit error |
| 16 | 16 | Single bit error |
| 17 | 1, 2 | Consecutive 2 bit errors |
| 18 | 2, 3 | Consecutive 2 bit errors |
| 19 | 3, 4 | Consecutive 2 bit errors |
| 20 | 4, 5 | Consecutive 2 bit errors |
| 21 | 5, 6 | Consecutive 2 bit errors |
| 22 | 6, 7 | Consecutive 2 bit errors |
| 23 | 7, 8 | Consecutive 2 bit errors |
| 24 | 8, 9 | Consecutive 2 bit errors |
| 25 | 9, 10 | Consecutive 2 bit errors |
| 26 | 10, 11 | Consecutive 2 bit errors |
| 27 | 11, 12 | Consecutive 2 bit errors |
| 28 | 12, 13 | Consecutive 2 bit errors |
| 29 | 13, 14 | Consecutive 2 bit errors |
| 30 | 14, 15 | Consecutive 2 bit errors |
| 31 |  | Extended to 16 bit value |
| 0 |  | Extended to $2^{nd}$ bit error tables |

TABLE 7

| Index | Bit = 1 | Contents |
|---|---|---|
| 0 | 15, 16 | Consecutive 2 bit errors |
| 1 | 1, 3 | non-consecutive 2 bit errors |
| 3 | ... | non-consecutive 2 bit errors |
| 4 | 1, 15 | non-consecutive 2 bit errors |
| 14 | 1, 16 | non-consecutive 2 bit errors |
| 15 | 2, 4 | non-consecutive 2 bit errors |
| ... | ... | non-consecutive 2 bit errors |
| 27 | 2, 16 | non-consecutive 2 bit errors |
| 28 | 3, 5 | non-consecutive 2 bit errors |
| ... | ... | non-consecutive 2 bit errors |
| 39 | 3, 16 | non-consecutive 2 bit errors |
| 40 | 4, 6 | non-consecutive 2 bit errors |
| ... | ... | non-consecutive 2 bit errors |
| 50 | 4, 16 | non-consecutive 2 bit errors |
| 51 | 5, 7 | non-consecutive 2 bit errors |
| ... | ... | non-consecutive 2 bit errors |
| 60 | 5, 16 | non-consecutive 2 bit errors |
| 61, ... 69 | 6, [8~16] | non-consecutive 2 bit errors |
| 70, ... 77 | 7, [9~16] | non-consecutive 2 bit errors |
| 78, ... 84 | 8, [10~16] | non-consecutive 2 bit errors |
| 85, ... 90 | 9, [11~16] | non-consecutive 2 bit errors |
| 91, ... 95 | 10, [12~16] | non-consecutive 2 bit errors |
| 96~99 | 11, [13~16] | non-consecutive 2 bit errors |
| 100~102 | 12, [14~16] | non-consecutive 2 bit errors |
| 103~104 | 13, [15~16] | non-consecutive 2 bit errors |
| 105 | 14, 16 | non-consecutive 2 bit errors |
| 106 | 1, 2 + P | consecutive 2 bits + 1 errors |
| 107 | 2, 3 + P | consecutive 2 bits + 1 errors |
| 108 | 3, 4, P | consecutive 2 bits + 1 errors |
| 109 | 4, 5, P | consecutive 2 bits + 1 errors |
| 110 | 5, 6, P | consecutive 2 bits + 1 errors |
| 111 | 6, 7, P | consecutive 2 bits + 1 errors |
| 112 | 7, 8, P | consecutive 2 bits + 1 errors |
| 113 | 8, 9, P | consecutive 2 bits + 1 errors |
| 114 | 10, 11, P | consecutive 2 bits + 1 errors |
| 115 | 11, 12, P | consecutive 2 bits + 1 errors |
| 116 | 121, 3, P | consecutive 2 bits + 1 errors |
| 118 | 13, 14, P | consecutive 2 bits + 1 errors |

TABLE 7-continued

| Index | Bit = 1 | Contents |
|---|---|---|
| 119 | 14, 15, P | consecutive 2 bits + 1 errors |
| 120 | 15, 16, 1 | Bit 15 and 16 + 1 bit errors |
| 121 | 15, 16, 2 | Bit 15 and 16 + 1 bit errors |
| 8122 | 15, 16, 3 | Bit 15 and 16 + 1 bit errors |
| 123 | 15, 16, 4 | Bit 15 and 16 + 1 bit errors |
| 124 | 15, 16, 5 | Bit 15 and 16 + 1 bit errors |
| 125 | 15, 16, 6 | Bit 15 and 16 + 1 bit errors |
| 126 | 15, 16, 7 | Bit 15 and 16 + 1 bit errors |
| 127 | 15, 16, 8 | Bit 15 and 16 + 1 bit errors |

TABLE 8

| Field | # of bits | Contents | Notes |
|---|---|---|---|
| V1 | 5 | V1 = 1~31: basic error table | |
| | | V1 = 0: extended error table | |
| Ext1* | 7 | Extv1 = 0~127 extended error table | |
| Ext2* | 16 | Actual value | |
| | 5 | V2 = 1~31: basic error table | |
| | | V2 = 0: extended error table | |
| Ext1* | 7 | Ext1 = 0~127 extended error table | |
| Ext2* | 16 | Actual value | |
| ... | | | |
| Vm | 5 | Vm = 1~31: basic error table | |
| | | Vm = 0: extended error table | |
| Ext1* | 7 | Ext1 = 0~127 extended error table | |
| Ext2* | 16 | Actual value | |

An exemplary encoding algorithm for random outliers includes outliers that may be represented as a group of (position, value) pairs. The values of the position vector are in ascending order. The algorithm calculates a derivative of the position to reduce size of bit-stream by saving the 1st outlier position and the rest of derivatives; both derivatives of the positions and outlier values are encoded using adaptive encoding algorithm for unknown states. The bit-stream format of random outliers are shown in Table 9.

TABLE 9

| Field | # of bits | Contents | Notes |
|---|---|---|---|
| n | 7 | # of outliers | |
| P1 | 9 | $1^{st}$ outlier position | |
| N-1 ($P_i$-$P_{i-1}$) | X | Adaptive encoding method | |
| N Values | X | Adaptive encoding method | |

Step jumping states are defined when sample values from one constant change to another constant in a given frame. The jumping location and value will be used as model parameter in the transmission or storage. The encoding format is defined in Table 10.

TABLE 10

| Field | # of bits | Contents | Notes |
|---|---|---|---|
| State | 4 | Step jumping state | |
| V1 | 16 | Initial constant value | |
| P | 9 | Jumping position | |
| V2 | 16 | New constant value | |

The periodical state compression model can be represented as period, the samples in the 1st period, the prediction residuals. In most cases, the periodical signal continuous for pretty long time which covers multiple frames with some variation in sample values. To reduce the redundancy among the frames, the samples of the 1st period are not coded in bit-stream if the current frame is not the starting frame of periodical states. The periodical predication model will be implemented as skeleton generation algorithm and the prediction residuals are encoded using the adaptive encoding method.

In periodical states, previous period samples may be used to predict the samples in the current periods. The skeleton generation algorithm implements periodical prediction model on frame bases. The following two prediction models are tested in skeleton generation algorithm.
1. Use the first period of current frame as prediction samples for all the periods;
2. Use previous periods to predict the current periods in the current frame.

The detail algorithm are described as the follows:
Structure Para_periodic {
Int16 periods=zeros(5,1);
Int16 prev_x;
}
Function periodical_state_modeling(x, cur_state, cur_p-eriod)
If cur_state==PERIODICAL_STATE, then
P=cur_period,
xp=prev_x(end-P+1, end);
s=generate_skeleton_frame(xp, x);
else
call functions to handle other states.
End
Return s
End
(1). $1^{st}$ period repeating
S=Function generate_skeleton_frame(xp, x);
Fsize=size(x,1);
P=size(xp);
N=rem(fsize, P);
S=repeat xp N times
And make size of S is as same as x's sizes.
(2). Previous period model
S=Function generate_skeleton_frame(xp, x);
Fsize=size(x,1);
P=size(xp);
S=(xp and x(1:end-P);

To determine the effectiveness of above two models, the following statistics were collected from both models: (1) Number of Huffman code words, and (2) Number of non-zeros residuals.

Figure 37:
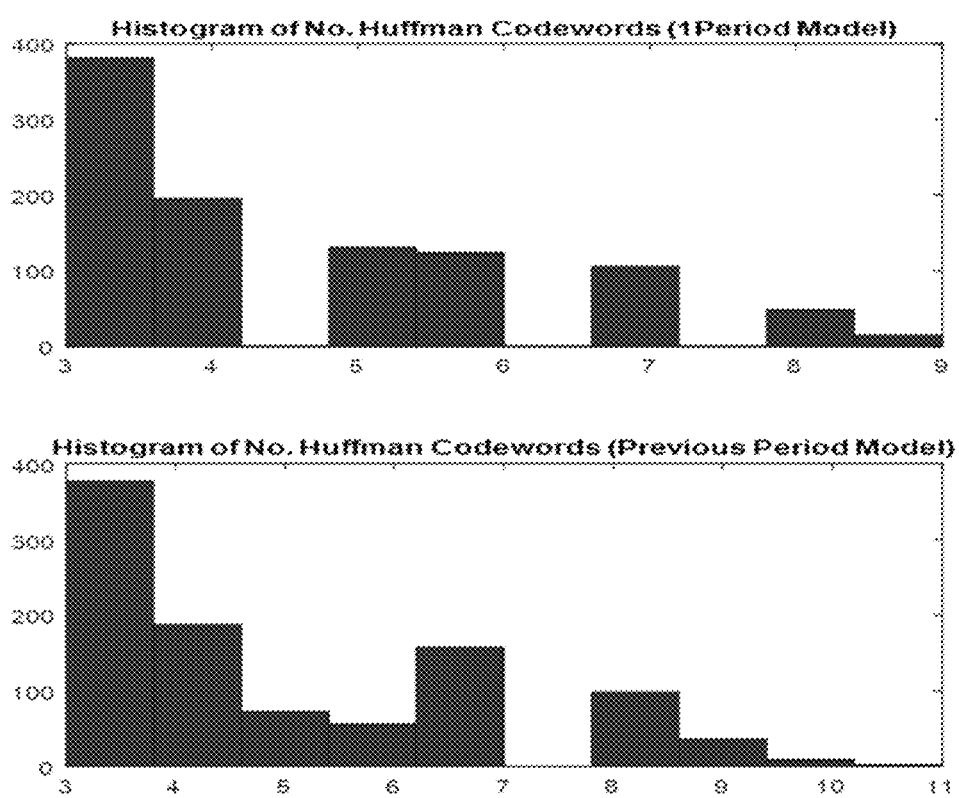
FIG. 37 illustrates histograms of the number of Huffman codewords for a first period model and a previous period model.
Figure 38:
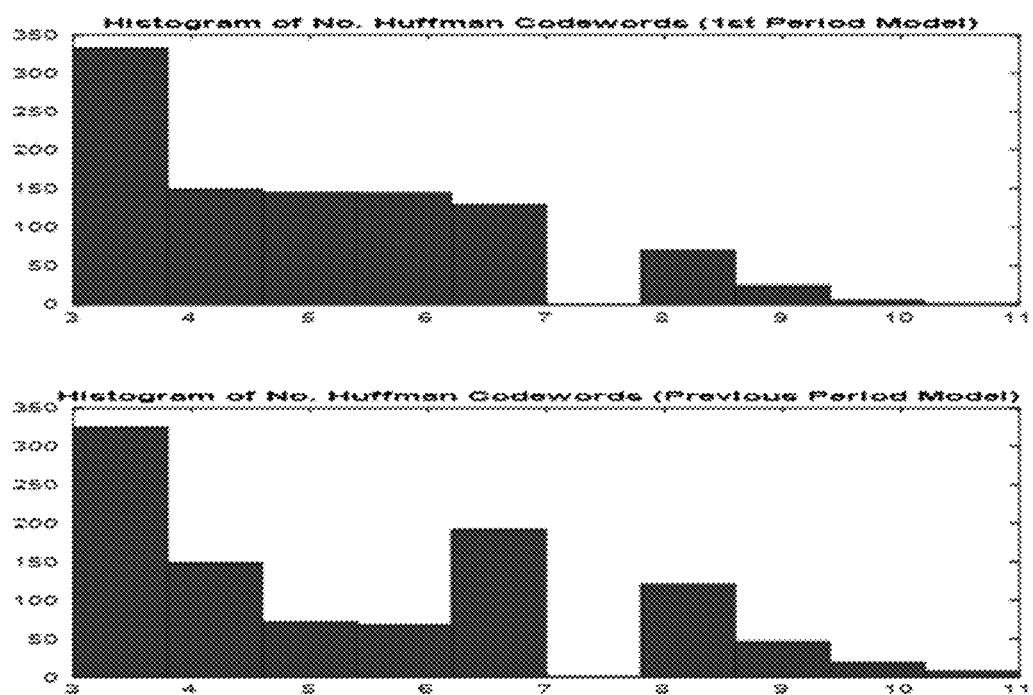
FIG. 38 illustrates a histogram of the number of Huffman codewords for a first period model and a previous period model.
Figure 39:
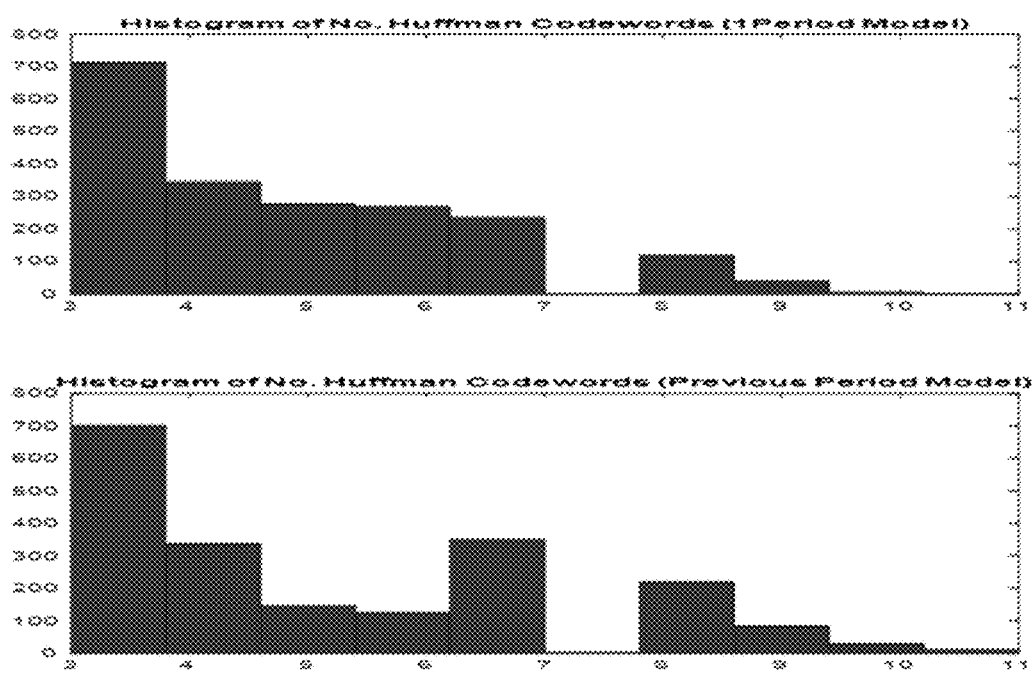
FIG. 39 illustrates histograms of the number of Huffman codewords for a first period model and a previous period model.
Figure 40:
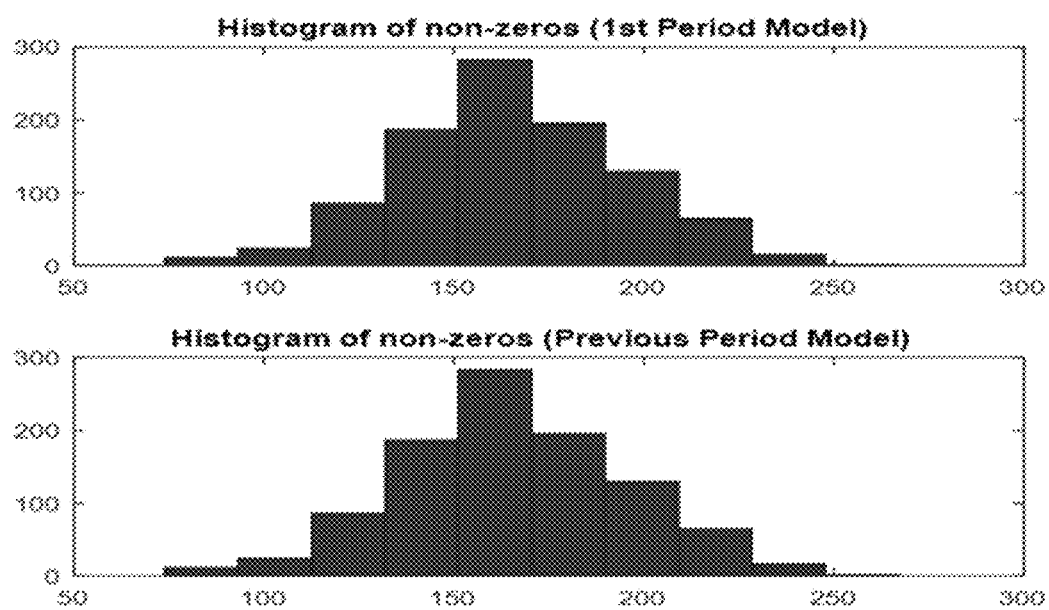
FIG. 40 illustrates histograms of non-zeros for a first period model and a previous period model.
Figure 41:
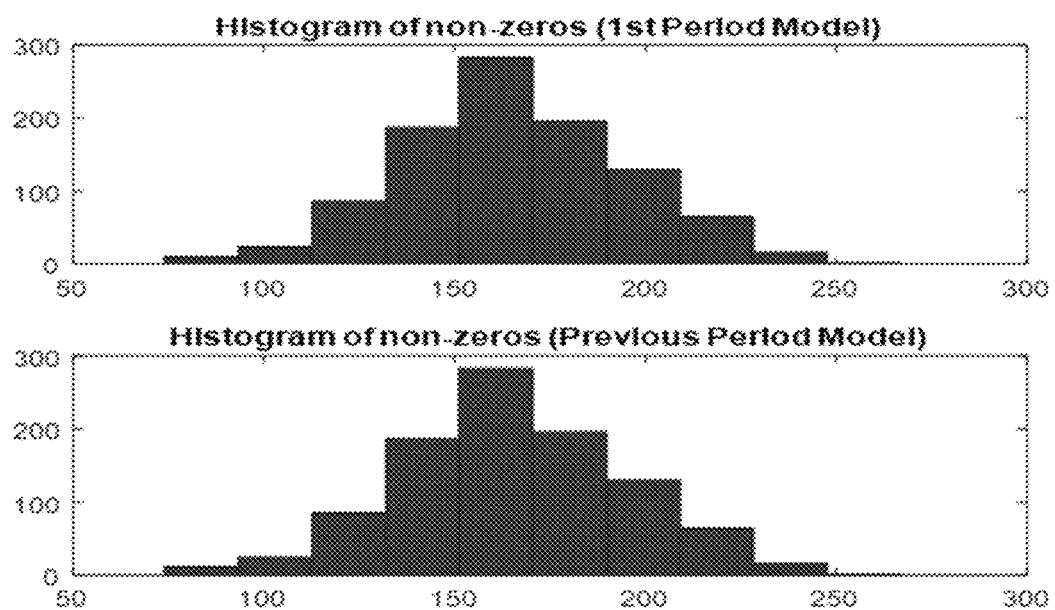
FIG. 41 illustrates histograms of non-zeros for a first period model and a previous period model.
Figure 42:
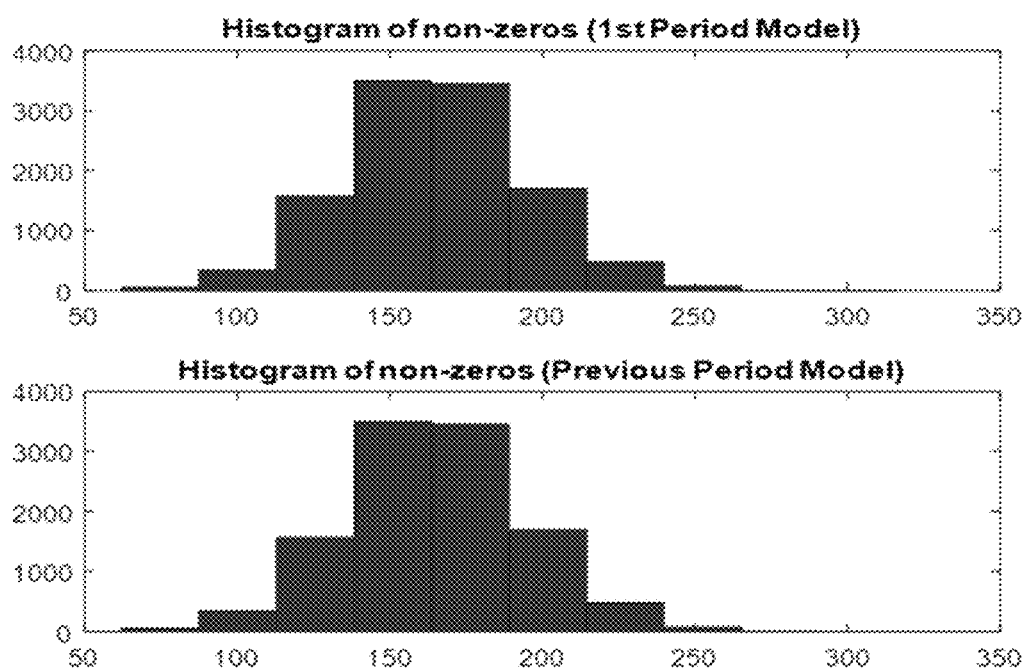
FIG. 42 illustrates histograms of non-zeros for a first period model and a previous period model.

In the example, exemplary charts in FIG. 37, FIG. 38, FIG. 39, FIG. 40, FIG. 41, and FIG. 42 show the comparison results using Y counter data set. FIG. 37 and FIG. 39 show the histogram of number of Huffman code words in first and second 1000 periodical frames while FIG. 38 and FIG. 40 show the histogram of 2000 and 11154 periodical frames in Y counter file respectively. The results show that 1st period model has a more compact distribution towards lower number of code words than the previous period model.

Table 11 shows the mean and standard deviation of the number of code words required for two models. It clearly demonstrates the 1st period model uses fewer code words and has lower derivation than the previous period model.

TABLE 11

|  | Mean | Standard Deviation |
| --- | --- | --- |
| $1^{st}$ Period Model | 4.8083 | 1.7635 |
| Previous Period Model | 5.2286 | 2.1437 |

The 1st periodical model fits better to Y counter data set. Therefore, in this example, the first periodical model was chosen in the exemplary implementation.

The periodical frames can be presented as the period, periodicity prediction model (skeleton profile), and prediction errors. The period of the current frame is estimated in periodicity detection algorithm and the skeleton profile of the predication model is chosen as the 1st period of current frames. The prediction errors are represented as the differences between sample values of current frames and the values of skeleton generated samples. Therefore, the following information needs to be transmitted to the decoder in order to recover the original frames:
1. Period
2. 1st period samples of current frame
3. Residual samples Table 12 shows the bit-stream format of periodical states. The flag indicates if the current frame is the starting frame of a new periodical signal duration. If the flag is equal to 1, then the period value and samples of the 1st period will be followed; otherwise prediction residuals will be stored afterwards. As period is a single value whose upper limit is chosen as 100 for frame size of 512 samples in current implementation, 7 bits will be used for period representation. The prediction residuals are calculated by R=X-Y, where X and Y are original and predicted samples respectively.

TABLE 12

| Field # | # of bits | Contents |
| --- | --- | --- |
| state | 4 | Periodical state = 3 |
| flag | 1 | 1: new period |
|  |  | 0: same period as previous frame |
| Period* | 7 | Periodicity value |
| $1^{st}$ period samples* | x | Adaptive encoding method |
| Prediction residuals | x | Adaptive encoding method |
| Outlier flag | x | 0 = random outliers |
|  |  | 1 = outliers caused by bit errors |
| Outlier bit-stream | x | Outlier bit-stream |

Figure 30:
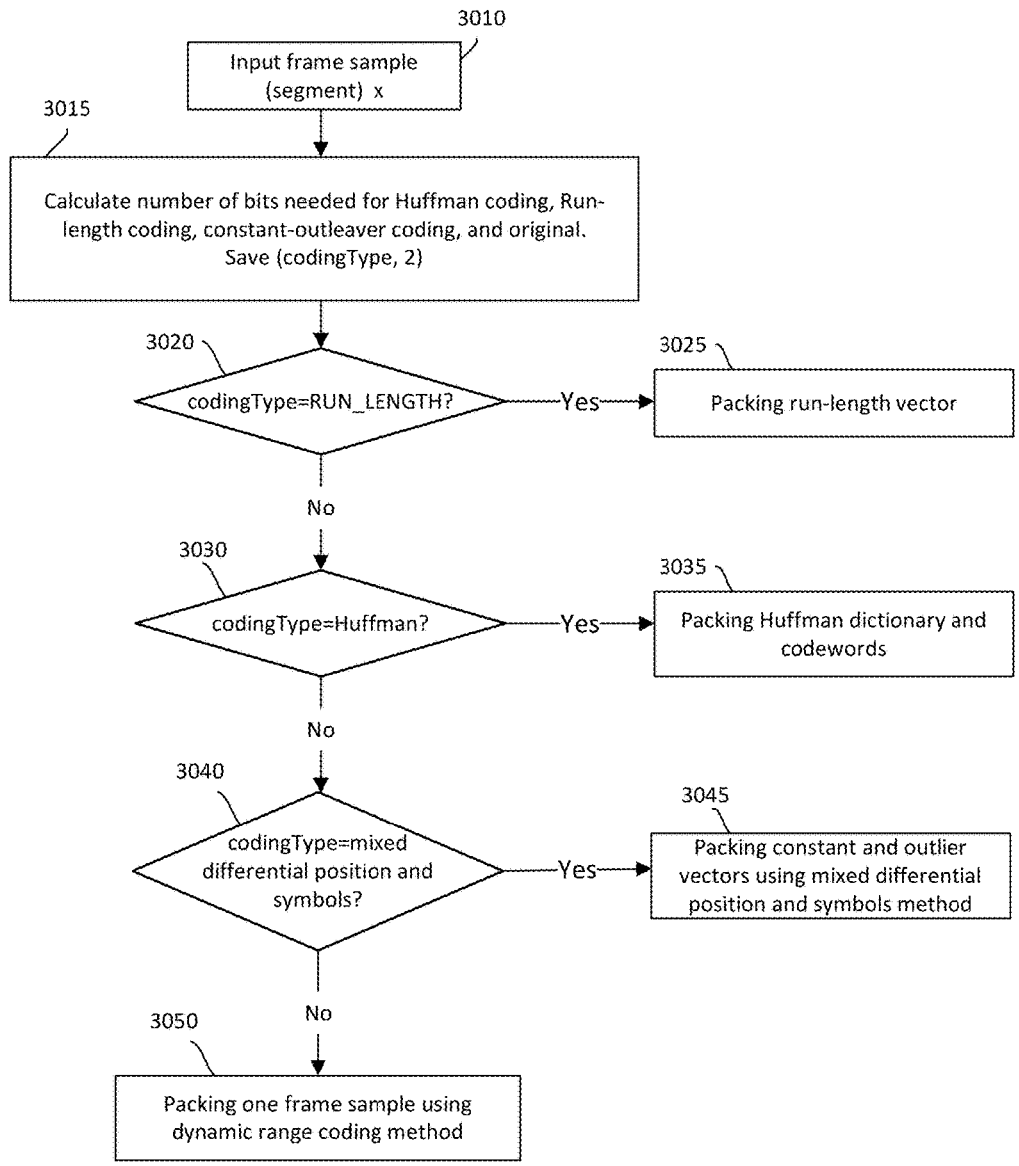
FIG. 30 illustrates a flowchart for an exemplary method of processing a data segment in an unknown state as performed by the adaptive waveform encoder of FIG. 21.

FIG. 30 illustrates a flowchart for an exemplary method of processing a data segment in an unknown state as performed by the adaptive waveform encoder of FIG. 21. Unknown states are defined when the given frames are not classified as any of the above states or cannot be efficiently encoded using above encoding schemes. The encoding format of unknown states is shown in Table 12.

TABLE 12

| Field # | # of bits | Contents |
| --- | --- | --- |
| state | 4 | Unknown state |
| flag | 2 | 0 = adaptive Huffman encoding |
|  |  | 1 = run-length encoding |
|  |  | 2 = mixed differential encoding |
|  |  | 3 = original data |
| Encoding samples | X | Adaptive encoding method |

The developed adaptive entropy encoding algorithm to compress unknown state frames are shown in FIG. 30. The adaptive encoding algorithm includes adaptive Huffman coding, run-length coding mixed differential coding, etc; the best performing one will be chosen to encode the current frame if the size of encoded bit-stream is smaller than the total number of bits of original sample representation. Otherwise the current frame will be transmitted or stored as its original samples. There is no compression gain in that case.

The details of each individual entropy encoding method are described in the following sections.

In FIG. 30, the multi-state encoder 2110 may input a segment sample X at Step 3010, and at Step 3015 may calculate the number of bits needed for Huffman coding, run-length coding, constant outleaver coding and original. The calculation may be saved as Save(codingType,2). At Step 3015, if the codingType equals RUN_LENGTH (Step 3015: Yes), then the multi-state encoder 2110 packs a run-length vector at Step 3025, otherwise if the codingType does not equal RUN_LENGTH (Step 2815: No), the multi-state encoder 2110 determines if the codingType equals Huffman at Step 3030. If the codingType equals Huffman (Step 3030: Yes), then the multi-state encoder 2110 packs Huffman dictionary and codewords at Step 3035. If the codingType does not equal Huffman (Step 3030: No) then the multi-state encoder 2110 determines if the codingType equals mixed differential position and symbols at Step 2840. If the condition is correct (Step 3040: Yes), then the multi-state encoder 2110 packs constant and outlier vectors using mixed differential position and symbols methods at Step 3045. If the codingType does not equal mixed differential position and symbols (Step 3040: No), then the multi-state encoder 2110 packs one segment sample using a dynamic range coding method at Step 3050.

Figure 31:
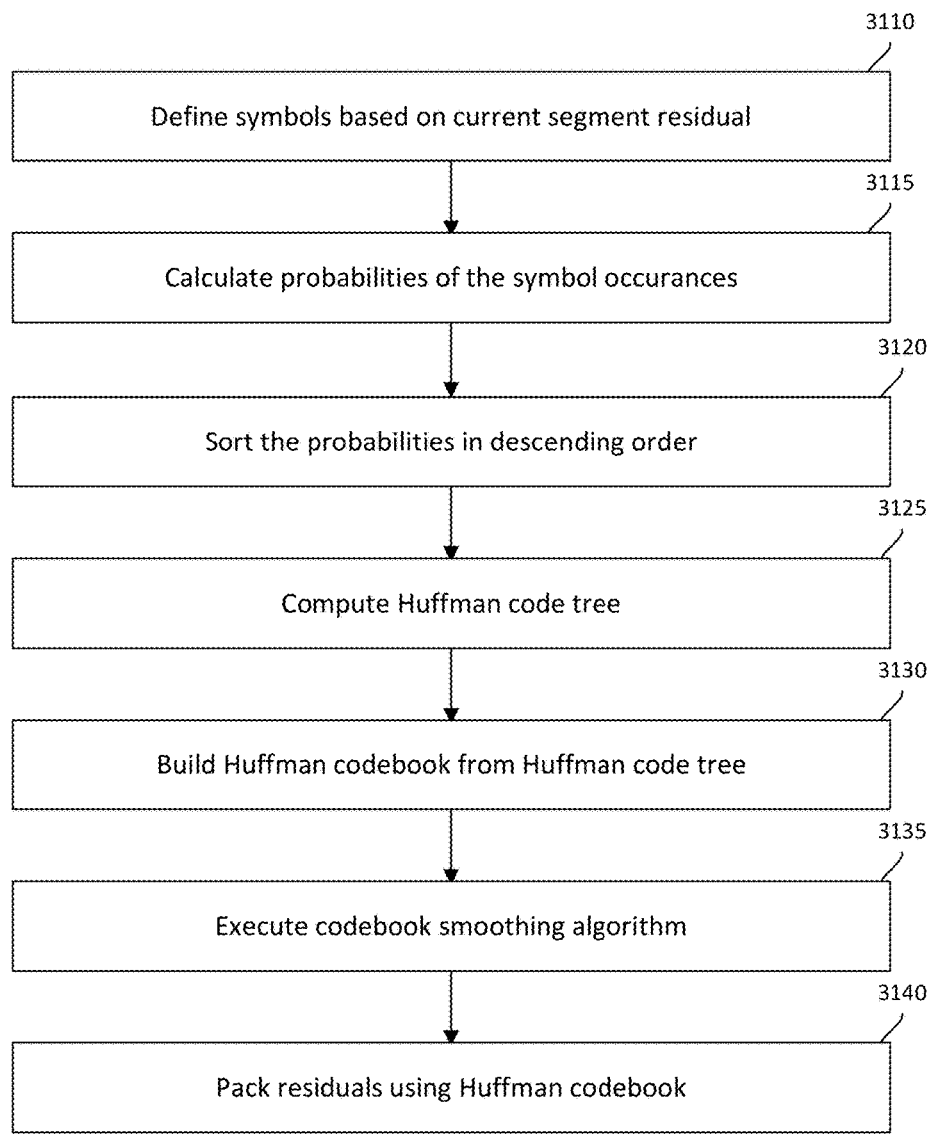
FIG. 31 illustrates a flowchart for an exemplary method for frame based adaptive Huffman encoding of a data segment as performed by the adaptive waveform encoder of FIG. 21.
Figure 43:
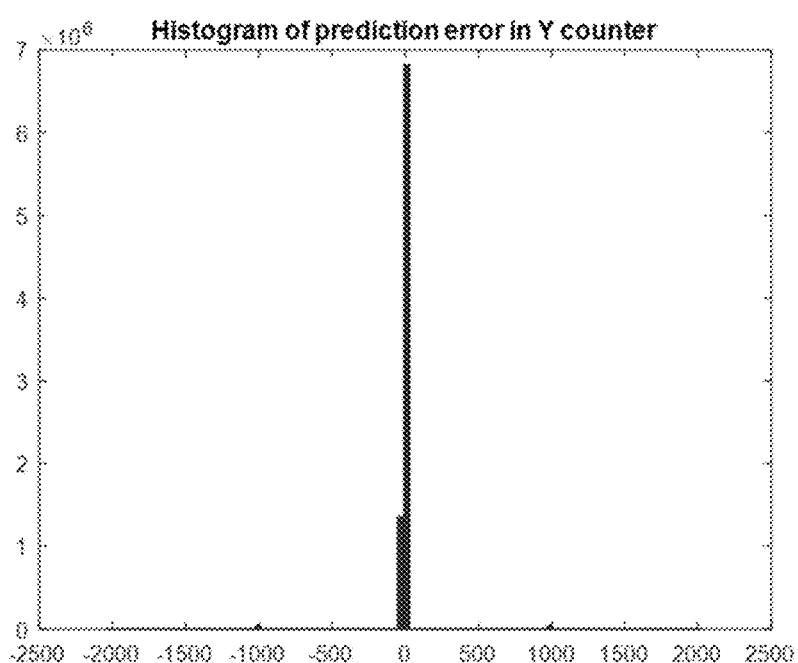
FIG. 43 illustrates a histogram of prediction error in a Y counter.

FIG. 31 illustrates a flowchart for an exemplary method for frame based adaptive Huffman encoding of a data segment as performed by the adaptive waveform encoder of FIG. 21. Theoretically Huffman coding is the optimum encoding for known statistics, but it requires knowing all the symbol probabilities of the entire file before creating its codebook. When majority of data are distributed in small number of symbols, Huffman encoding uses smaller number of bits for the high probability samples and larger number of bits for the ones with lower probabilities, and yields best encoding gain. For an example, the distributions of prediction errors in periodic frames from Y counter file can be graphed in FIG. 43.

If most of errors are around zero, and there are small amounts of large residuals, the Huffman coding will assign 1 bits for residual zero and more bits for large residuals which occurs less frequent. Due to the constraint of low-delay and low-complexity, the frames are designed based adapting Huffman coding algorithm to encode the residuals.

In FIG. 31, the frame based adaptive Huffman coding algorithm is performed by the multi-state encoder 2110 beginning at Step 3110 by defining symbols based on a current frame residual. At Step 3115, the multi-state encoder 2110 calculates probabilities of the symbol occurrences, and at Step 3120 the multi-state encoder 2110 sorts the probabilities in descending order. At Step 3125 the multi-state encoder 2110 computes the Huffman code tree, and at 3130 the multi-state encoder 2110 builds a Huffman codebook from the Huffman code tree. At Step 3135, the multi-state encoder 2110 executes a codebook smoothing algorithm, and at Step 3140 the multi-state encoder 2110 packs residuals using the Huffman codebook.

The codebook smoothing algorithm decides how to modify transmitted codebooks to minimize the required transmission size for codebooks. The encoding format of Huffman codebook is shown in Table 14 to Table 18. Table 14 describes the format of encoding a new Huffman codebook.

TABLE 14

| Field # | # of bits | Contents |
| --- | --- | --- |
| N | 8 | Number of symbols |
| Ns | 4 | Number of bits for each symbol |
| S1 | B | Symbol 1 in codebook |
| ... | B | Symbol 2~n-1 in codebook |
| Vn | B | Symbol n in codebook |
| Nl | 2 | Number of bits for code length differences |
| Dl2 | Nl | Length L2-L1 |
| ... | Nl | Symbol 2~n-1 in codebook |
| Dln | Nl | Symbol n in codebook |
| C1 | L1 | Codeword for symbol 1 |
| ... | ... | Codewords for symbols 2~n-1 |
| Cn | Ln | Codeword for symbol n |

Table 15 shows the operational contents on Huffman codebook.

TABLE 15

| Field # | Contents |
| --- | --- |
| op | 0: same as previous HCB |
| | 1: new HCB |
| | 2: modified HCB |
| | 3: add codewords |
| | 4: delete codewords |
| chcb | The index of closest hcb in the history |
| Del_flag | Delete operation flag: 1 = delete, 0 = no delete |
| Del # | # of symbols to be deleted |
| Del ID | Codeword indexes to be delected |
| Add_flag | Add operation flag |
| Add # | # of new codewords to be added |
| symb | Added symbols |
| Order_flag | Flag of symbol order changes. |
| order | New order |
| Len_flag | Flag of codeword length change |
| Len1 | 1$^{st}$ codeword length |
| dlen | Differential coding for codeword length |
| Cw_flag | Flag for codeword changes |
| cw | Codewords |

Table 16 and Table 17 describe the details of deleting and changing operations on Huffman codebook.

TABLE 16

| Field # | # of bits | Contents |
| --- | --- | --- |
| N | B | Number of symbols to change, B = log2(# of old codewords) |
| M | 2 | Number of bits for bit length changes (+/−1, 2)? |
| I1 | N | Index of the changed symbol 1 |
| DL1 | M | length difference of codeword 1: DLI = L1_new − L1_old |
| CW | L1 | Codeword 1 |
| ... | | Index, length and codeword 2~n-1 |
| In | N | Index of changed symbol n |
| DL1 | M | length difference of codeword n: DL1 = L1_new − L1_old |
| CW | Ln | Codeword n |

TABLE 17

| Field # | # of bits | Contents |
| --- | --- | --- |
| N | B | Number of symbols to delete B = log2(# of old codewords) |
| I1 | B | Index of deleting symbol 1 |
| ... | B | Index of deleting symbol 2~n-1 |
| In | B | Index of deleting symbol n |

The bit-stream format of frame based adaptive Huffman encoding is shown in Table 18.

TABLE 18

| Field # | # of bits | Contents |
|---|---|---|
| flag | 1 | 0: no period; 1: new period |
| X1 | 16 | 1$^{st}$ sample value |
| P | 7 | Period |
| nxp | 4 | Nxp = ceil(log2(max(|xp|))) |
| Px1 | Nxp | Px1: 1st sample value in the period |
| Px2 | Nxp | Px2: 2nd sample value in the period |
| ... | ... | ... |
| pxP | Nxp | PxP: Pth sample value in the period |
| Op flag | 3 | HCB operation: 0 = no; 1 = delete; 2 = add; 3 = change; 4 = new |
| Hcb OP | | Corresponding HCB operation bit allocation |
| Oflag | 1 | HCB Order flag: 0 = no; 1 = order changes |
| Norder | nb | Nb = # of bits for order values |
| Order1 | Norder | 1$^{st}$ order value |
| ... | Norder | 2$^{nd}$ ~N-1th order values |
| Order N | Norder | Nth order value |
| Len flag | 1 | Cw length flag: 0 = no; 1 = new length |
| nbits | 2 | # of bits for the length-1 |
| Len1 | Nbits | 1$^{st}$ codeword length |
| ... | ... | 2$^{nd}$ ~N-1th codeword length |
| Len N | nbits | Nth codeword length |
| Cw flag | 1 | codeword flag: 0 = no; 1 = codewords follow |
| Cw1 | Len1 | 1$^{st}$ codeword |
| ... | ... | ... |
| cwN | Len N | Nth codeword |
| Cw(rx1) | len(rx1) | 1$^{st}$ residual codeword |
| Cw(rx) | Len(rx) | 2$^{nd}$ ~N-1 residual codeword |
| Cw(rxN) | Len(rxN) | Nth residual codeword |

Figure 32:
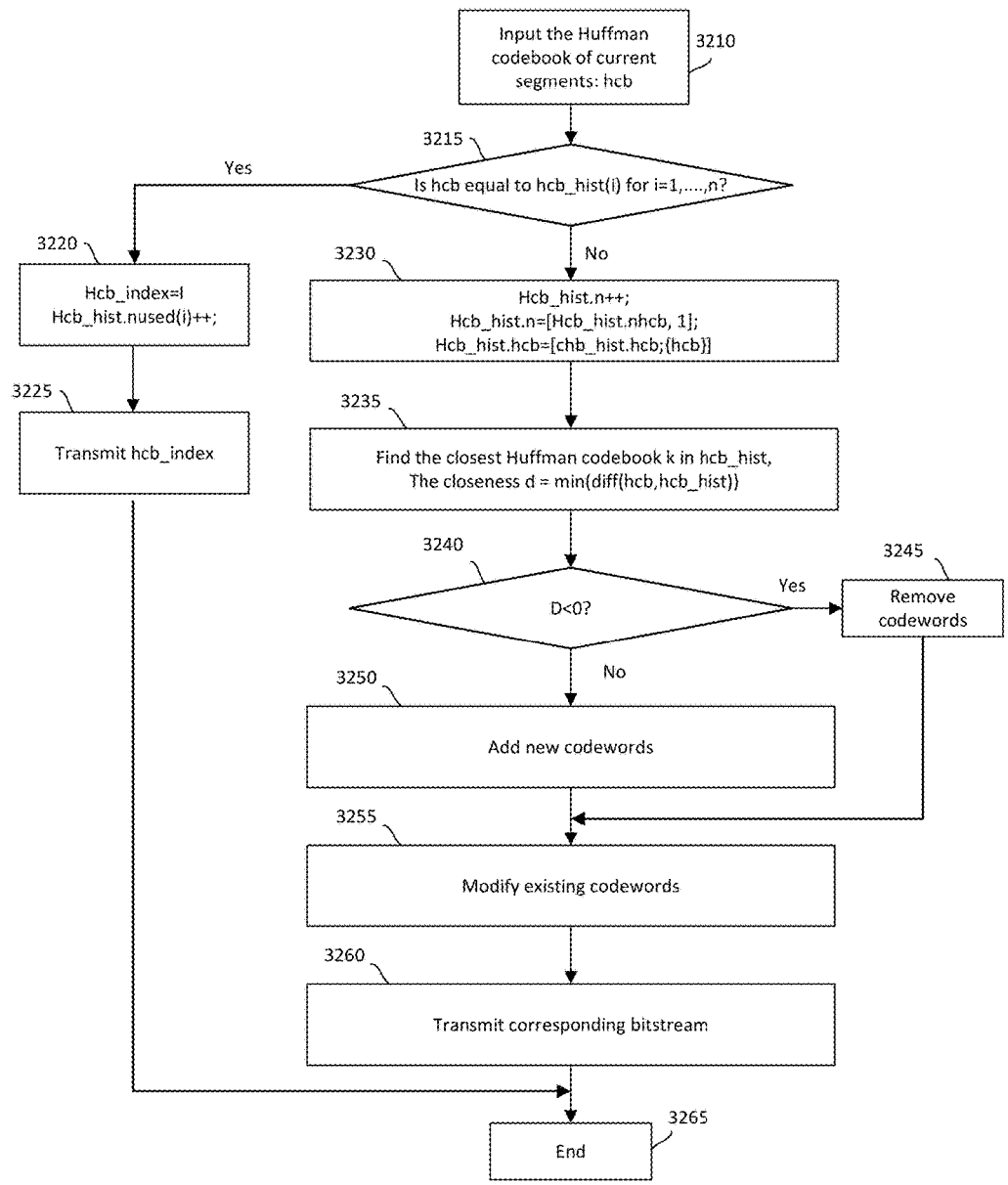
FIG. 32 illustrates a flowchart for an exemplary method to modify transmitted codebooks in the method of FIG. 31 as performed by the adaptive waveform encoder of FIG. 21.

FIG. 32 illustrates a flowchart for an exemplary method to modify transmitted codebooks in the method of FIG. 31 as performed by the adaptive waveform encoder of FIG. 21. The multi-state encoder 2110 begins the Huffman codebook smoothing algorithm at Step 3210 by inputting the Huffman codebook of current segments: hcb. If hcb is equal to hcb_hist(i) for i=1, . . . , n (Step 3215: Yes) then the multi-state encoder 2110 may calculate Hcb_index=I; where Hcb_hist.nused(i)++ at Step 3220 and transmits the hcb_index at Step 3225 before ending the process at Step 3265. If hcb is not equal to hcb_hist(i) for i=1, . . . , n (Step 3215: No), then at Step 3230 the multi-state encoder 2110 may calculate Hcb_hist.n++; Hcb_hist.n=[Hcb_hist.nhcb,1], and Hcb_hist.hcb=[hcb_hist.hcb;{hcb}]. At Step 3235 the multi-state encoder 2110 may find the closest Huffman codebook k in hcb_hist, and the closeness D=min{diff(hcb,hcb_hist)}. If D is less than zero (Step 3240: Yes), then the multi-state encoder 2110 removes codewords at Step 3245 and returns to the process, otherwise (Step 3240: No) then the multi-state encoder 2110 adds new codewords at Step 3250. At Step 3255 the multi-state encoder 2110 modifies existing codewords, and at Step 3260 the multi-state encoder 2110 transmits the corresponding bit stream before ending the method at Step 3265.

Figure 33:
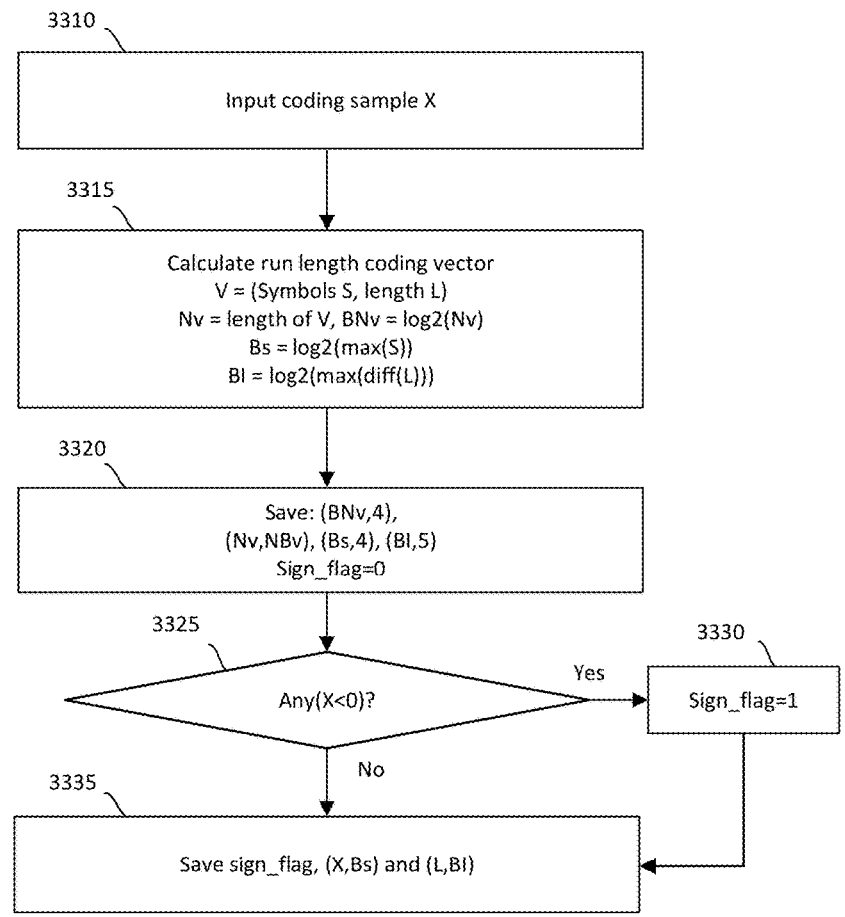
FIG. 33 illustrates a flowchart for another exemplary method for run length encoding of lossless data compression of a data segment as performed by the adaptive waveform encoder of FIG. 21.

FIG. 33 illustrates a flowchart for another exemplary method for run length encoding of lossless data compression of a data segment as performed by the adaptive waveform encoder of FIG. 21. Run-length encoding (RLE) is a very simple form of lossless data compression for use when the same data values occur continuously. In RLE a run of data is when the same data value occurs in many consecutive data elements while the length is the count of consecutive, identical data. It stores a sequence of same data values as a pair of run and count. However, it is not useful if data do not have many runs as it could greatly increase the size.

The RLE algorithm is described in FIG. 33 and its bit-stream format is defined in Table 19. At Step 3310, the multi-state encoder 2110 inputs a coding sample X into the RLE vector. At Step 3315, the multi-state encoder 2110 may calculate a run length coding vector using the equations V=(Symbols S, length L), Nv=length of V, BNv=log 2(Nv), Bs=log 2(max(S)), and Bl=log 2(max(diff(L))). At Step 3320, the multi-state encoder 2110 may save the parameters (BNv,4), (Nv,BNv), (Bs,4), (Bl,5) and may assign Sign_flag=0. If there are any coding samples X that are less than zero (Step 3325: Yes), then the multi-state encoder 2110 assigns Sign_flag=1 and returns to the method, otherwise (Step 3325:No) the multi-state encoder 2110 saves sign_flag, (X,Bs) and (L,Bl).

TABLE 19

| Field # | # of bits | Contents |
|---|---|---|
| Nbits_run | 4 | Number of bits for runs |
| Nbits_length | 9 | Number of bits for length |
| V1 | Nbits_run | 1$^{st}$ run value |
| L1 | Nbits_length | 1$^{st}$ length |
| V2 | Nbits_run | 2$^{nd}$ run value |
| L2 | Nbits_length | 2$^{nd}$ length |
| ... | ... | ... |
| Vk | Nbits_run | Kth run value |
| Lk | Nbits_length | Kth length |

Figure 34:
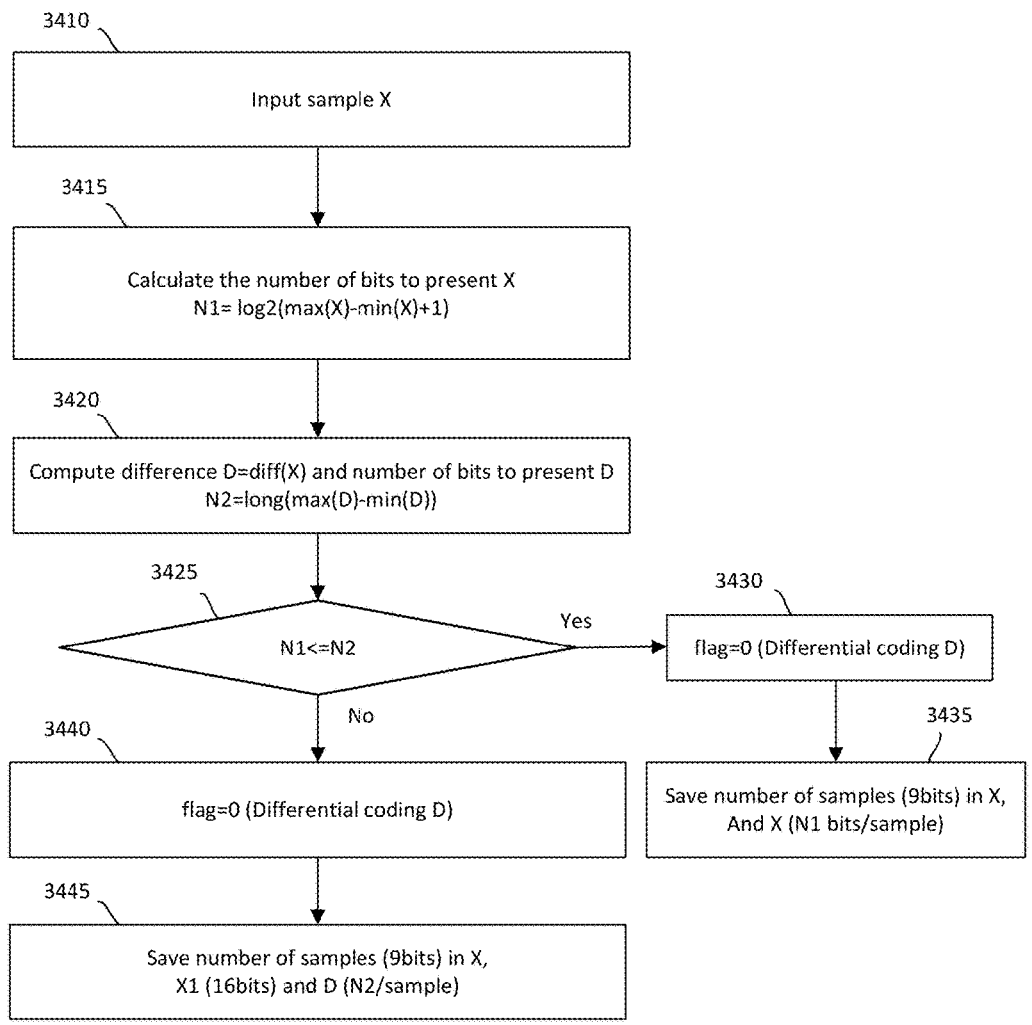
FIG. 34 illustrates a flowchart for another exemplary method mixed differential encoding of lossless data compression of a data segment as performed by the adaptive waveform encoder of FIG. 21.

FIG. 34 illustrates a flowchart for another exemplary method mixed differential encoding of lossless data compression of a data segment as performed by the adaptive waveform encoder of FIG. 21. The mixed differential encoding algorithm is to encode either original samples with less than 16 bits or the 1st derivatives of original samples. The algorithm first calculates the dynamic ranges of original sample X and its corresponding 1st order derivatives D. The corresponding number of bits to encode can be calculated through their dynamic rages. The one with less number of bits will be used for the encoding. FIG. 34 shows the details of mixed differential encoding algorithm while Table 20 is its corresponding bit-stream format.

TABLE 20

| Field # | # of bits | Contents |
|---|---|---|
| N1 | 4 | # of bits for sample size |
| Ns | N1 | Number of samples |
| flag | 1 | Flag = 0: original sample: D = X-Xmin |
| | | Flag = 1: 1$^{st}$ order derivatives D = Diff(X) |
| Nb | 4 | # number of bits per sample |
| X1 or Xmin | 16 | X1 if flag = 1; otherwise Xmin |
| D1 | Nb | 1$^{st}$ D |
| ... | ... | ... |
| Dn-1 | Nb | Dn-1 |
| Dn* | Nb | If flag = 0. |

A mixed differential and symbol coding exemplary method includes Step 3410 where the multi-state encoder 2110 inputs a sample X and calculates the number of bits to present X using the equation N1=log 2(max(X)−min(X)+1) at Step 3415. At Step 3420, the multi-state encoder 2110 computes the difference D-diff(X) and number of bits to present D where N2=long(max(D)−min(D)). If N1<=N2 (Step 3425: Yes), the multi-state encoder 2110 sets a flag equal to zero for differential coding D at Step 3430, and at Step 3435 saves the number of samples (9 bits) in X, and X (N1 bits/sample). If N1>N2 (Step 3434: No), then the multi-state encoder 2110 sets the flag to zero for differential coding D at Step 3440 and saves the number of samples (9 bits) in X, X1 (16 bits), and D (N2/sample) at Step 3445.

The samples of certain frames may contain purely noise which cannot be compressed, and the multi-state encoder 2110 will transmit or store the original samples in such cases. Table 21 shows the bit-stream format of original samples.

TABLE 21

| Field # | # of bits | Contents |
|---|---|---|
| N | 9 | Number of samples |
| X1 | 16 | $1^{st}$ X |
| ... | ... | ... |
| Xn-1 | 16 | Xn-1 |
| Xn | 16 | Xn |

The additional exemplary low-delay low-complexity lossless compression algorithm was implemented and tested in Matlab software. The core algorithms are also implemented in C/C++ codes and Texas Instruments DSP. The implementation includes an compression algorithm of structure information integrated into the telemetry one-dimensional data compression algorithm of the embodiments. Two examples of data sets were used for the performance tests. The algorithm performance is measured as compression ratio, encoding rate and decoding rate. The compression rate is defined in the following equation as:

$$CR = \frac{\text{Original File Size}}{\text{Compressed File Size}} \quad (7)$$

The encoding and decoding rates are defined in the following equation as:

$$\text{Encoding Rate} = \frac{\text{Original File Size}}{\text{Encoding Time}} \quad (8)$$

and $$\text{Decoding Rate} = \frac{\text{Original File Size}}{\text{Decoding Time}} \quad (9)$$

respectively. There were approximately 200 telemetry measurement files for each data set.

Figure 44:
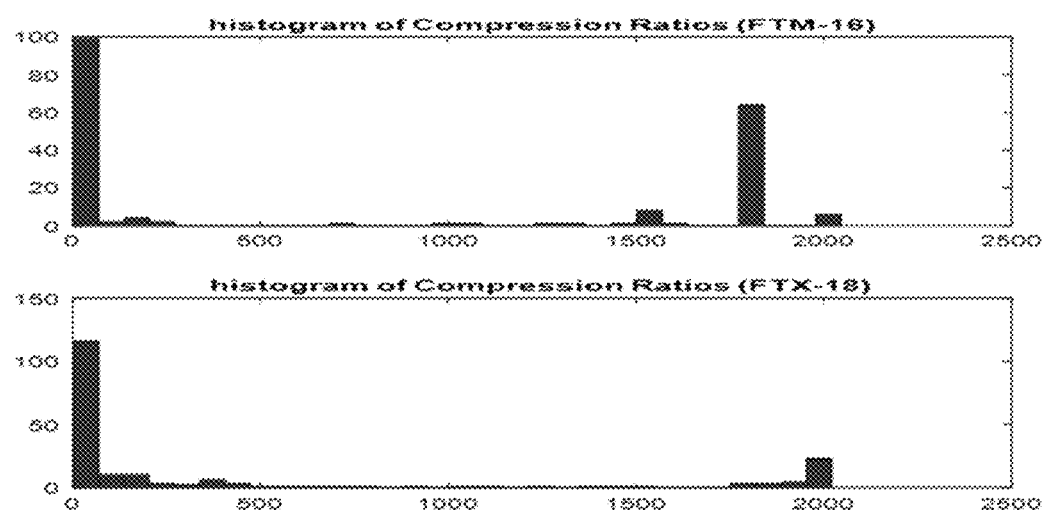
FIG. 44 illustrates histograms for compression ratios of two different data sets.

FIG. 44 shows the histograms of compression ratios for both data sets.

Table 22 presents the statistics of compression ratios, encoding/decoding rates. The average compression ratios are 5.39:1 and 8.53:1 for the first example data set and the second example data set, respectively.

TABLE 22

| Data sets | Name | minimum | maximum | median | average |
|---|---|---|---|---|---|
| 1st Set | Compression Ratios | 1.3246 | 2046 | 28.19 | 5.39 |
| | Encoding Rate (MB/s) | 0.0012 | 1.241 | 0.11 | 0.42 |
| | Decoding Rate (MB/s) | 0.1612 | 21.91 | 1.853 | 3.53 |
| 2nd Set | Compression Ratios | 2.1934 | 2046 | 28.76 | 8.53 |
| | Encoding Rate (MS/s) | 0.0053 | 0.935 | 0.131 | 0.304 |
| | Decoding Rate (MB/s) | 0.184 | 12.94 | 1.124 | 2.615 |

Table 23 shows the compression ratios for the structure information and the overall compression ratios is 36.85:1.

TABLE 23

| Data set | File names | Original sizes | Compressed sizes | Compression ratios |
|---|---|---|---|---|
| 1st Set | Sync1.bin | 6195200 | 3031 | 2043.946 |
| | Sync2.bin | 6195200 | 3031 | 2043.946 |
| | X_counter.bin | 6195200 | 307,148 | 20.17008 |
| | Y_counter.bin | 6195200 | 670,196 | 9.243863 |
| | M_counter.bin | 6195200 | 59748 | 103.6888 |
| | SFID.bin | 17,031,168 | 8595 | 1981.52 |
| 2nd Set | Sync.bin | 42,318,848 | 20,679 | 2046.465 |
| | X_counter.bin | 42,318,848 | 4964212 | 8.524787 |
| | Y_counter.bin | 42,318,848 | 31760 | 1332.457 |
| | M_counter.bin | 42,318,848 | 408350 | 103.6338 |
| | SFID.bin | 42,318,848 | 566487 | 74.70401 |
| Total | | 259601408 | 7043237 | 36.85825 |

The encoding and decoding rates are calculated from encoding/decoding time which was measured MATLAB 2016a on Dell PC (Intel® Xeon® CPU E5-2609 v3 @1.90 GHz) Window 7. The average encoding and decoding rates are 0.35 Mbps and 3 Mbps respectively. Usually processing rate will increases hundreds times when converting MATLAB implementation to embedded C/C++ on single DSP platform. A DSP, such as a multicore Keystone TI DSP, was used in the hardware implementation that has capabilities to handle real-time encoding requirements of the embodiments.

It will be apparent to those skilled in the art that various modifications and variations can be made to the disclosed telemetry system. Other embodiments will be apparent to those skilled in the art from consideration of the specification and practice of the disclosed telemetry system. It is intended that the specification and examples be considered as exemplary only, with a true scope being indicated by the following claims and their equivalents.

What is claimed is:

1. A method for transmitting data, comprising:
   receiving data from two or more data sources;
   selectively classifying the data into at least two input data streams, the at least two data streams including a one dimensional data stream, called an encoded data stream, and an imagery data stream, which can include still images or video or both; and
   separately compressing the one-dimensional data stream into a first compressed bit-stream and the imagery data stream into a second compressed bit-stream;
   combining the first compressed bit-stream and the second compressed bit-stream into a packetized bit-stream;
   encrypting the packetized bit-stream to generate encrypted data packets prepared for transmission,
   wherein the one dimensional data stream is tiled into non-overlap segments using a state detection algorithm that categorizes the non-overlap segments into different states, wherein the different states include a constant state, a periodical state, a constant outlier state, a periodical outlier state, a step jump state, and an unknown state, and
   wherein corresponding encoders are used to compress each of the categorized segments.

2. The method of claim 1, wherein compressing the one-dimensional data stream comprises:
   using a prediction model to generate predicted one-dimensional data;
   determining a difference between the predicted one-dimensional data and the one-dimensional data; and
   encoding the difference with a compression encoder.

3. The method of claim 1, wherein the state detection algorithm categorizes one of the non-overlap segments as being in constant state when all data samples in the non-overlap segment have the same value.

4. The method of claim 1, wherein the state detection algorithm categorizes one of the non-overlap segments as being in the constant outlier state when the number of outliers are less than a threshold in the non-overlap segment and the outliers are identified when their values are beyond multiple times of standard deviation in the non-overlap segment.

5. The method of claim 1, wherein the state detection algorithm categorizes one of the non-overlap segments as being in the periodical state when the maximum cross-correlation coefficients between predefined minimum and maximum periods are beyond a periodicity threshold.

6. The method of claim 5, wherein the state detection algorithm categorizes one of the non-overlap segments as being in the periodical outlier state by:
  detecting number of outliers are less than a outlier threshold in the non-overlap segment, where outliers are identified when their values are beyond multiple times of standard deviation in the non-overlap segment, and
  after replacing the outliers using prediction values from their neighbor samples, detecting periodicity using the cross-correlation coefficients between the predefined minimum and maximum periods.

7. The method of claim 3, wherein the state detection algorithm categorizes one of the non-overlap segments as changing from a first constant state to a second constant states within the non-overlap segment.

8. The method for transmitting data of claim 1, further comprising:
  receiving an output of categorized segments from the state detection algorithm into a multi-state prediction model;
  extracting multi-state prediction model parameters for each of the categorized segments;
  generating predicted segments from the multi-state prediction model parameters; and
  generating predicted residuals by subtracting the categorized segments from the predicted segments.

9. The method for transmitting data of claim 1, further comprising:
  compressing the non-overlap segments categorized as the unknown state using an adaptive entropy encoding algorithm,
  wherein the adaptive entropy encoding algorithm includes determining the smallest number of bits for each of the non-overlap segments using one of a Huffman coding algorithm, run length coding algorithm, a constant outleaver coding algorithm, and a dynamic range coding method.

10. The method for transmitting data of claim 9, wherein the compressing the non-overlap segments using the Huffman coding algorithm comprises:
  defining symbols based on the residuals;
  determining probability of symbol occurrences;
  sorting the probabilities in a descending order;
  determining a Huffman code tree;
  building a Huffman codebook from the Huffman code tree;
  updating Huffman code tree, and executing a codebook smoothing algorithm.

11. A data transmission system, comprising:
  a local unit comprising a receiver; and a remote unit, the remote unit comprising transducers, a processor, and a transmitter;
  the transducers are configured to generate at least two data streams;
  the processor is configured to compress the data by:
    selectively classifying the data streams from the transducers into classifications including at least a one-dimensional data stream and an imagery data stream, and
    separately compressing the one dimensional data stream into a first compressed bit-stream and the imagery data stream into a second compressed bit-stream; and
  the transmitter is configured to transmit the first compressed bit-stream and the second compressed bit-stream to the local unit,
  wherein the processor is further configured to:
    tile the one dimensional data stream into non-overlap segments using a state detection algorithm that categorizes the non-overlap segments into different states,
    wherein the one dimensional data stream is tiled into non-overlap segments using a state detection algorithm that categorizes the non-overlap segments into different states, wherein the different states include a constant level state, a periodical state, a constant outlier state, a periodical outlier state, a step jump state, and an unknown state; and
    compress each of the categorized segments using corresponding encoders.

12. The data transmission system of claim 11, wherein compressing the one-dimensional data stream comprises:
  using a prediction model to generate predicted one-dimensional data;
  determining a difference between the predicted one-dimensional data and the one-dimensional data; and
  encoding the difference with a compression encoder.

13. The system of claim 11, wherein the state detection algorithm categorizes one of the non-overlap segments as being in constant state when all data samples in the non-overlap segment have the same value.

14. The data transmission system of claim 11, wherein the state detection algorithm categorizes one of the non-overlap segments as being in the constant outlier state when the number of outliers are less than a threshold in the non-overlap segment and the outliers are identified when their values are beyond multiple times of standard deviation in the non-overlap segment.

15. The data transmission system of claim 8, wherein the state detection algorithm categorizes one of the non-overlap segments as being in the periodical state when the maximum cross-correlation coefficients between predefined minimum and maximum periods are beyond a periodicity threshold.

16. The data transmission system of claim 15, wherein the state detection algorithm categorizes one of the non-overlap segments as being in the periodical outlier state by:
  detecting number of outliers are less than a outlier threshold in the non-overlap segment, where outliers are identified when their values are beyond multiple times of standard deviation in the non-overlap segment, and
  after replacing the outliers using prediction values from their neighbor samples, detecting periodicity using the cross-correlation coefficients between the predefined minimum and maximum periods.

17. The data transmission system of claim 13, wherein the state detection algorithm categorizes one of the non-overlap segments as a step jump state when the data samples change from a first constant state to a second constant state within the non-overlap segment.

18. The data transmission system of claim 11, wherein the processor is further configured to:
- receive an output of categorized segments from the state detection algorithm into a multi-state prediction model;
- extract multi-state prediction model parameters for each of the categorized segments;
- generate predicted segments from the multi-state prediction model parameters; and
- generate predicted residuals by subtracting the categorized segments from the predicted segments.

19. The data transmission system of claim 11, wherein the processor is further configured to:
- compress the non-overlap segments categorized as the unknown state using an adaptive entropy encoding algorithm,
- wherein the adaptive entropy encoding algorithm includes determining the smallest number of bits for each of the non-overlap segments using one of a Huffman coding algorithm, run length coding algorithm, a constant outleaver coding algorithm, and a dynamic range coding method.

20. The data transmission system of claim 19, wherein the processor is further configured to compress the non-overlap segments using the Huffman coding algorithm by:
- defining symbols based on the residuals,
- determining probability of symbol occurrences,
- sorting the probabilities in a descending order,
- determining a Huffman code tree,
- building a Huffman codebook from the Huffman code tree,
- updating Huffman code tree and executing a codebook smoothing algorithm.

* * * * *

UNITED STATES PATENT AND TRADEMARK OFFICE
CERTIFICATE OF CORRECTION

PATENT NO. : 10,382,842 B2
APPLICATION NO. : 16/153305
DATED : August 13, 2019
INVENTOR(S) : Dunling Li Page 1 of 1

It is certified that error appears in the above-identified patent and that said Letters Patent is hereby corrected as shown below:

In the Specification

Column 1, Line 15, to Column 1, Line 19, after the "GOVERNMENT RIGHTS" heading, should read:
This invention was made with government support under the terms of Contract No. HQ0147-13-C-7308 and Contract No. HQ0147-14-C-7024 awarded by the Missile Defense Agency (MDA). The government may have certain rights to this invention.

Signed and Sealed this
Twenty-third Day of June, 2020

Andrei Iancu
*Director of the United States Patent and Trademark Office*